United States Patent [19]
Karabed et al.

[11] Patent Number: 6,084,535
[45] Date of Patent: Jul. 4, 2000

[54] SYSTEM AND METHOD FOR GENERATING MANY ONES CODES WITH HAMMING DISTANCE AFTER PRECODING

[75] Inventors: Razmik Karabed, San Jose; Nersi Nazari, Cupertino, both of Calif.; Andrew Popplewell, Manchester, United Kingdom; Isaiah A. Carew, Santa Cruz, Calif.

[73] Assignee: Mitel Semiconductor Americas Inc., San Jose, Calif.

[21] Appl. No.: 08/791,687

[22] Filed: Jan. 30, 1997

[51] Int. Cl.$^7$ ........................................................ H03M 5/00
[52] U.S. Cl. .................................. 341/58; 341/59; 341/73; 341/74; 341/94; 341/106
[58] Field of Search ................................... 341/58, 59, 73, 341/74, 94, 106

[56] References Cited

U.S. PATENT DOCUMENTS

| | | | |
|---|---|---|---|
| 5,198,813 | 3/1993 | Isozaki | 341/59 |
| 5,491,479 | 2/1996 | Wilkinson | 341/58 |

*Primary Examiner*—Brian Young
*Attorney, Agent, or Firm*—Fenwick & West LLP

[57] ABSTRACT

A system comprises an encoder, a precoder, a PRML channel, a detector, and a decoder. An input signal is received by the encoder. The encoder generates a code string by adding one or more bits and outputs the code string to the precoder. The encoder applies encoding such that the code string after passing through the precoder has a Hamming distance greater than one to eliminate error events with a small distance at the output of the PRML channel. The present invention also provides codes that after precoding have Hamming distance of 2 and 0 mod 3 number of ones. These codes when used over a PRML channel in an interleaved manner preclude +/−( . . . 010−10 . . . ) error events and error events +/−( . . . 01000−10 . . . ). The code string also has a predetermined minimum number of ones at the output of the PRML channel to help derive a clock from the input signal. The encoder provides a "systematic" encoding scheme in which for many code strings the encoded bits are the same as the input bits used to generate the encoded bits. This systematic approach of the present invention provides an encoder that is easy to implement because a majority of the bits directly "feed through" and non-trivial logic circuits are only needed to generate the control bits. The systematic encoding also dictates a decoder that is likewise easy to construct and can be implemented in a circuit that simply discards the control bit. The encoder preferably comprises a serial-to-parallel converter, a code generator, and a parallel-to-serial converter. The code generator produces a rate 16/18 or 16/17 code. The present invention also includes a method that is directed to encoding bit strings and comprises the steps of: 1) converting the input strings to input bits, and 2) adding at least one bit to produce an encoded string with many ones and a Hamming distance greater than one after precoding.

34 Claims, 37 Drawing Sheets

SYSTEM AND METHOD FOR GENERATING MANY ONES CODES WITH HAMMING DISTANCE AFTER PRECODING

BACKGROUND OF THE INVENTION

1. Field of the Invention

The present invention relates generally to methods for transmission of a digital data signal over partial response maximum likelihood (PRML) data channels. More particularly, the present invention relates to a system and method designed for use with a precoder such that the precoder produces codes with a Hamming distance greater than one to eliminate error events with a small distance at the output of the PRML channel. Still, more particularly, the present invention relates to an encoding system and method that produces at least a predetermined number of ones at the output of the channel to help derive a clock signal from the digital data signal.

2. Description of the Related Art

The use of PRML channels is well-known in the art as a method for transmitting data. There are several prior art methods for coding and detection in PRML channels. These prior art methods vary in their performance (error probability), and also vary in transmission rate.

The prior art often uses precoders to eliminate error propagation in PRML channels. For example, a $1/(1 \oplus D)$ precoder over a 1–D channel produces non-zero channel output for each non-zero precoder input, and produces a zero channel output for each zero precoder input. In magnetic recording, a "1" channel input denotes magnetic polarization in one direction and a "0" channel input denotes magnetic polarization in the opposite direction. If a precoder is not used, then errors persist continually as the magnetic polarization directions are switched. Commonly, a precoder is used to eliminate this problem and exemplary precoders include: a $1/(1 \oplus D)$ precoder for a 1–D channel; a $1/(1 \oplus D)$ precoder for a $(1-D)(1+D)^3$ channel; a $1/(1 \oplus D)^2$ precoder for a $1-D^2$ channel; and $1/(1 \oplus D^4)$ precoder for a $(1-D)^4$ channel. However, such prior art precoding methods do not produce codes which have a Hamming distance greater than one for the channel. Therefore, there is a need for a precoder that produces codes having a Hamming distance greater than one at the input of a PRML channel to thereby improve performance and decrease error probability.

An additional problem with the prior art methods is their inability to provide sufficient clocking information at the output of the PRML channel. Clocking is the extrapolation of clock frequency and phase based on the received signal. Long sequences of consecutive zeros at the output of the PRML channel make clock detection difficult, and sometimes impossible. In contrast, a large number of ones or transitions at the output of the PRML channel can significantly improve clocking performance.

Accordingly, there exists a need for a system and method for producing many ones codes with a Hamming distance greater than one after precoding. Such codes would provide the dual advantages of improved channel performance and clock detection.

SUMMARY OF THE INVENTION

The present invention is a system and method for encoding and decoding input strings to improve the performance of a PRML data channel and also provide at least a predetermined number of ones at the output of the PRML data channel to assist in clocking. This improved channel performance is accomplished by encoding and decoding the binary digital signals such that after precoding the strings will have a Hamming distance greater than one at the output of the precoder, and thereby eliminate error events with a small distance at the output of the PRML channel. Additionally, the present invention advantageously provides a unique system and method for encoding and decoding binary digital signals such that the coded sequence at the output of the PRML data channel will have at least a predetermined number of ones to assist in clock and gain detection.

The system of the present invention preferably comprises an encoder, a precoder, a PRML data channel, a detector, and a decoder. An input signal is received by the encoder. The encoder applies encoding such that the code string after being modified by the precoder has a Hamming distance greater than one and at least a predetermined number of ones at the output of the PRML data channel. The encoder, for many input signals, generates a code string by adding one or more control bits and outputs the code string to the precoder. The control bits are situated by design to locations inside the code string where they are less susceptible to noise. The encoder preferably comprises a serial-to-parallel converter, a code generator, and a parallel-to-serial converter. In a preferred embodiment, the code generator produces a maximal ones code having rate of 16/18. The present invention also includes a decoder that is coupled to the output of the detector. The decoder restores a received string to the format that it had at the input to the encoder by performing a function that is the "inverse" of the encoder.

The method of the present invention preferably includes a number of methods. One such method is directed to encoding bit strings and comprises the steps of: 1) encoding an input string by adding at least two bits such that a many ones code that has a Hamming distance greater than one after precoding is produced; 2) transmitting the encoded signal through a precoder; 3) sending the precoded sequence through a channel to generate a channel output sequence; 4) producing a detector output sequence by applying the channel output sequence to a detector; and 5) decoding the detector output sequence. Another method is directed to reducing the maximum number of consecutive zeros at the output of the PR channel and comprises the steps of: 1) encoding an input string by adding at least one bit such that a many ones code is produced; 2) transmitting the encoded signal through a precoder; 3) sending the precoded sequence through a channel to generate a channel output sequence; 4) producing a detector output sequence by applying the channel output sequence to a detector; and 5) decoding the detector output sequence. Still another method is directed to using encoder and decoder maps to generate maximal ones codes having a Hamming distance greater than one after precoding and comprises the steps of: 1) encoding and input string using a predetermined encoder map; 2) transmitting the encoded signal through a precoder; 3) sending the precoded sequence through a channel to generate a channel output sequence; 4) producing a detector output sequence by applying the channel output sequence to a detector; and 5) decoding the detector output sequence using a predetermined decoder map.

The present invention is particularly advantageous over the prior art because for most input signals it provides a systematic encoding scheme in which many of the encoded bits are the same as the input bits used to generate the encoded bits. This systematic approach of the present invention provides an encoder that is easy to implement because a majority of the bits directly "feed through" and non-trivial logic circuits are only needed to generate the control bits. The decoder is likewise easy to construct and can be implemented in a circuit that simply discards the control bits.

BRIEF DESCRIPTION OF DRAWINGS

The present invention has other advantages and features which will be more readily apparent from the following detailed description of the invention and the appended claims, when taken in conjunction with the accompanying drawings, in which:

DETAILED DESCRIPTION OF THE PREFERRED EMBODIMENTS

While the present invention will now be described with reference to a communication system encountered in magnetic recording practice, those skilled in the art will realize that the present invention can be incorporated into any one of a variety of systems for transmitting binary data.

Figure 1:
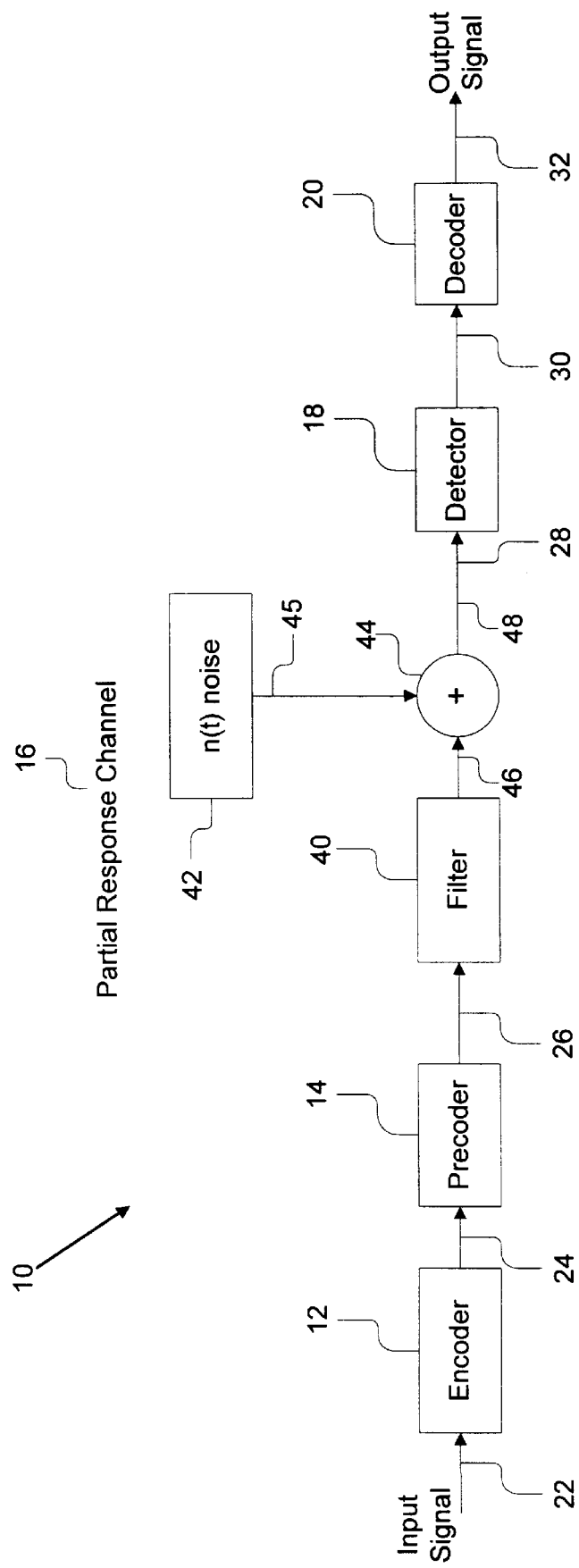
FIG. 1 is a block diagram of a communication system of the present invention including an encode, a precoder, a partial response channel, a detector, and a decoder.

Referring now to FIG. 1, a preferred embodiment of a communications system 10 constructed in accordance with the present invention is shown. The preferred embodiment of the system 10 comprises an encoder 12, a precoder 14, a partial response (PR) channel 16, a detector 18, and a decoder 20. The PR channel 16 preferably further comprises a low pass filter 40, a noise source 42 and an adder 44. The encoder 12 produces novel many ones codes with Hamming distance greater than one. The novel many ones codes are particularly advantageous because after precoding, the coded sequence output by the channel 16 has at least a predetermined number of ones. More specifically, the predetermined minimum number of ones at the output of the PR channel 16 contribute to clocking by providing transitions from which frequency and phase information can be extracted. The preferred embodiment of the present invention preferably has eleven exemplary many ones codes, as will be described in detail below. These codes are defined in TABLE I as follows:

TABLE I

| Code | Channel | Rate | 0 Mod M | Ñ | Z | $Z_i$ | Ê |
|---|---|---|---|---|---|---|---|
| code 1 | $1-D^2$ | 16/18 | M = 2 | 9 | 17 | * | 3 |
| code 2 | $1-D^2$ | 16/18 | M = 2 | 8 | 17 | 16 | 3 |
| code 3 | $1-D^2$ | 16/18 | M = 2 | 7 | 16 | 13 | 3 |
| code 4 | $1-D^2$ | 16/18 | M = 2 | 8 | 10 | 10 | 4 |
| code 4' | $1-D^2$ | 16/18 | M = 2 | 7 | 10 | 11 | 3 |
| code 5 | 1-D | 16/18 | M = 3 | 6 | 12 | XXXX | 2 |
| code 6 | 1-D | 16/18 | M = 3 | 6 | 9 | XXXX | 2 |
| code 7 | 1-D | 16/18 | M = 2 | 7 | 10 | XXXX | 2 |
| code 8 | 1-D | 16/18 | M = 2 | 8 | 10 | XXXX | 2 |
| code 9 | 1-D | 16/17 | XXXX | 7 | 10 | XXXX | 2 |
| code 10 | $1-D^2$ | 16/17 | XXXX | 7 | 10 | 10 | 2 |

*Arbitrarily long sequence of zeros in even or odd bit positions.

Referring to TABLE I, the channel equation is the transfer function of the PR channel filter, where D is a delay operator; the Rate x/y means the encoder takes x bits and outputs y bits; 0 Mod M is the number of ones after precoding; Ñ is the minimal number of ones at the output of the PR channel; Z is the maximum number of consecutive zeros at the output of the PR channel; $Z_i$ is the maximum number of consecutive zeros in even or odd bit positions at the output of the PR channel; and Ê is the number of bytes of input data that can be corrupted through typical channel errors.

Except for codes 9 and 10, the codes of the present invention generate a Hamming distance of 2 after precoding. Over a 1-D channel, it is desirable to preclude +/-( . . . 010-10 . . . ) error events at the output of the channel. Codes having M=3, codes 5 and 6, provide this desired property. Further, if codes 5 and 6 are used over a PRML channel, in an interleaved manner, then error events +/-( . . . 01000-10 . . . ) will be precluded at the channel output. This again is very desirable. The elimination of the above mentioned error events further improved the overall performance of the system.

As shown in FIG. 1, an input signal on line 22 is transmitted to an input of the encoder 12. The input signal or data is preferably in the form of an input sequence of bits $\{b_1 b_2 b_3 \ldots\}$. The encoder 12 produces and outputs an encoded sequence of bits $\{v_1 v_2 v_3 \ldots\}$ from the input signal. The coded sequence is preferably one of eleven many ones codes listed in TABLE I. For ease of understanding, the remaining components of the system 10 will now be described before describing the preferred embodiments of the encoder 12 and the decoder 20 in detail.

Referring again to FIG. 1, the output of the encoder 12 is coupled to provide the coded sequence on line 24. The precoder 14 has an input and an output. The input of the precoder 14 is coupled to line 24 to receive the encoded sequence $\{v_1 v_2 v_3 \ldots\}$. The precoder 14 generates a precoded sequence $\{x_1 x_2 x_3 \ldots\}$, based on the encoded sequence $\{v_1 v_2 v_3 \ldots\}$. The precoder 14 preferably takes one of two forms, either a 1/(1⊕D) precoder or a 1/(1⊕$D^2$) precoder. Those skilled in the art will realize that the precoder 14 may be any one of a variety of conventional precoders. For such conventional precoders, the many ones code must be generated such that at least a predetermined number of ones are present after encoding and precoding by the encoder 12 and the precoder 14, respectively. If the precoder 14 is 1/(1⊕D), then the precoded sequence and the coded sequence are related by $x_i = v_i \oplus x_{i-1}$. On the other hand, if the precoder 14 is 1/(1⊕$D^2$), then they are related as $x_i = v_i \oplus x_{i-2}$. The output of the precoder 14 is coupled by line 26 to provide the precoded sequence $\{x_1 x_2 x_3 \ldots\}$ to the PR channel 16.

The preferred embodiment of the PR channel 16 has an input and an output, and further comprises: the filter 40, the noise source 42, and the adder 44. The filter 40 has an input and an output. The input of the filter 40 forms the input of the PR channel 16 and is coupled to line 26 to receive the precoded sequence from the precoder 14. In the preferred embodiment, the filter 40 is either a 1-D or a $1-D^2$ filter. The filter 40 produces a filter sequence, $\{y_1 y_2 y_3 \ldots\}$. If the filter 40 is 1-D, then the filter sequence $\{y_1 y_2 y_3 \ldots\}$ and the precoded sequence $\{x_1 x_2 x_3 \ldots\}$ are related by $y_i = x_i - x_{i-1}$, but if the channel filter 40 is $1-D^2$, then the filter sequence $\{y_1 y_2 y_3 \ldots\}$ and the precoded sequence $\{x_1 x_2 x_3 \ldots\}$ are related by $y_i = x_i - x_{i-2}$. The output of the filter 40 is coupled to line 46 which is in turn coupled to a first input of the adder 44. A second input of the adder 44 is coupled to line 45 to receive a noise signal n(t) from the noise source 42. The noise source 42 produces a noise sequence $\{n_1 n_2 n_3 \ldots\}$ that is output on line 45. The adder 44 adds the noise signal n(t) and the filter 40 output to produce a channel sequence $\{r_1 r_2 r_3 \ldots\}$ on line 28. The channel sequence, is the sum of the filter sequence and the noise sequence, i.e., $r_i = y_i + n_i$.

The system 10 also includes the detector 18 having an input and an output. The input of the detector 18 is coupled to line 28 to receive the channel sequence. The detector 18 is preferably a Viterbi detector, but may also be a noise predictive Viterbi detector or any other similar detector. The detector 18 generates a detector sequence $\{u_1 u_2 u_3 \ldots\}$ which is a reproduction of the encoded sequence $\{v_1 v_2 v_3 \ldots\}$. Finally, the output of the detector 18 is provided on line 30 to the input of the decoder 20. The decoder 20 performs the inverse of the encoder 12 to reproduce the input signal. The output of the decoder 20 is provided on line 32 as an output signal. The decoder 20 generates a decoded sequence $\{b_1 b_2 b_3 \ldots\}$ which is a reproduction of the input data. The decoder 20 has a variety of embodiments each of which will be described in more detail below.

Figure 2:
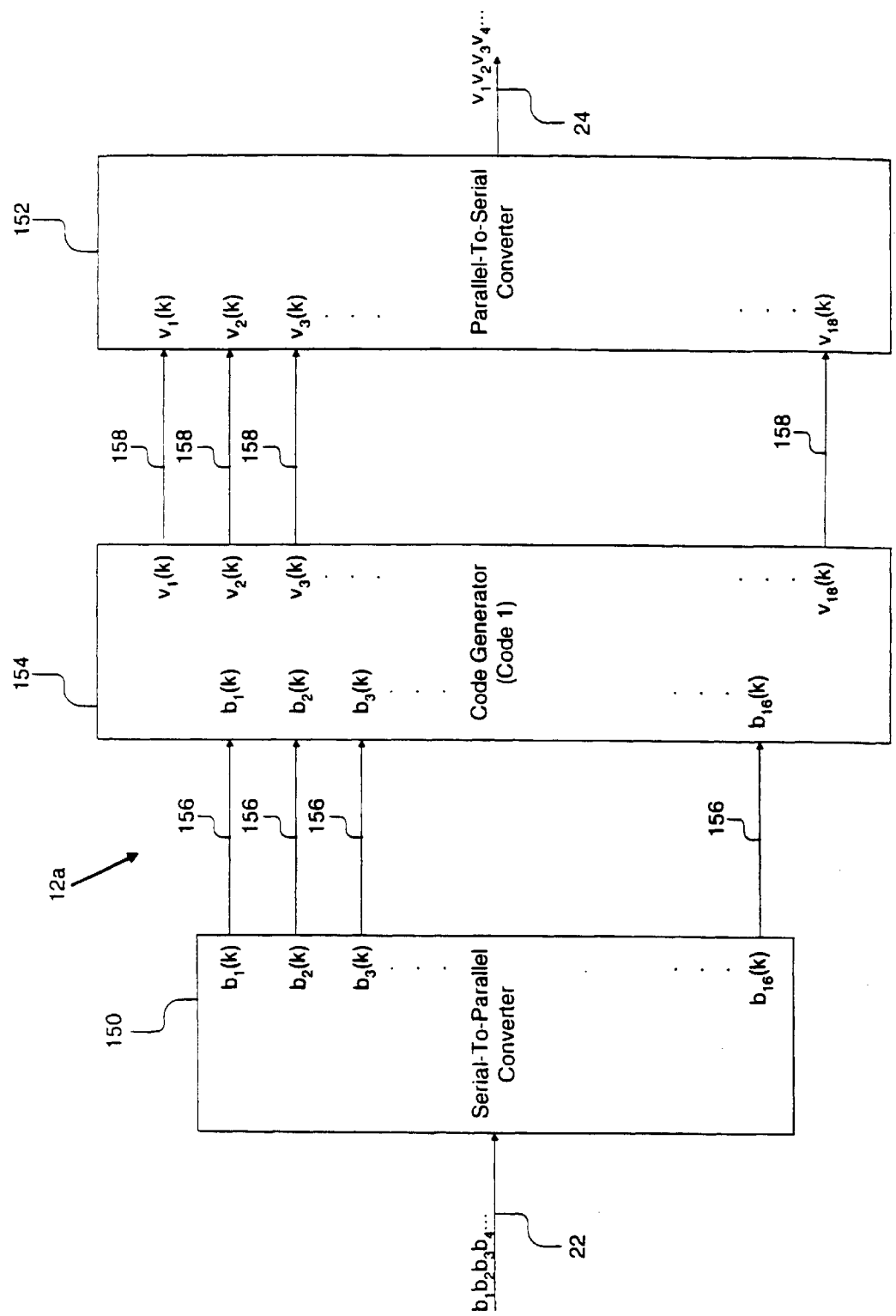
FIG. 2 is a block diagram of a preferred embodiment of the encoder constructed according to the present invention.

Referring now to FIG. 2, a first embodiment of an encoder 12a of the present invention is shown. In the first embodiment, the encoder 12a is a finite state machine that performs the encoding using a first code, code 1, that has a rate 16/18. As described in APPENDIX A, the minimal number of ones per code word at the output of the channel filter 40 is 9. This result follows from the concurrent constraints of a Hamming distance of 2 after precoding and the 16/18 rate. The encoder 12a takes sixteen bits, $\{b_{16k+1} b_{16k+2} b_{16k+3}, \ldots, b_{16k+16}\}$ every time k≧0, and produces eighteen bits $\{v_{18k+1} v_{18k+2} v_{18k+3}, \ldots, v_{18k+18}\}$. We use the notation of $v_i(k)$, i∈$\{1, \ldots, 18\}$ for $v_{18k+i}$ and the notation of $b_i(k)$, i∈$\{1, \ldots, 16\}$ for $b_{16k+i}$.

As shown in FIG. 2, the first embodiment of the encoder 12a includes a serial-to-parallel converter 150, a parallel-to-serial converter 152, and a code generator 154. The serial-to-parallel converter 150 has an input and plurality of outputs, and is preferably a one-to-sixteen converter. The serial-to-parallel converter 150 receives a serial string having a predetermined number of bits, and provides those bits simultaneously, or in parallel, at its outputs. The input of the serial-to-parallel converter 150 is coupled to line 22 to receive the input sequence $\{b_1 b_2 b_3 \ldots\}$. Each of the outputs of the serial-to-parallel converter 150 provides a single bit of the input sequence such that sixteen bits are output. Each of the outputs of the serial-to-parallel converter 150 is coupled to a respective input of the code generator 154 to generate a codeword v by signal lines 156.

The parallel-to-serial converter 152 preferably has a plurality of inputs (eighteen) and an output. The parallel-to-serial converter 152 receives a predetermined number of bits in parallel and converts them into the encoded sequence $\{v_1v_2v_3 \ldots\}$. The output of the parallel-to-serial converter 152 is coupled to line 24 to provide the encoded sequence. The code generator 154 preferably has a plurality of inputs coupled to receive sixteen bits of the input sequence $\{b_1b_2b_3 \ldots\}$ via lines 156 from the serial-to-parallel converter 150. The code generator 154 produces two additional code bits, $v_6$ and $v_{10}$. Similarly, each of the outputs of the code generator 154 are coupled by a respective signal line 158 to a corresponding input of the parallel-to-serial converter 152. These additional bits are sent to the parallel-to-serial converter 152 and form part of the encoded sequence $\{v_1v_2v_3 \ldots\}$. The code generator 154 in the present invention has two embodiments 154a and 154b, which will be described in more detail below with references to FIGS. 3 and 4.

CODE 1

Figure 3:
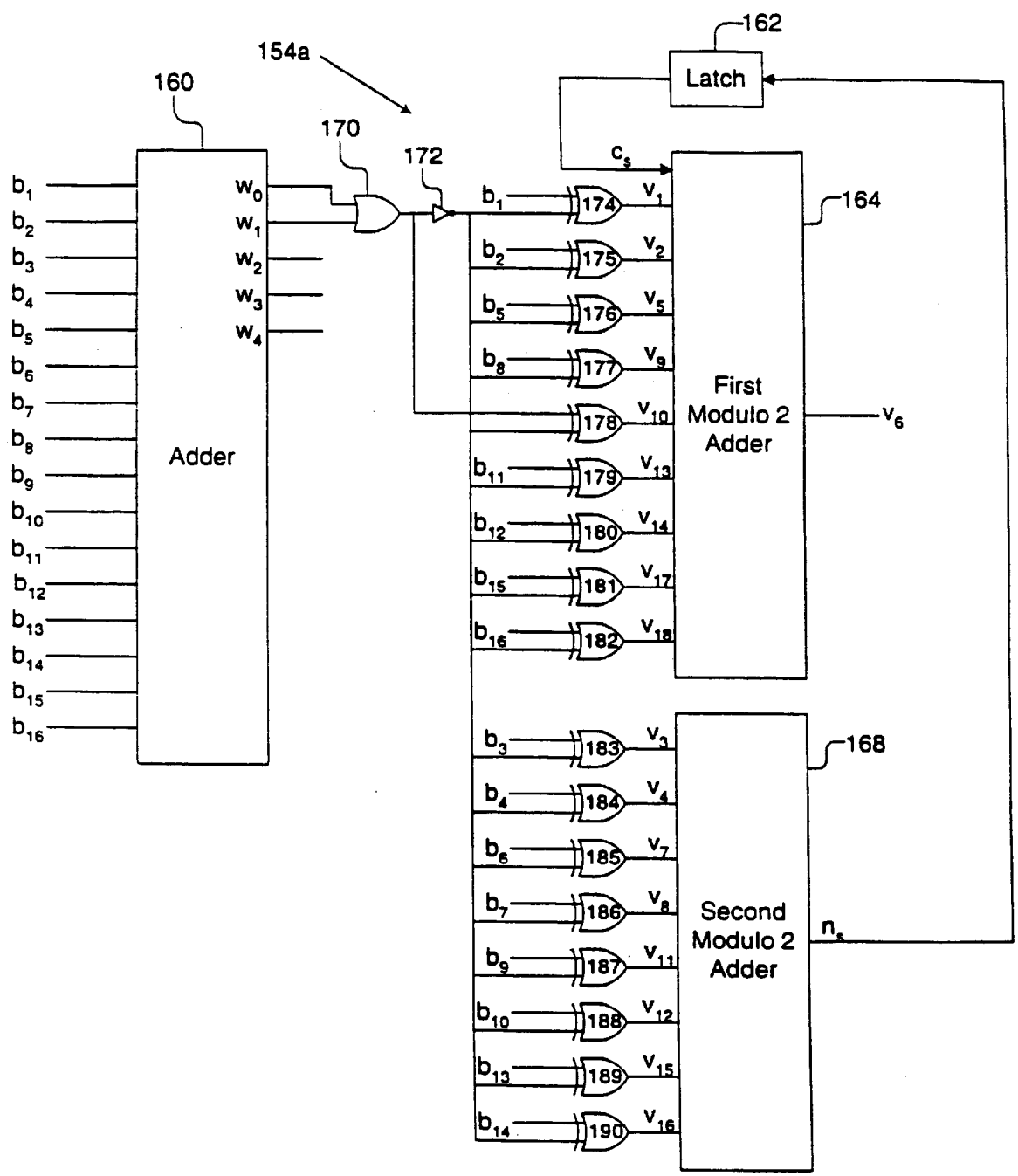
FIG. 3 is a block diagram of a first embodiment of a code generator used in the preferred embodiment of the encoder and constructed according to the present invention to generate a first code, Code 1.

Referring now to FIG. 3, a first embodiment of the code generator 154a that generates the code bits $v_1$ through $v_{18}$ of Code 1 is shown. The code generator 154a will now be described using the following notations ($\bar{x}$ denotes the complement of x):

input data=$\underline{b}=(b_1, \ldots, b_{16})$, current state=cs, codeword=$\underline{v}=[v_1 \ldots v_{18}]$, next state=ns, w=weight of $\underline{b}$=number of ones in $\underline{b}$, and $[w_0w_1w_2w_3w_4]$=binary representation of w, where $w_0$ is the most significant bit (MSB) and $w_4$ is the least significant bit (LSB).

The current state cs is used to produce the current codeword $\underline{v}$, the next state ns is used as a current state cs by the code generator 154a to produce the next $\underline{v}$. The initial current state $cs_0$ is obtained from $cs_0=x_{-1}\oplus x_{-2}$, where $x_{-2}$ and $x_{-1}$ are the initial conditions of the precoder 14. The logic operator $\oplus$ means Modulo-2 summing or addition. The operation is the same as binary addition but with no carries or borrows. Thus, $1\oplus 1=0$ with no carry. The operation can be implemented by a two-input Exclusive-OR logic gate.

The code generator 154a is further characterized by:

$$v_6=cs\oplus v_1\oplus v_2\oplus v_5\oplus v_9\oplus v_{10}\oplus v_{13}\oplus v_{14}\oplus v_{17}\oplus v_{18} \quad (EQ1)$$

$$cs_k=ns_{k-1}=v_3\oplus v_4\oplus v_7\oplus v_8\oplus v_{11}\oplus v_{12}\oplus v_{15}\oplus v_{16} \quad (EQ2)$$

$$w \geq 8 = \begin{cases} [v_1v_2v_3v_4v_5v_7v_8v_9v_{11}\ldots v_{18}] = \underline{b}, \\ v_{10} = 1. \end{cases} \quad (EQ3)$$

$$w < 8 = \begin{cases} [v_1v_2v_3v_4v_5v_7v_8v_9v_{11}\ldots v_{18}] = \overline{\underline{b}}, \\ v_{10} = 0. \end{cases}$$

The first embodiment for the code generator 154a implements equations 1–3 in hardware and comprises: an adder 160, a one-bit latch 162, a first modulo adder 164, and a second modulo adder 168. The functions performed by the adder 160, the latch 162, the first modulo adder 164, and the second modulo adder 168 all be implemented using techniques well-known to those skilled in the art.

The adder 160 receives the input data $\underline{b}$, determines the number of ones in $\underline{b}$, then outputs $w=[w_0w_1w_2w_3w_4]$ (hereinafter "weight bits"). The weight bits $w_0$ and $w_1$ provided by the adder 160 are ORed together by an OR gate 170 to produce a binary 1 if the number of ones in $\underline{b}$ is $\geq 8$, or a binary 0 if the number of ones in $\underline{b}$ is <8. In either case, the result is inverted by an inverter 172 whose output is coupled to a plurality of Exclusive-OR gates 174–190 where it is Exclusive-ORed with each bit of the input data $\underline{b}$. Specifically, the input data bits $[b_1b_2b_5b_8b_{11}b_{12}b_{15}b_{16}]$ are Exclusive-ORed by a respective Exclusive-OR gate 174–182 with the output of the inverter 172 to produce code bits $[v_1v_2v_5v_9v_{13}v_{14}v_{17}v_{18}]$, respectively. The code bits $[v_1v_2v_5v_9v_{13}v_{14}v_{17}v_{18}]$ are then coupled to the first modulo adder 164 to produce the additional code bit $v_6$ in accordance with equation 1. Likewise, the input data bits $[b_3b_4b_6b_7b_9b_{10}b_{13}b_{14}]$ are respectively Exclusive-OR by Exclusive-OR gates 183–190 with the output of the inverter 172 produce the code bits $[v_3v_4v_7v_8v_{11}v_{12}v_{15}v_{16}]$. The code bits $[v_3v_4v_7v_8v_{11}v_{12}v_{15}v_{16}]$ are then provided to the second modulo adder 162 to produce the next state ns in accordance with equation 2. The current state cs is then applied as an input to the first modulo adder 164 along with the code bits $[v_1v_2v_5v_9v_{13}v_{14}v_{17}v_{18}]$ in accordance with equation 1. The next state ns is applied as input to the latch 162 produce the current state cs. Finally, the output of the OR gate 170 is Exclusive-ORed with the output of the inverter 172 by Exclusive-OR gate 178 produce the additional code bit $v_{10}$. Code bit $v_{10}$ is provided as input into the first modulo adder 164. The code generator 154a, as described above, will produce the additional code bits $v_6$ and $v_{10}$ which form part of the encoded sequence $\{v_1v_2v_3 \ldots\}$ produced at the output 24 of the parallel-to-serial converter 152.

Figure 4:
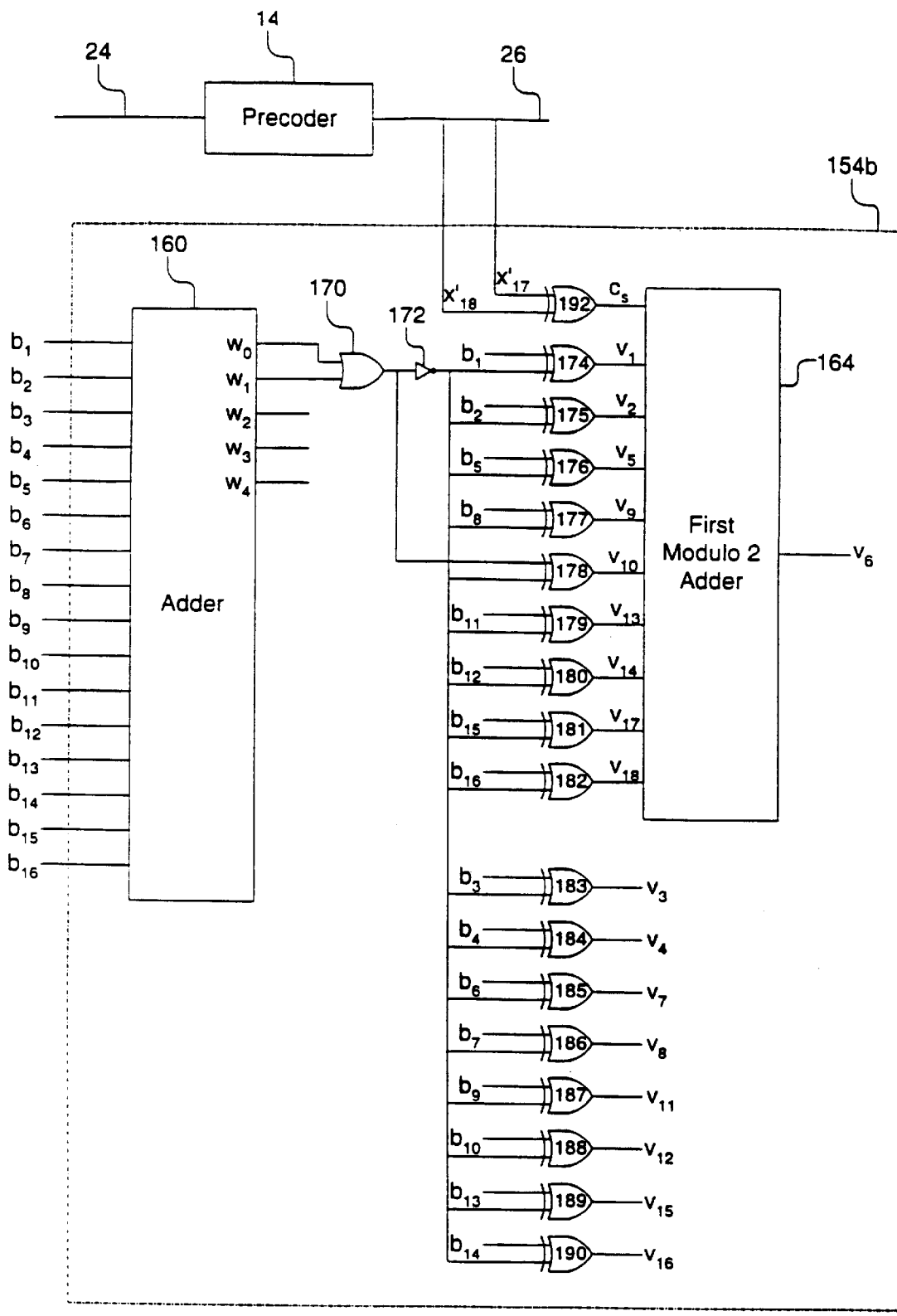
FIG. 4 is a block diagram of a second embodiment of the code generator used in the first embodiment of the encoder and constructed according to the present invention to generate the first code.

Referring now to FIG. 4, a second embodiment of the code generator 154b for code 1 is shown. The code generator 154b is based on the same equations as embodiment 154a, except we let $\underline{v}'=[v'_1 \ldots v'_{18}]$ denote the last codeword sent through the $1/(1\oplus D^2)$ precoder and compute the current state cs from the equation $$cs=x'_{17}\oplus x'_{18}, \quad (EQ4)$$

where $x'_{17}$ and $x'_{18}$ are the output of the precoder 14 corresponding to the code bits $v'_{17}$ and $v'_{18}$, respectively. The initial current state is $cs_0=x'_{-1}\oplus x'_{-2}$ as in the first embodiment.

As shown in FIG. 4, the second embodiment of the code generator 154b is similar to the first embodiment of the code generator 154a but without the second modulo adder 168 computing the next state ns. Therefore, like part numbers have be used to indicate like parts having the same function in the second embodiment. Instead of computing the next state ns, the bits $x'_{17}$ and $x'_{18}$ are feedback from the output 26 of the precoder 14 as shown in FIG. 1, and are Exclusive-ORed in an Exclusive-OR gate 192 produce the current sate cs which is then input into the first modulo adder 164 produce the additional code bit $v_6$. The $x'_{17}$ and $x'_{18}$ bits are shown for illustration purposes as being connected to line 26, however, those skilled in the art will realize that latch and other combinational logic are used to capture the $x'_{17}$ and $x'_{18}$ bits.

Figure 5:
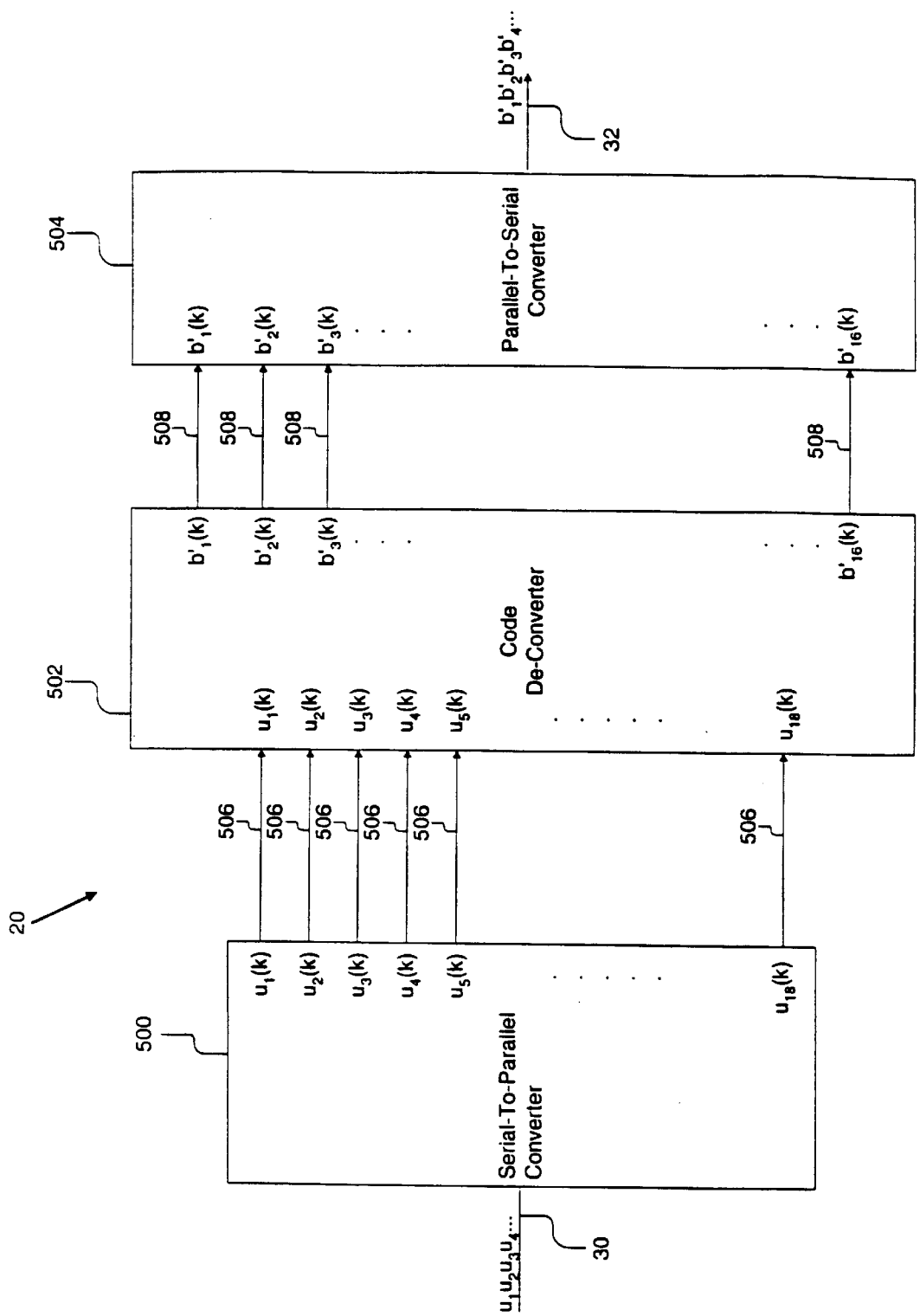
FIG. 5 is a block diagram of a preferred embodiment of a decoder constructed according to the present invention for use in conjunction with the preferred embodiment of the encoder.

Referring now to FIG. 5, a preferred embodiment of the decoder 20 constructed according to the present invention for decoding signals is shown. The decoder 20 preferably comprises a serial-to-parallel converter 500, code de-converter 502, and a parallel-to-serial converter 504. The serial-to-parallel converter 500 preferably has an input and eighteen outputs, and converts an input string into eighteen parallel bits. The input of the serial-to-parallel converter 500 is coupled to line 30 to receive the detector sequence $\{u_1u_2u_3 \ldots\}$ output by the detector 18. Each of the outputs of the serial-to-parallel converter 500 are coupled by a respective signal line 506 to a respective input of the code de-converter 502. The code de-converter 502 preferably has a plurality (eighteen) of inputs and a plurality (sixteen) of outputs. The inputs of the code de-converter 502 are coupled to receive eighteen of the detector sequence $\{u_1u_2u_3 \ldots\}$. The sixteen outputs of the code de-converter 502 are likewise coupled to respective inputs of the parallel-to-serial converter 504. The parallel-to-serial converter 504 preferably has sixteen inputs and an output, and converts the sixteen input parallel bits into a string. The output of the parallel-to-serial converter 504 is coupled to line 32 to provide the decoded sequence $\{b'_1b'_2b'_3 \ldots\}$.

Figure 6:
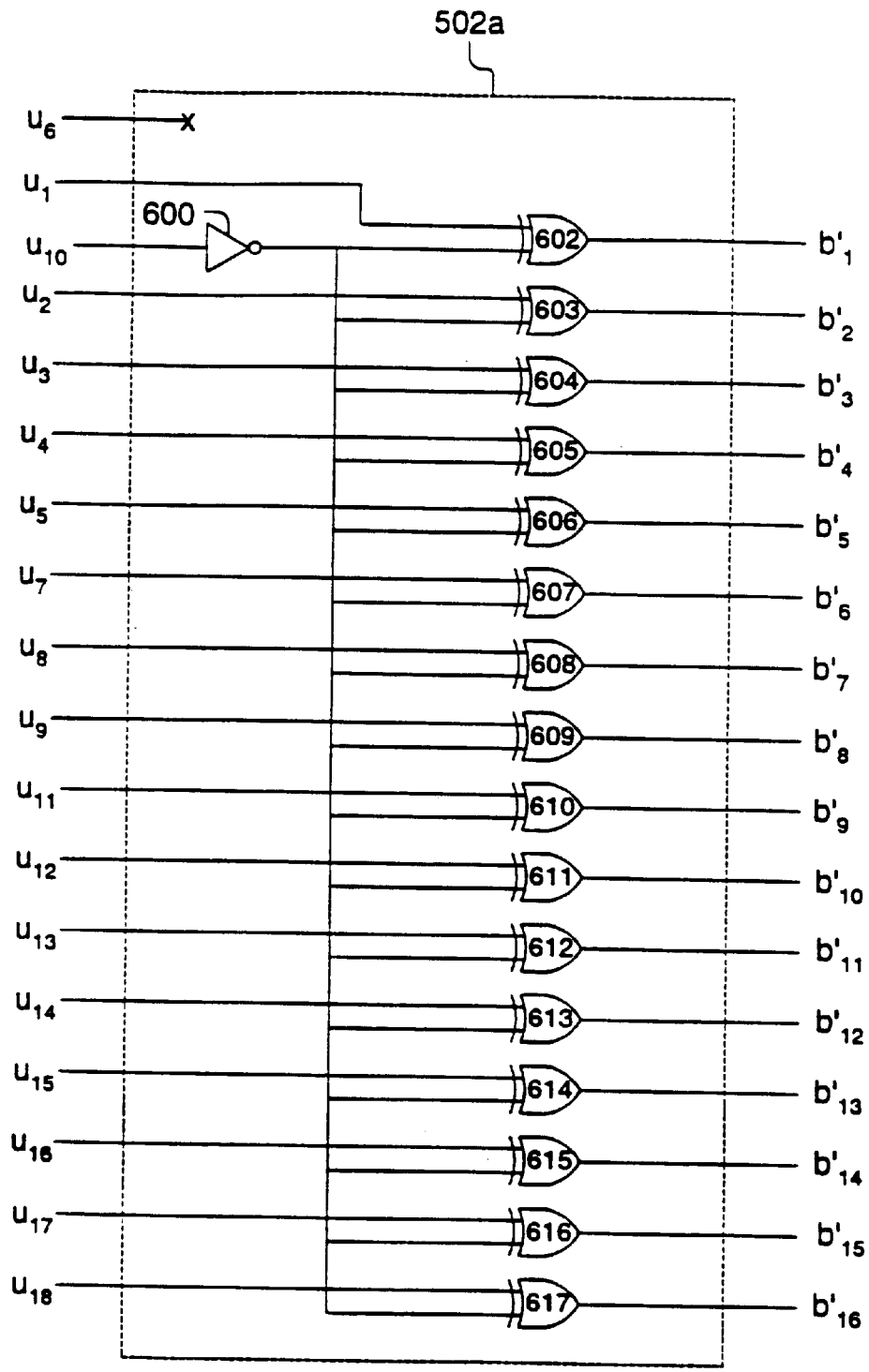
FIG. 6 is a block diagram of a first embodiment of a code de-converter used in the preferred embodiment of the decoder and constructed according to the present invention to decode the first code.

Referring now to FIG. 6, a first embodiment of the code de-converter 502a which reconstructs the input data $\underline{b}$ is shown. The code de-converter 502a can be characterized by the following equations:

$$\underline{b'} = [u_1u_2u_3u_4u_5u_7u_8u_9u_{11}\ldots u_{18}], \text{ if } u_{10} = 1, \text{ and} \quad (EQ5)$$

$$\underline{b'} = [\overline{u_1u_2u_3u_4u_5u_7u_8u_9u_{11}}\ldots \overline{u_{18}}], \text{ if } u_{10} = 0.$$

As shown in FIG. 6, the bit $u_{10}$ is inverted by an inverter 600. The output of the inverter 600 is then Exclusive-ORed with bits $u_1$ through $u_{18}$, excluding bits $u_{10}$ and $u_6$, using a plurality of Exclusive-OR gates 602–617. Thus, the code de-converter 502a drops the $u_6$ bit, and uses the $u_{10}$ bit to regenerate the input sixteen bit code from eighteen bits of data.

While the encoders and decoders of the system 10 have and will be described as including serial-to-parallel converters and parallel-to-serial converters, those skilled in the art will realize that the present invention may be constructed without use of such converters. Since the control bits are assigned to one of the bits for each code, an alternate embodiment of the encoder does not require the converters. Rather, as bits enter into the alternate embodiment of the encoder, they simply pass through except at time instances where a control bit needs to be inserted. At such an instance, the input stream is stopped (via such method as clock gapping) and the control bit is computed and inserted at the output of the encoder.

CODE 2

Figure 7:
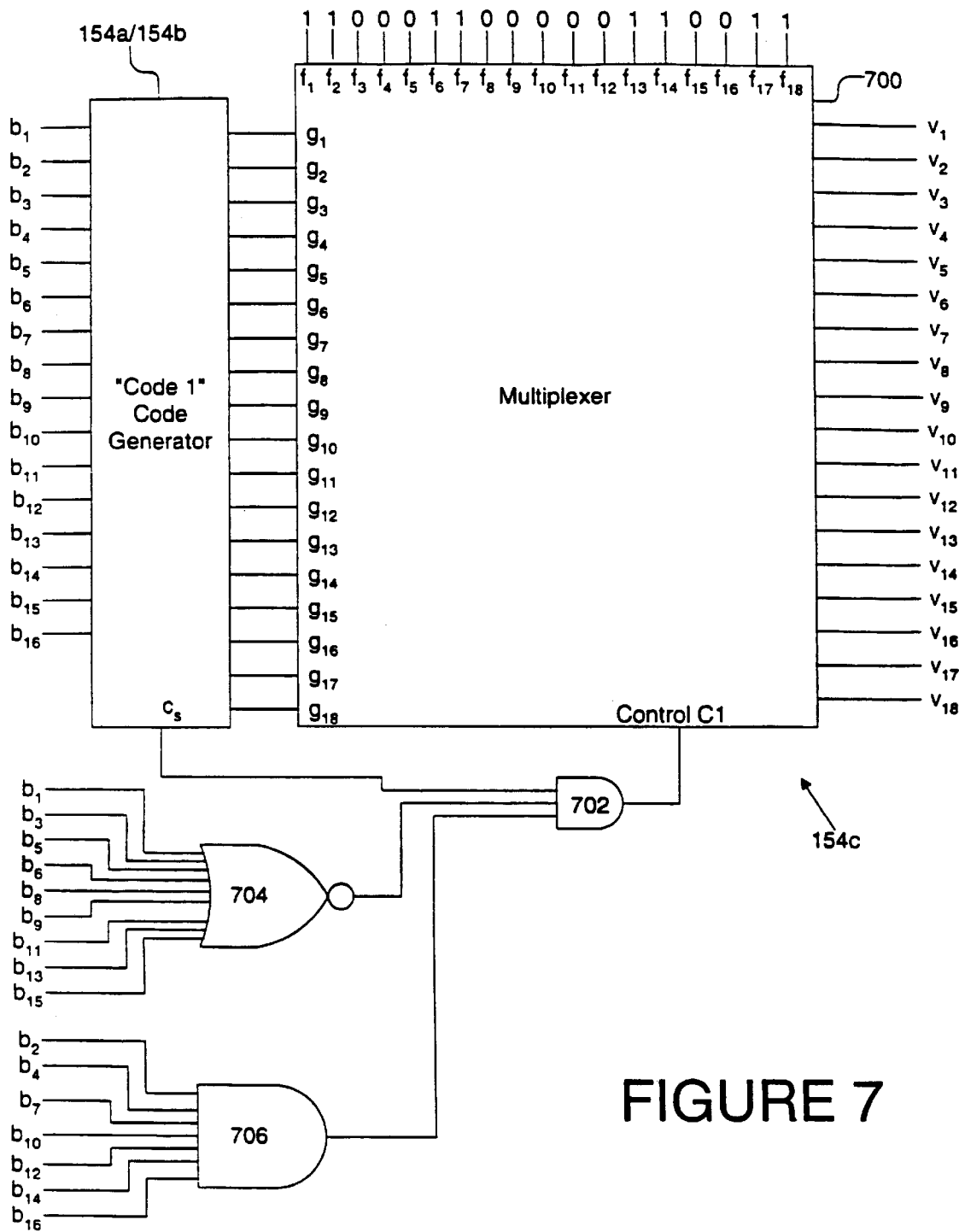
FIG. 7 is a block diagram of a third embodiment of the code generator constructed according to the present invention to generate a second code, Code 2.

Referring now to FIG. 7, a third embodiment of the code generator 154c will be described. The third embodiment of the code generator 154c uses the properties of Code 2 to reduce the number of consecutive zeros present in odd or even bit positions at the output of the PR channel 16 by utilizing a vector of weight 8 instead of codeword $\underline{v}$. The third embodiment of the code generator 154c takes sixteen bits $\{b_{16k+1}b_{16k+2}b_{16k+3}, \ldots, b_{16k+16}\}$ every time $k \geq 0$, and produces eighteen bits $\{v_{18k+1}v_{18k+2}v_{18k+3}, \ldots, v_{18k+18}\}$. We use the notation of $v_i(k)$, $i \in \{1, \ldots, 18\}$ for $v_{18k+i}$ and the notation of $b_i(k)$, $i \in \{1, \ldots, 16\}$ for $b_{16k+i}$.

Using the same notations as in the details of Code 1, the code generator 154c of code 2 is characterized as follows:

$$v_6 = cs \oplus v_1 \oplus v_2 \oplus v_5 \oplus v_9 \oplus v_{10} \oplus v_{13} \oplus v_{14} \oplus v_{17} \oplus v_{18} \quad (EQ1)$$

$$cs_k = ns_{k-1} = v_3 \oplus v_4 \oplus v_7 \oplus v_8 \oplus v_{11} \oplus v_{12} \oplus v_{15} \oplus v_{16} \quad (EQ2)$$

$$w \geq 8 = \begin{cases} [v_1v_2v_3v_4v_5v_7v_8v_9v_{11}\ldots v_{18}] = \underline{b}, \\ v_{10} = 1. \end{cases} \quad (EQ3)$$

$$w < 8 = \begin{cases} [v_1v_2v_3v_4v_5v_7v_8v_9v_{11}\ldots v_{18}] = \overline{\underline{b}}, \\ v_{10} = 0. \end{cases}$$

If $\underline{v} = \underline{\alpha} = 101010101010101010$, then replace it with $\underline{\beta} = 110001100000110011$. $\quad (EQ6)$ As shown in FIG. 7, the third embodiment of the code generator 154c can be implemented with either code generator 154a or 154b as described above in FIGS. 3 and 4, a multiplexer 700, a first AND gate 702, a second AND gate 706 and a NOR gate 704. The signal $\underline{g} = [g_1g_2g_3g_4g_5g_7g_8g_9g_{11}\ldots f_{18}]$ is the output of the "Code 1" code generator 154a or 154b; the signal $\underline{f} = [f_1f_2f_3f_4f_5f_7f_8f_9f_{11}\ldots f_{18}]$ is $\underline{\beta} = 110001100000110011$; the control signal $c_1$ is given by $$c_1 = \begin{cases} 1, & \text{if } \underline{b} = 0101001001010101, \text{ and } cs = 1, \\ 0, & \text{otherwise,} \end{cases} \quad (EQ7)$$

and $v_i$ is defined by $$v_i = \begin{cases} g_i & \text{if } c_1 = 0, \text{ and} \\ f_i & \text{if } c_1 = 1. \end{cases}$$

The input date $\underline{b}$ to be encoded is applied in parallel fashion to the inputs of the code generator 154c as shown in FIG. 7. The signal $\underline{g}$ at the output of "Code 1" code generator 154a/154b is applied to a first set of inputs of the multiplexer 700, in parallel fashion. The "Code 1" code generator 154a/154b used in this third embodiment is also modified in that the "Code 1" code generator 154a/154b outputs the $c_s$ signal. The signal $\underline{f}$ is applied to a second set of inputs of the multiplexer 700, also in parallel fashion. The signal $\underline{f}$ can be hard-wired to the inputs of the multiplexer 700. When the control signal $c_1$ is binary 0, then $\underline{v}$ is defined by $\underline{g}$. On the other hand, when the control signal $c_1$ is binary 1, then $\underline{v}$ is defined by $\underline{f}$. More particularly, when the input data $\underline{b} = [0101001001010101]$, and $cs=1$, the codeword $\underline{f}$ is steered to the output of the multiplexer 700. The control signal $c_1$ is generated using by ANDing the bits $[b_2b_4b_7b_{10}b_{12}b_{14}b_{16}]$ using the second AND gate 706. Also, the bits $[b_1b_3b_5b_6b_8b_9b_{11}b_{13}b_{15}]$ are NORed together using a NOR gate 704. The outputs of the second AND gate 706 and the NOR gate 704 are then ANDed together along with the signal cs in the first AND gate 702 to produce the control signal $c_1$.

In sum, the third embodiment of the code generator 154c for generating a second code, Code 2, is coupled to the precoder 14 and followed by the PR channel, and produces the following parameters: $\tilde{N}=8$, $Z=17$, $Z_i=16$, and $\hat{E}=3$. Additionally, code 2 generates a Hamming distance of 2 after precoding. Finally, code 2 has only one codeword generating 8 ones at the output of the PR channel; the rest of its code words generate at least 9 ones for improved clocking.

Figure 8:
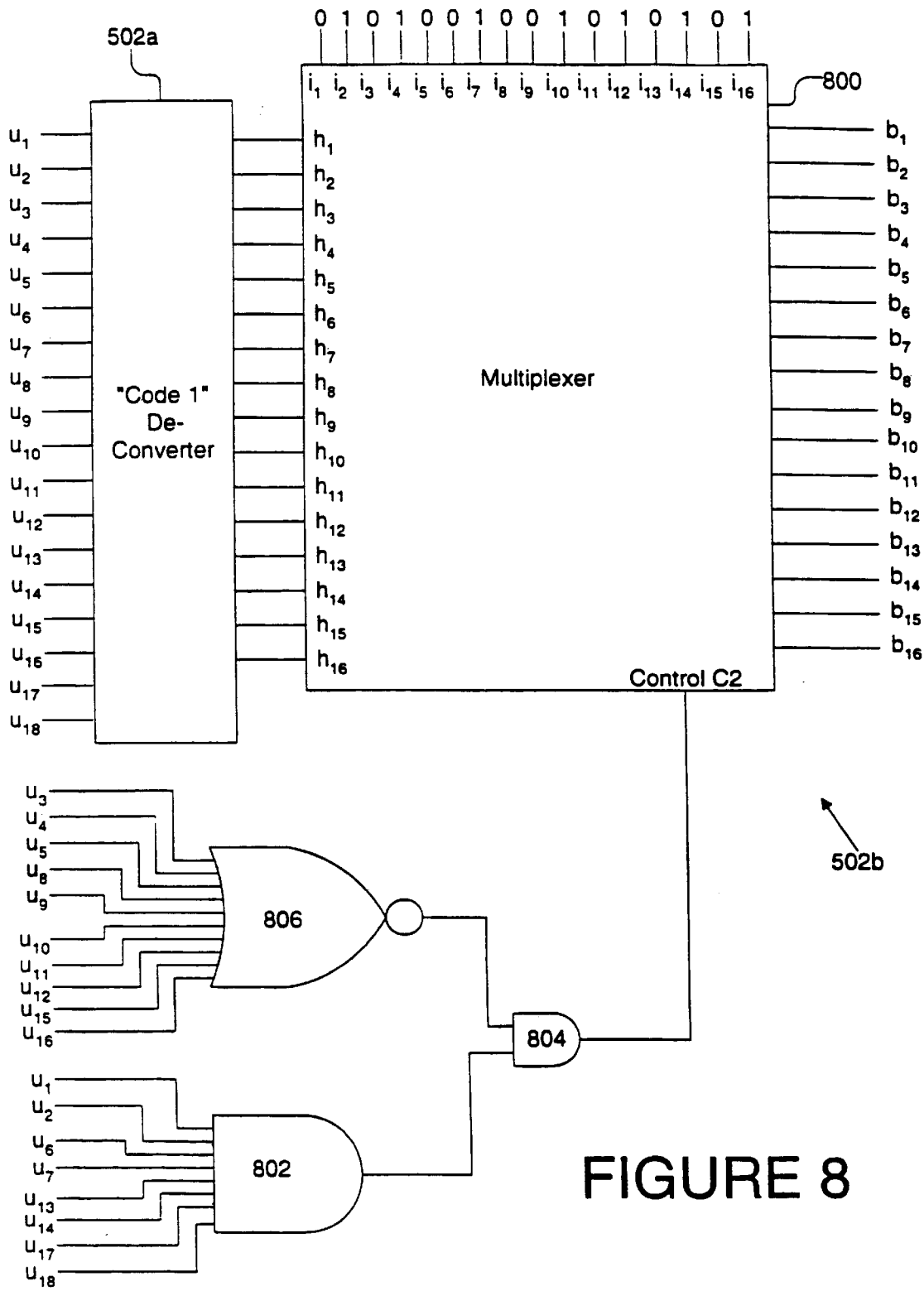
FIG. 8 is a block diagram of a second embodiment of a code de-converter constructed according to the present invention for use in conjunction with the third embodiment of the code generator.

Referring now to FIG. 8, a second embodiment of a code de-converter 502b constructed according to the present invention for decoding signals encoded with Code 2 is shown. The code de-converter 502b preferably comprises a "Code 1" de-converter 502a as described above in FIG. 6, a multiplexer 800, a first AND gate 802, a second AND gate 804, and a NOR gate 806. The code de-converter 502b for Code 2 is characterized as follows:

$$\underline{b'} = [u_1u_2u_3u_4u_5u_7u_8u_9u_{11}\ldots u_{18}], \text{ if } \underline{u} \neq \beta \text{ and } u_{10} = 1, \quad (EQ8)$$

$$\underline{b'} = [\overline{u_1u_2u_3u_4u_5u_7u_8u_9u_{11}}\ldots \overline{u_{18}}], \text{ if } \underline{u} \neq \beta \text{ and } u_{10} = 0,$$

$$\underline{b'} = [0101001001010101], \text{ if } \underline{u} = \underline{\beta}.$$

The signal $\underline{h} = [h_1h_2h_3h_4h_5h_7h_8h_9h_{11}\ldots h_{18}]$ is output data generated by the Code 1 de-converter 502a; the signal $\underline{i} = [i_1i_2i_3i_4i_5i_7i_8i_9i_{11}\ldots i_{16}]$ is $[0101001001010101]$; the control signal $c_2$ is given by $$c_2 = \begin{cases} 1, & \text{if } \underline{u} = 110001100000110011 \\ 0, & \text{otherwise,} \end{cases} \quad \text{(EQ9)}$$

and $b_j$ is defined by $$b_j = \begin{cases} h_j & \text{if } c_2 = 0, \text{ and} \\ i_j & \text{if } c_2 = 1. \end{cases}$$

As shown in FIG. 8, the detector sequence is applied in parallel fashion to the inputs of the de-converter 502a. The output of the de-converter 502a is applied to a first set of inputs of the multiplexer 800, in parallel fashion. The signal $\underline{i}$ is applied to a second set of inputs of the multiplexer 800, also in parallel fashion. The signal $\underline{i}$ can be hard-wired to the inputs of the multiplexer 800. When $\underline{u}=110001100000110011$, then $c_2=1$, and the signal $\underline{i}$ is steered to the output of the multiplexer 800. Similarly, when the control signal $c_2=0$, then $\underline{b}$ is defined by the signal $\underline{h}$. The control signal $c_2$ is generated by ANDing the bits $[u_1u_2u_6u_7u_{13}u_{14}u_{17}u_{18}]$ using the first AND gate 802. Also, the bits $[u_3u_4u_5u_8u_9u_{10}u_{11}u_{12}u_{15}u_{16}]$ are NORed together using the NOR gate 806. The outputs of the first AND gate 802 and the NOR gate 806 are then ANDed together by the second AND gate 804 to produce the control signal $c_2$.

CODE 3

Figure 9:
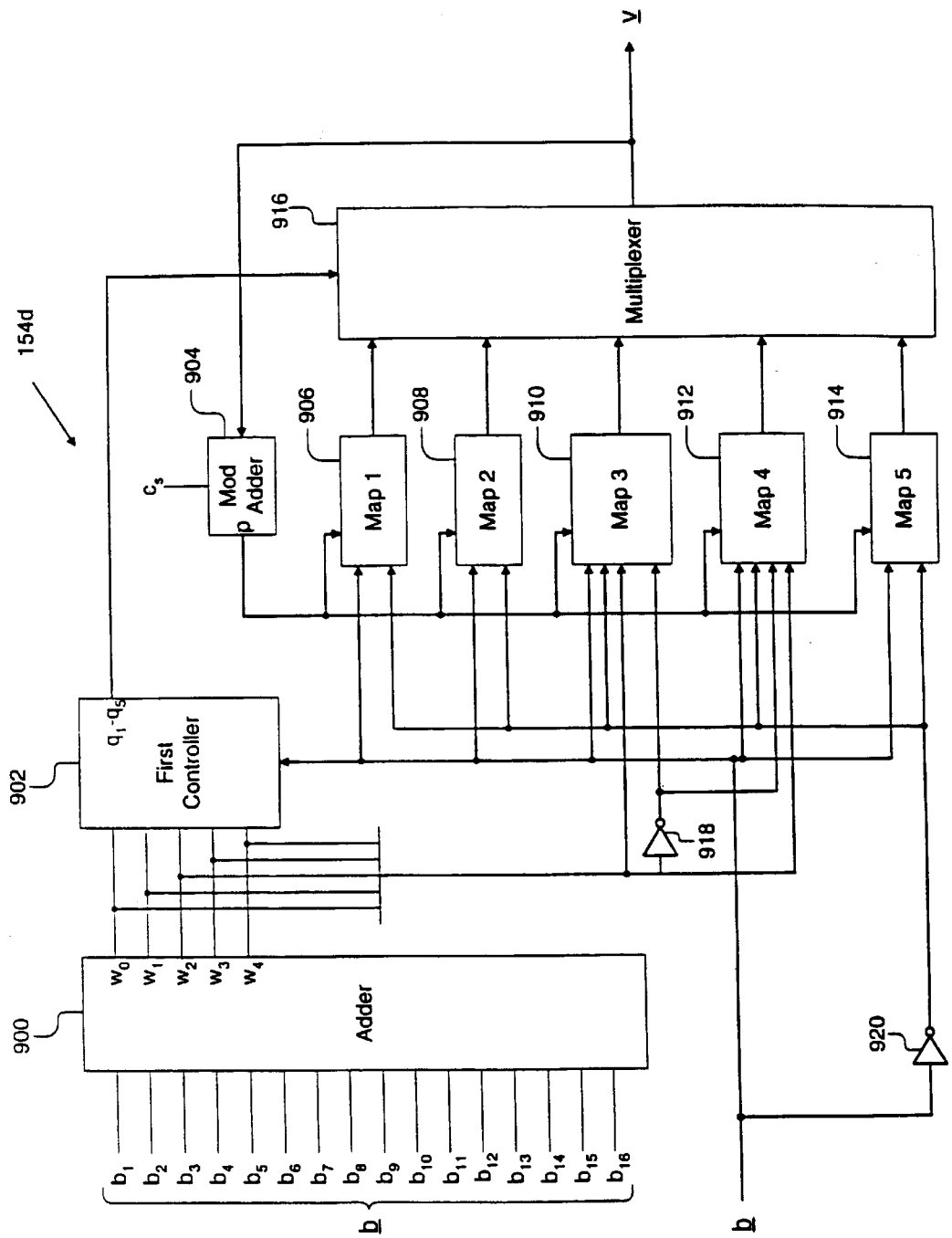
FIG. 9 shows a fourth embodiment of the code generator constructed according to the present invention to generate a third code, "Code 3"

Referring now to FIG. 9, a fourth embodiment of a code generator 154d constructed according to the present invention for encoding signals encoded with a third code, "Code 3" is shown. The code generator 154d preferably comprises an adder 900, a first controller 902, a mod adder 904, a plurality of mapping circuits 906, 908, 910, 912, and 914, a multiplexer 916 and a plurality of inverters 918, 920. Recall that in Code 1, the input data $\underline{b}$ is partitioned into two sets according to weight w. Let $P_1$ contain input data of $w \geq 8$, and $P_2$ contain input data of $w<8$. The fourth embodiment of the code generator 154d for Code 3 is characterized as follows:

Let the input data $\underline{b}$ be partitioned into three sets, $S_1$, $S_2$, and $S_3$, where $$S_1 = P_1, \quad \text{(EQ10)}$$

$$S_2 = P_2 - \{(0101001001010101)\}, \text{ and}$$

$$S_3 = \{(0101001001010101)\}.$$

Unlike Code 1 and Code 2, which use a partitioning based on a threshold weight of 8, Code 3 employs a partitioning based on a threshold weight of 6. Specifically, let $R_1$ denote the set of input data of weight $w \geq 6$; let $R_2$ denote the set of input data of $w<6$; and let A, H, and E denote the following sets:

$$A = \{\text{input data } \underline{b}: b_1=b_3=b_5=b_6=b_8=b_9=0, \text{ and } w(\underline{b}) \geq 6\} \quad \text{(EQ11)}$$

$$H = \{\text{input data } \underline{b}: b_9=b_{10}= \ldots =b_{16}=0, \text{ and } w(\underline{b}) \geq 6\}, \text{ and}$$

$$E = \{\text{input data } \underline{b}: b_{10}=b_{12}=b_{14}=b_{16}=1, \text{ and } w(\underline{b})<6\}.$$

Now, Code 3 partitions the input data $\underline{b}$ into 5 sets, $Q_1$ through $Q_5$, where $$Q_1 = R_1 - (A \cup H), \quad \text{(EQ12)}$$

$$Q_2 = R_2 - E,$$

$$Q_3 = A,$$

$$Q_4 = H, \text{ and}$$

$$Q_5 = E.$$

Code 3 can be viewed as comprising 5 maps, map 1 through map 5, operating on distinct sets of input $Q_1$ through $Q_5$, respectively. Using the same notations as in the details of Code 1 and Code 2, and using the sets defined above, Code 3 can be further characterized as follows ($\wedge$ denotes AND and $\vee$ denotes OR):

$[w_0w_1w_2w_3w_4]$=binary representation of w, $l = b_1 \vee b_3 \vee b_5 \vee b_7 \vee b_9 \vee b_{13}$, $$p = cs \oplus v_1 \oplus v_2 \oplus v_5 \oplus v_9 \oplus v_{10} \oplus v_{13} \oplus v_{14} \oplus v_{17} \oplus v_{18}, \quad \text{(EQ13)}$$

where the current state cs can be generated in two ways as described earlier for code 1.

Referring now to TABLE II, column 2 defines map1, column 3 defines map2, column 4 defines map3, column 5 defines map4, and column 6 defines map5. For example, map3 generates $v_7$ according to $v_7 = (w_1 \wedge \overline{w_2} \wedge \overline{w_3}) \vee w_4$.

TABLE II

| Output | map1 | map2 | map3 | map4 | map5 |
|---|---|---|---|---|---|
| $v_1$ | $b_1$ | $\overline{b_1}$ | 1 | 1 | 1 |
| $v_2$ | $b_2$ | $\overline{b_2}$ | $b_2 \otimes \overline{w_1} \vee (\overline{w_2} \wedge \overline{w_3})^*$ | $w_1 \vee \overline{w_2} \vee \overline{w_3} \vee w_4$ | $b_1 \vee b_2$ |
| $v_3$ | $b_3$ | $\overline{b_3}$ | $b_4 \otimes \overline{w_1} \vee (\overline{w_2} \wedge \overline{w_3})^*$ | $\overline{b_1}$ | $\overline{b_1 \vee b_2}$ |
| $v_4$ | $b_4$ | $\overline{b_4}$ | $b_7 \otimes \overline{w_1} \vee (\overline{w_2} \wedge \overline{w_3})^*$ | $\overline{b_2}$ | $b_3 \vee b_4$ |
| $v_5$ | $b_5$ | $\overline{b_5}$ | $w_1$ | $\overline{b_3}$ | $b_5 \vee b_6$ |
| $v_6$ | p | p | p | p | p |
| $v_7$ | $b_6$ | $\overline{b_6}$ | $(w_1 \wedge \overline{w_2} \wedge \overline{w_3}) \vee w_4$ | 0 | 1 |
| $v_8$ | $b_7$ | $\overline{b_7}$ | $(w_1 \wedge \overline{w_2} \wedge \overline{w_3}) \vee w_4$ | 1 | 0 |
| $v_9$ | $b_8$ | $\overline{b_8}$ | $b_{10} \otimes \overline{w_1} \vee (\overline{w_2} \wedge \overline{w_3})^*$ | $\overline{b_4}$ | $b_7 \vee b_8$ |
| $v_{10}$ | 1 | 0 | 0 | 0 | 0 |
| $v_{11}$ | $b_9$ | $\overline{b_9}$ | $\overline{b_{11}}$ | $\overline{b_5}$ | $b_9 \vee b_{11}$ |
| $v_{12}$ | $b_{10}$ | $\overline{b_{10}}$ | $\overline{b_{12}}$ | $\overline{b_6}$ | $b_{13} \vee b_{15}$ |
| $v_{13}$ | $b_{11}$ | $\overline{b_{11}}$ | $\overline{b_{13}}$ | $\overline{b_7}$ | $\overline{b_{13} \vee b_{15}}$ |

TABLE II-continued

| Output | map1 | map2 | map3 | map4 | map5 |
|---|---|---|---|---|---|
| $v_{14}$ | $b_{12}$ | $\overline{b_{12}}$ | $\overline{b_{14}}$ | $\overline{b_8}$ | 1 |
| $v_{15}$ | $b_{13}$ | $\overline{b_{13}}$ | $\overline{b_{15}}$ | 1 | 1 |
| $v_{16}$ | $b_{14}$ | $\overline{b_{14}}$ | 1 | 1 | 1 |
| $v_{17}$ | $b_{15}$ | $\overline{b_{15}}$ | $\overline{b_{16}}$ | 1 | 0 |
| $v_{18}$ | $b_{16}$ | $\overline{b_{16}}$ | 1 | 1 | 1 |

*The symbol ⊗ denotes Exclusive OR.

Figure 10:
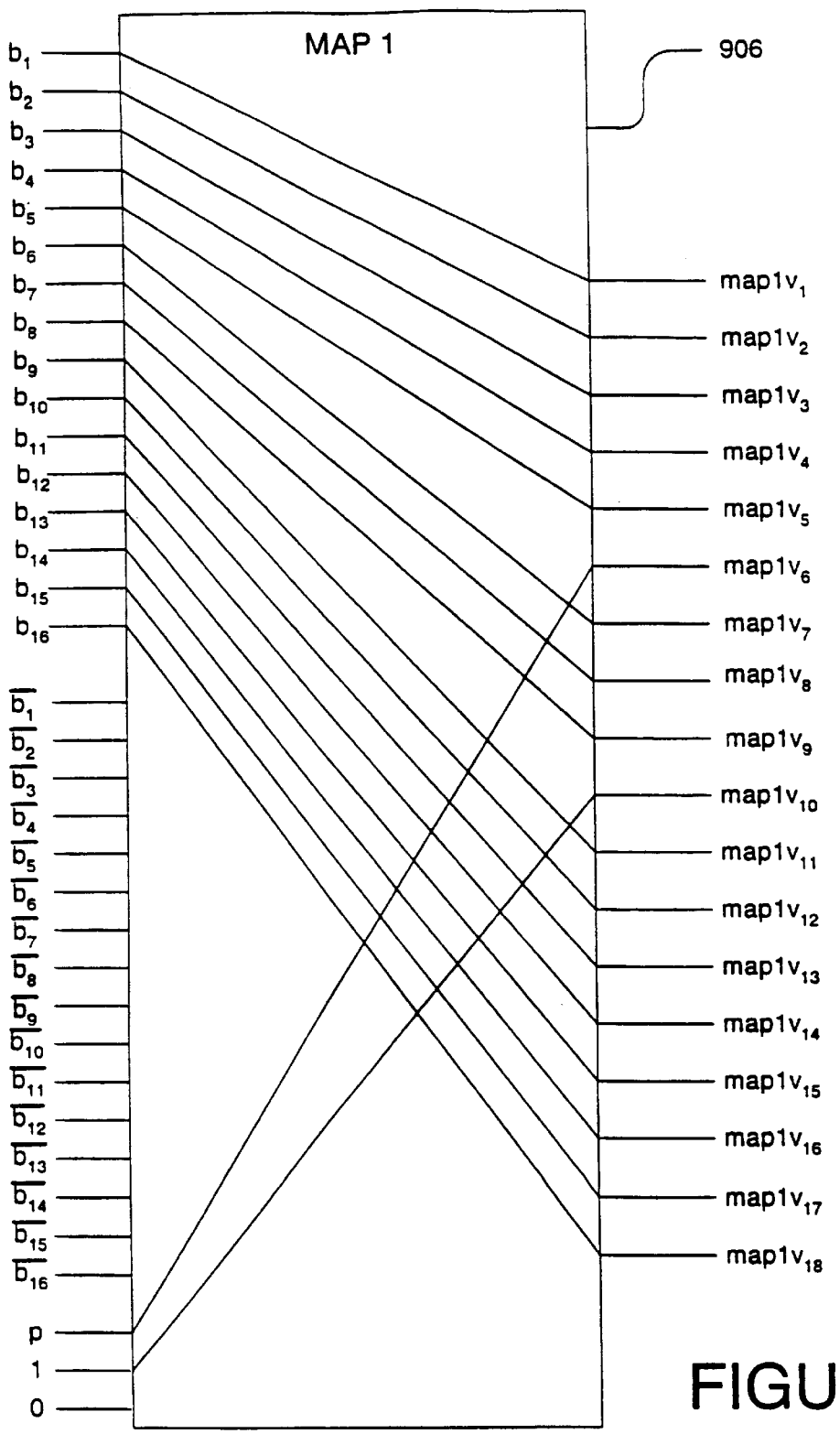
FIGS. 10–14 are mapping diagrams illustrating the first, second, third, fourth and fifth mapping circuits that generate the mapping functions of map1 through map5 for the fourth embodiment of the code generator illustrated in FIG. 9.

As shown in FIG. 9, the fourth embodiment of the code generator 154d preferably comprises an adder 900, a first controller 902, a mod adder 904, a first mapping circuit 906, a second mapping circuit 908, a third mapping circuit 910, a fourth mapping circuit 912, a fifth mapping circuit 914, a multiplexer 916 and a first and second inverters 918, 920. The adder 900 has a plurality of inputs coupled to receive the input data $\underline{b}$ and computes the weight w of $\underline{b}$, and generates the weight bits [$w_0 w_1 w_2 w_3 w_4$] as outputs. The output of adder 900 is coupled to inputs of the first controller 902, inputs of the third mapping circuit 910, and inputs of the fourth mapping circuit 912. The adder 900 and first controller 902 can be considered a partitioning unit, as will be recognized by those skilled in the art, since they define which of the five maps will be used to generate the output data word. The output of adder 900 is also input to inverter 918, which represents a plurality of inverters, for providing the complement of the weight bits. The output of the inverter 918 is also coupled to inputs of the third mapping circuit 910, and the fourth mapping circuit 912. The first, second, third, fourth and fifth mapping circuits 906, 908, 910, 912 and 914 perform the functions of map1 through map5 of TABLE II based on input data $\underline{b}$, its complement $\overline{b}$ provided by the output of inverter 920, and the variable p. Note that map3 and map4 are a function of the weight bits [$w_0 w_1 w_2 w_3 w_4$] and their complement. The controller 902 generates five control variables, $q_1$ through $q_5$, which are based on input data $\underline{b}$, and the weight bits [$w_0 w_1 w_2 w_3 w_4$]. The generation of the control bits $q_1$ to $q_5$ will be described below in more detail with reference to FIG. 17. Only one of the five control bits or variables is a logical one at any given time, and the rest are logical zeros. If the input data $\underline{b}$ is in the set $Q_i, 1 \leq i \leq 5$, then $q_i=1$ and the rest of the variables are zero. The outputs of each of the mapping circuits 906, 908, 910, 912 and 914 is coupled to a respective data inputs of the multiplexer 916, and the output of the controller 902 are coupled to the control inputs of the multiplexer 916. The multiplexer 916 reflects one of its input vectors map1v through map5v in response to the control bits $q_1$ to $q_5$ and produces the codeword $\underline{v}$ at the output. The selection is based on control variables $q_1$ through $q_5$. In other words, if $q_i=1$, where $1 \leq i \leq 5$, then the multiplexer 916 selects $\underline{v}$= map1v. The mod adder 904 31 generates the variable p according to equation 13 by performing modulo addition on identified bits of the codeword $\underline{v}$ and the $c_S$ signal. Referring now to FIG. 10, a preferred embodiment for the first mapping circuit 906 is shown. TABLE II shows the mapping from column 2 to column 1. The first mapping circuit 906 is preferably a hard wiring of the input data $\underline{b}$, the p bit and a logical "1" to corresponding bits of the codeword $\underline{v}$ consistent with TABLE II. The input data $\underline{b}$ is mapped directly to map1v, except for bits map1v$_6$ and map1v$_{10}$. The variable p computed according to equation 13 and is mapped to bit map1v$_6$, and a binary "1" is mapped to bit map1v$_{10}$. The bits map1v$_1$ to map1v$_{18}$ are the outputs of the first mapping circuit 906. When the input data $\underline{b}$ is in set $Q_1$, then the controller 902 generates $q_1=1$ and $q_2=q_3=q_4=q_5=0$. The multiplexer 916 responds by selecting map1v to be output to $\underline{v}$. The vector map1v is generated using $\underline{b}$ and p according to column 2 in TABLE II.

Figure 11:
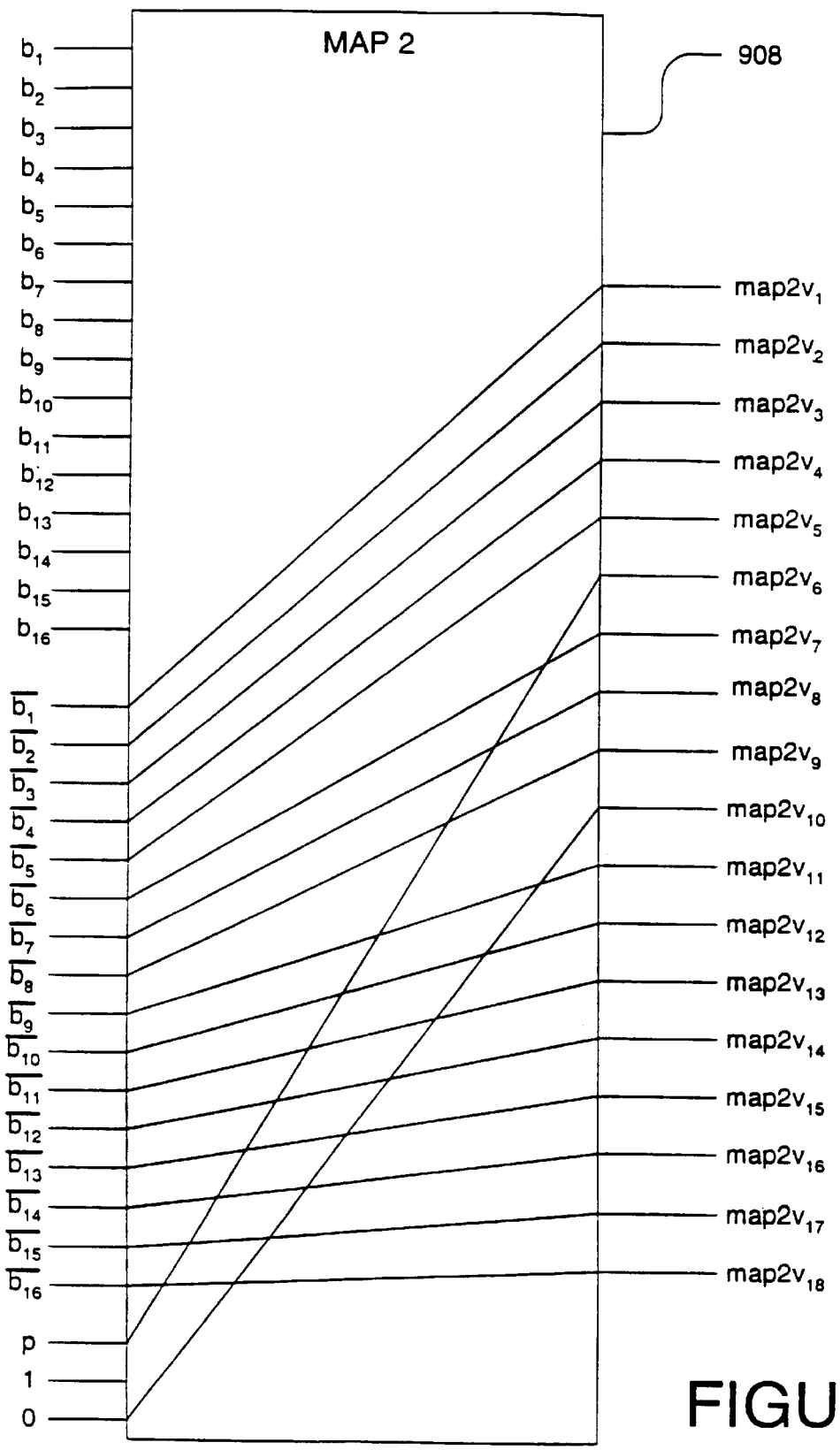

Referring now to FIG. 11, a preferred embodiment for the second mapping circuit 908 is shown, and TABLE II shows the mapping from column 3 to column 1 of TABLE II which is performed in the second mapping circuit 908. Similar, to the first mapping circuit 906, the second mapping circuit 908 is preferably a hard wiring of the input data $\underline{b}$, the p bit and a logical "1" to corresponding bits of the codeword $\underline{v}$. The input data $\overline{b}$ is mapped directly to map2v, except for bits map2v$_6$ and map2v$_{10}$. The variable p computed according to equation 13 is mapped to bit map2v$_6$, and a binary 0 is mapped to bit map2v$_{10}$. When the input data $\underline{b}$ is in set $Q_2$ then the controller 902 generates $q_2=1$ and $q_1=q_3=q_4=q_5=0$. The outputs are coupled to the control inputs of the multiplexer 916 select map2v to be output to $\underline{v}$. The map map2v is generated using $\overline{b}$ and p according to column 3 in TABLE II.

Figure 12:
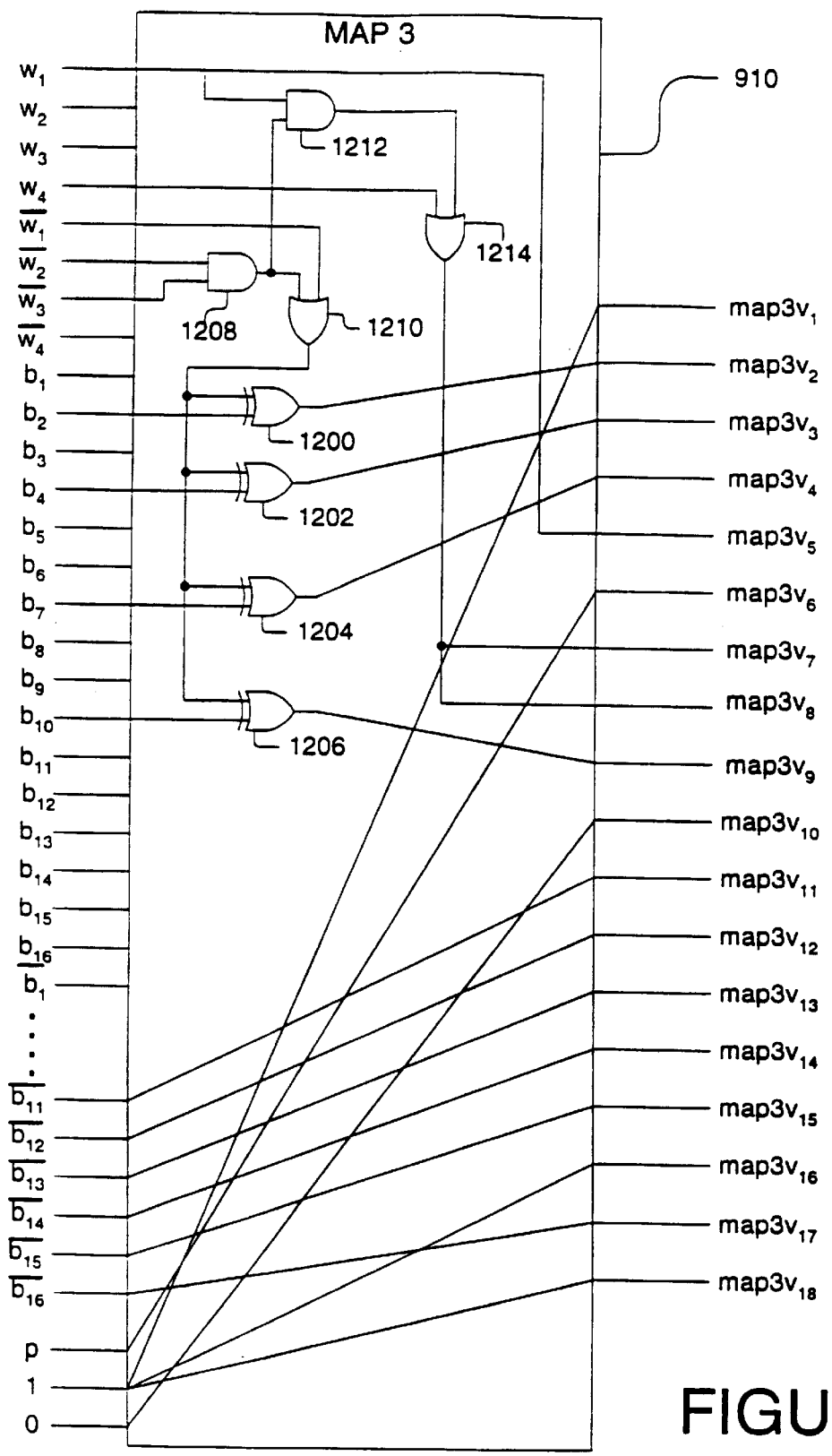
Figure 13:
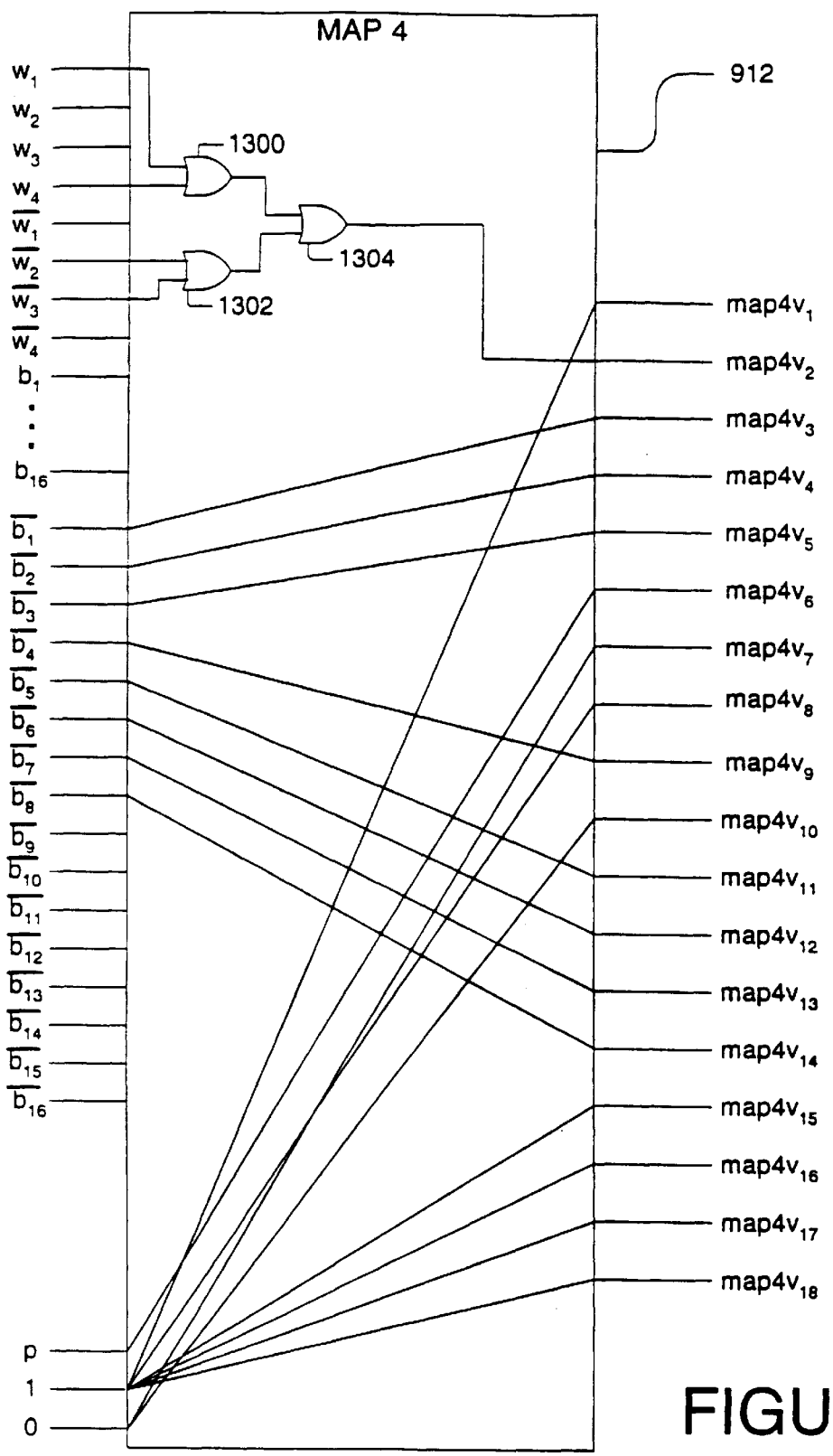

Referring now to FIG. 12, a preferred embodiment for the third mapping circuit 910 is shown. The third mapping circuit 910 generates the output map3v according to the mapping from column 4 to column 1 of TABLE II. The input data bits [$\overline{b}_{11}\overline{b}_{12}\overline{b}_{13}\overline{b}_{14}\overline{b}_{15}$] are mapped via handwriting directly to bits [map3v$_{11}$ . . . map3v$_{15}$]. respectively. Similarly, the input bit $\overline{b}_{16}$ is mapped directly to map3v$_{17}$. The variable p computed, according to equation 13, is mapped to bit map3v$_6$, and a binary 0 is mapped to bit map3v$_{10}$. The input data bits [$b_2 b_4 b_7 b_{10}$] are Exclusive-ORed respectively by Exclusive-OR gates 1200, 1202, 1204 and 1206 with the result of the Boolean operation $\overline{w}_1 \vee (\overline{w}_2 \wedge \overline{w}_3)$ performed by AND gate 1208 and OR gate 1210 on weight bits [$\overline{w}_1 \overline{w}_2 \overline{w}_3$]. The result of the Exclusive-OR operation performed by Exclusive-OR gates 1200, 1202, 1204 and 1206 is further mapped to the bits [map3v$_2$map3v$_3$map3v$_4$mapi3v$_9$], respectively. A binary 1 is mapped to the bits map3v$_1$, map3v$_{16}$, and map3v$_{18}$. The weight bit $w_1$ is mapped to bit map3v$_5$. The result of the operation $(w_1 \wedge \overline{w}_2 \wedge \overline{w}_3) \vee w_4$ performed by AND gate 1208, AND gate 1212 and OR gate 1214 on weight bits [$w_1 \overline{w}_2 \overline{w}_3 w_4$], using conventional combinational logic, is mapped to both bits map3v$_7$ and map$_3 v_8$, When the input data $\underline{b}$ is in set $Q_3$, then the first controller 920 generates $q_3=1$ and $q_1=q_2=q_4=q_5=0$. The multiplexer 916 selects map3v to be output to $\underline{v}$. The map map3v is generated using $\underline{b}$, $\overline{b}$, p, and weights bits [$w_1 w_2 w_3 w_4$] according to column 4 in TABLE II, and using the combinational logic as has been described above Referring now to FIG. 13, a preferred embodiment for the fourth mapping circuit 912 is shown. The fourth mapping circuit 912 generates the mapping from column 5 to column 1 of TABLE II. The fourth mapping circuit 912 preferably comprises a first, second and third OR gates 1300, 1302, 1304 and a plurality of hardwiring of inputs to outputs to generate the map4v bits. The first, second and third OR gates 1300, 1302, 1304 are coupled to produce the result of the operation $(w_1 \vee \overline{w_2} \vee \overline{w_3} \vee w_4)$ on weight bits $[w_1 \ \overline{w_2} \ \overline{w_3} \ w_4]$, and the output of the third OR Gate 1304 is mapped to bit map4$v_2$. The input data bits $[\overline{b_1} \ldots \overline{b_8}]$ are mapped directly to bits [map4$v_3$map4$v_4$map4$v_5$map4$v_9$map4$v_{11}$ ... map4$v_{14}$], respectively, via hard wiring. The variable p, computed according to equation 13, is mapped to bit map4$v_6$, a binary 0 is mapped to both bits map4$v_7$ and map4$v_{10}$, and a binary 1 is mapped to the remaining bits [map4$v_1$map4$v_8$map4$v_{15}$ ... map4$v_{18}$]. When the input data $\underline{b}$ is in set $Q_4$, then the first controller 290 generates $q_4=1$ and $q_1=q_2=q_3=q_5=0$, and in response the multiplexer 916 selects map4v to be output to $\underline{v}$. The map map4v is generated using $\underline{b}$, p, and weights bits $[w_1 w_2 w_3 w_4]$ according to column 5 in TABLE II, using the hardwiring and combinational logic set forth in FIG. 13.

Figure 14:
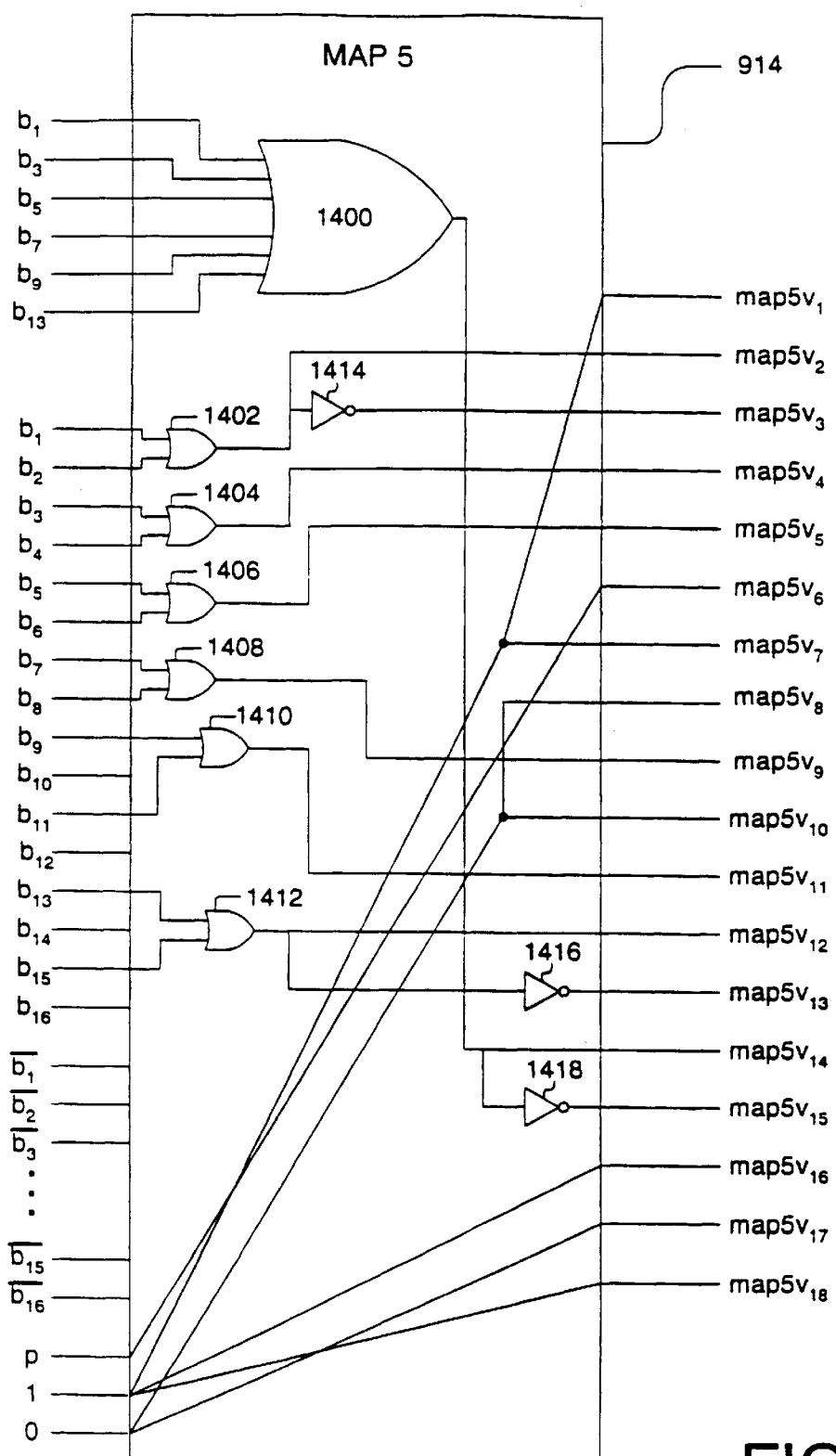

Referring now to FIG. 14 a preferred embodiment for the fifth mapping circuit 914 is shown. The fifth mapping circuit 914 generates the mapping from column 6 to column 1 of TABLE II. The fifth mapping circuit 914 comprises a plurality of OR gates 1400, 1402, 1404, 1406, 1408, 1410, and 1412, a plurality of inverters 1414, 1416 and 1418 and hardwiring of inputs to outputs to generate the map5v word. The variable p computed, according to equation 13, is mapped to bit map5$v_6$. A a binary 0 is mapped to bits map5$v_8$, map5$v_{10}$, and map5$v_{17}$. A binary 1 is mapped to the bits [map5$v_1$map5$v_7$map5$v_{16}$map5$v_{18}$]. An intermediate variable l is formed by ORing the data bits $(b_1 \vee b_3 \vee b_5 \vee b_7 \vee b_9 \vee b_{13})$ using OR gate 1400. The variable l, provided by the output of OR gate 1400 is then mapped to bit map5$v_{14}$ and its complement $\bar{l}$ provided by inverter 1418 is mapped and output as map5$v_{15}$. Input data bits $b_1$ and $b_2$ are ORed together by OR gate 1402 and the result is coupled to bit map5$v_2$. The output of OR gate 1402 is inverted by inverter 1414 and mapped to bit map5$v_3$. Input data bits $b_3$ and $b_4$ are ORed together by OR gate 1404 and the result is mapped to bit map5$v_4$. Input bits $b_5$ and $b_6$ are ORed together by OR gate 1406 and the result is mapped to bit map5$v_5$. Input data bits $b_7$ and $b_8$ are similarly ORed together by OR gate 1408 and the results is mapped to bit map5$v_9$. Input data bits $b_9$ and $b_{11}$ are ORed together by OR gate 1410 and the result is mapped to bit map5$v_{11}$. Finally, the input data bits $b_{13}$ and $b_{15}$ are ORed together by OR gate 1412 and the results is mapped to bit map5$v_{12}$. The output of OR gate 1412 is complemented by inverter 1416 and the output of the inverter 1416 is mapped to bit map5$v_{13}$. When the input data $\underline{b}$ is in set $Q_5$, then the first controller 902 generates $q_5=1$ and $q_1=q_2=q_3=q_4=0$, and in response to the q bits, the multiplexers 916 selects map5v to be output to $\underline{v}$. The map map5v is generated using $\underline{b}$, and p according to column 6 in TABLE II, and using the logic shown in FIG. 14.

Figure 15A:
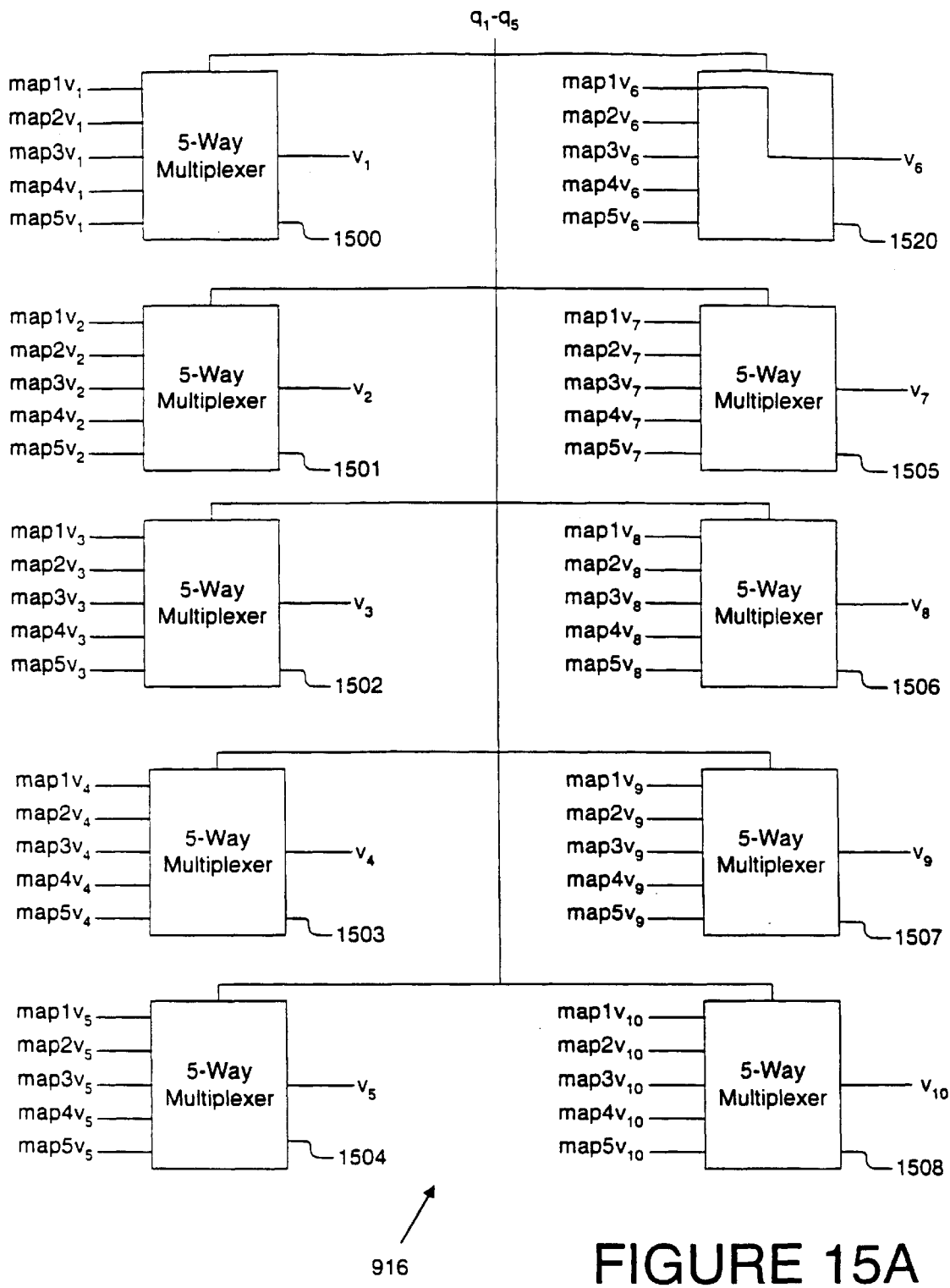
FIGS. 15A and 15B are a block diagram of a multiplexer used in the forth embodiment of the code generator constructed according to the present invention to generate the third code.
Figure 15B:
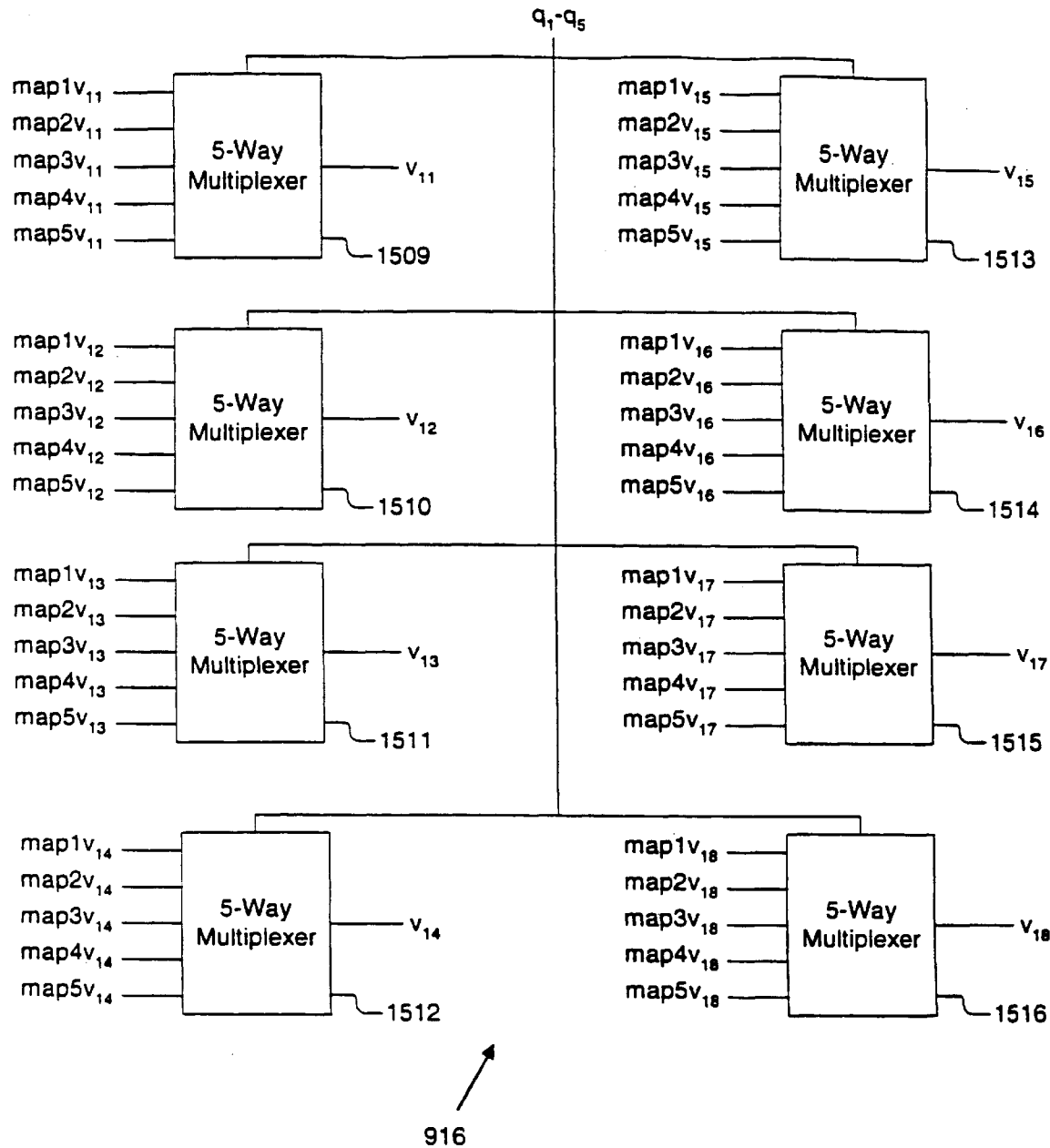

Referring now to FIGS. 15A and 15B15, one embodiment for the multiplexer 916 of FIG. 9 FIG. shown. The multiplexer 916 preferably comprises seventeen 5-way multiplexers 1500–1516 each producing a single output bit $v_i$ which collectively form the codeword $\underline{v}$. The bit $v_6$ is formed directly from map1$v_6$, and is implemented with a hardwiring of input to output on block 1520 that maps map1$v_6$ to $v_6$. The remaining 5-way multiplexers 1500–1516 are responsive to the control variables $q_1$ through $q_5$. For example, when $q_1=1$, then the output of map1 is steered to the output $v_1$ of the 5-way multiplexers 1500. Each of the other 5-way multiplexers 1501–1516 operate in a similar manner to direct one of the five input signal applied as the output for the corresponding bit of codeword $\underline{v}$.

Figure 16:
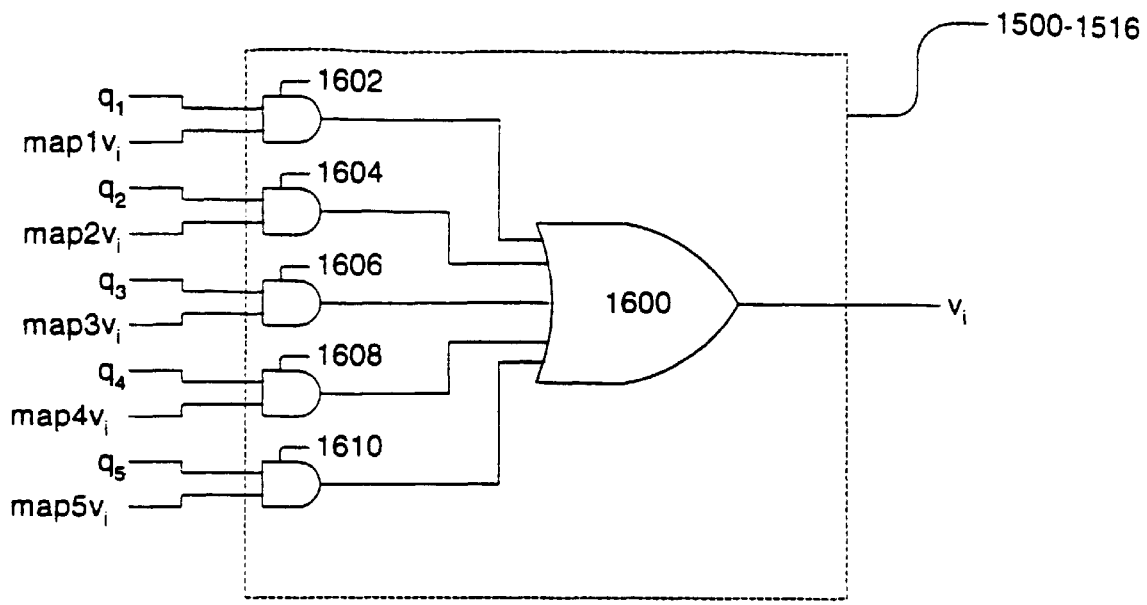
FIG. 16 is a block diagram of an exemplary one of the seventeen 5-way multiplexers forming part of the multiplexer used in the fourth embodiment of the code generator.
Figure 17:
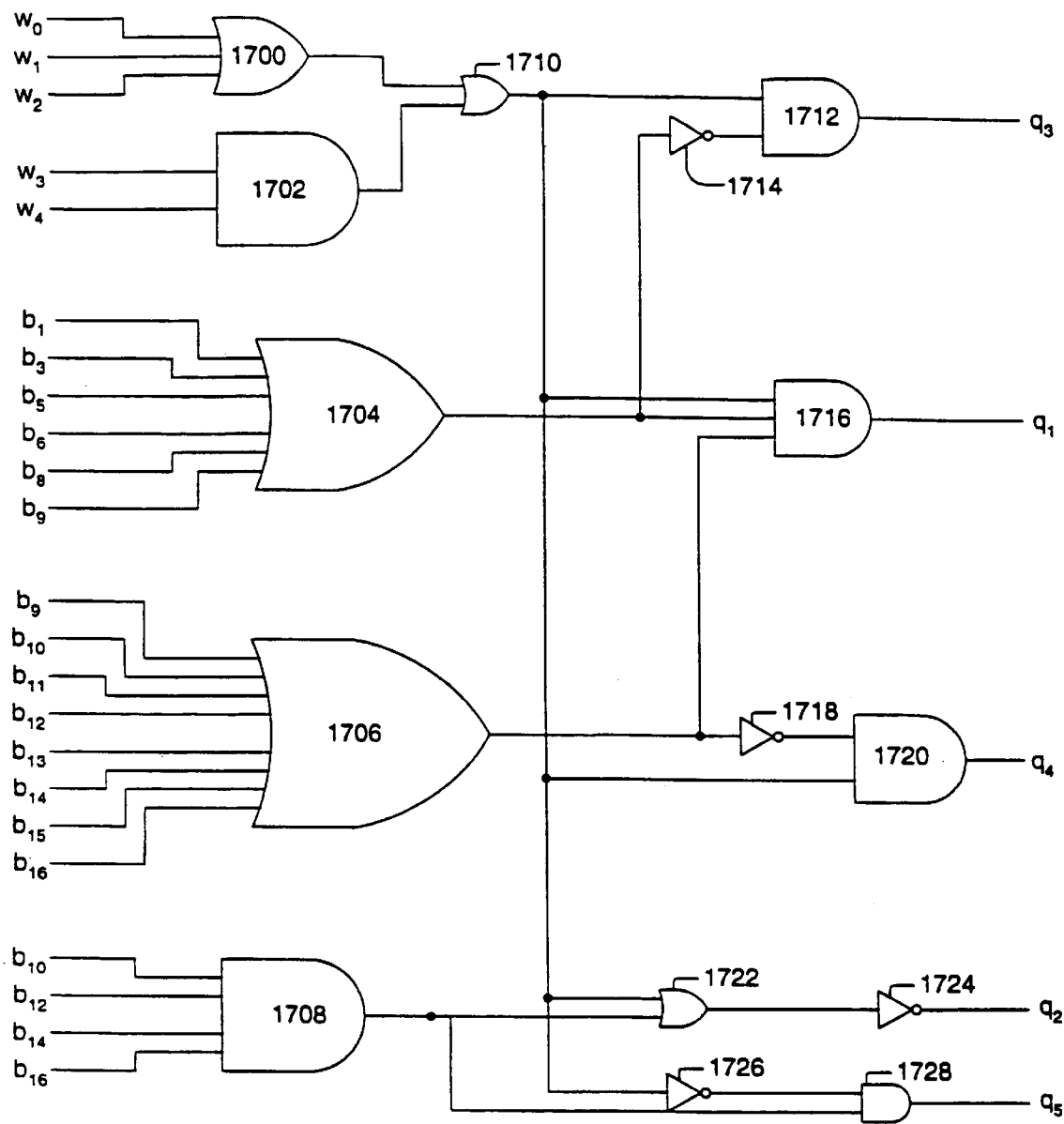
FIG. 17 is a block diagram of a preferred embodiment for the first controller constructed according to the present invention for use in conjunction with the fourth embodiment of the code generator.

Referring now to FIG. 16, an exemplary embodiment for one of the seventeen 5-way multiplexers 1500–1516 constructed according to the present invention is shown. The output bit $v_i$ of the exemplary 5-way multiplexer 1500–1516 is equal to map$nj v_i$ for $1 \leq i \leq 18$, $i \neq 6$, and $q_i=1$ for $1 \geq j \geq 5$. The control bits $q_1$ through $q_5$ generated by the first controller 902 are ANDed with the respective inputs map$j v_i$, for each map by the AND gates 1602, 1604, 1606, 1608, 1610. The results of the AND operations are then ORed together to produce the output bits $v_i$. In other words, the outputs of each of the AND gates 1602, 1604, 1606, 1608, 1610 is coupled to an input of the OR gate 1600, and the output of the OR gate 1600 provides the output bit $v_i$. Specifically, control bit $q_1$ is ANDed with input map1$v_i$ using an AND gate 1602. The control bit $q_2$ is ANDed with input map2$v_i$ using an AND gate 1604. The control bit $q_3$ is ANDed with input map3$v_i$ using an AND gate 1606. The control bit $q_4$ is ANDed with input map4$v_i$ using an AND gate 1608. The control bit $q_5$ is ANDed with input map5$v_i$ using an AND gate 1610. Referring now to FIG. 17, the first controller 902 FIG. 9 constructed according to the present invention is shown. The first controller 902 generates five control variables, $q_1$ through $q_5$, which are based on input data $\underline{b}$ and the weight bits $[w_0 w_1 w_2 w_3 w_4]$. If the input data is in the set $Q_i$, $1 \leq i \leq 5$, then $q_i=1$, and the rest of the variables are zero. An intermediate variable $r_1$ is computed from the operation of $(w_0 \vee w_1 \vee w_2) \vee (w_3 \wedge w_4)$ by OR gate 1700, AND gate 1702 and OR gate 1710 on the weights bits $[w_0 w_1 w_2 w_3 w_4]$. The intermediate variable $r_1$ is the used to derive the control variables $q_1$ through $q_5$ as follows: The input data bits $[b_1 b_3 b_5 b_6 b_8 b_9]$ are ORed together by OR gate 1704 and the input data bits $[b_9 \ldots b_{16}]$ are ORed together by OR gate 1706. The results of these OR operations are then ANDed by AND gate 1716 with $r_1$ (the output of OR gate 1710) to form the variable $q_1$. The result of the OR operation on input data bits $[b_1 b_3 b_5 b_6 b_8 b_9]$ is inverted by inverter 1714 and the output of the inverter 1714 is coupled to the input of AND gate 1712 along with the output of OR gate 1710, $r_1$. The output of the AND gate 1712 forms the output $q_3$. The result of an OR operation on input data bits $[b_9 \ldots b_{16}]$ performed by passing these bits to OR gate 1706 is also inverted by inverter 1718 and the output of the inverter 1718 is ANDed with $r_1$ (the output of OR gate 1710) at AND gate 1720 to form $q_4$. The input data bits $[b_{10} b_{12} b_{14} b_{16}]$ are ANDed together by AND gate 1708, and the output of AND gate 1708 is ORed with $r_1$, by OR gate 1722 then inverted by inverter 1724 to form $q_2$. Finally, the input data bits $[b_{10} b_{12} b_{14} b_{16}]$ are ANDed together, then the output of AND gate 1708 is ANDed by AND gate 1728 again with inverted $r_1$ provided by inverter 1726 to form $q_5$.

Figure 18:
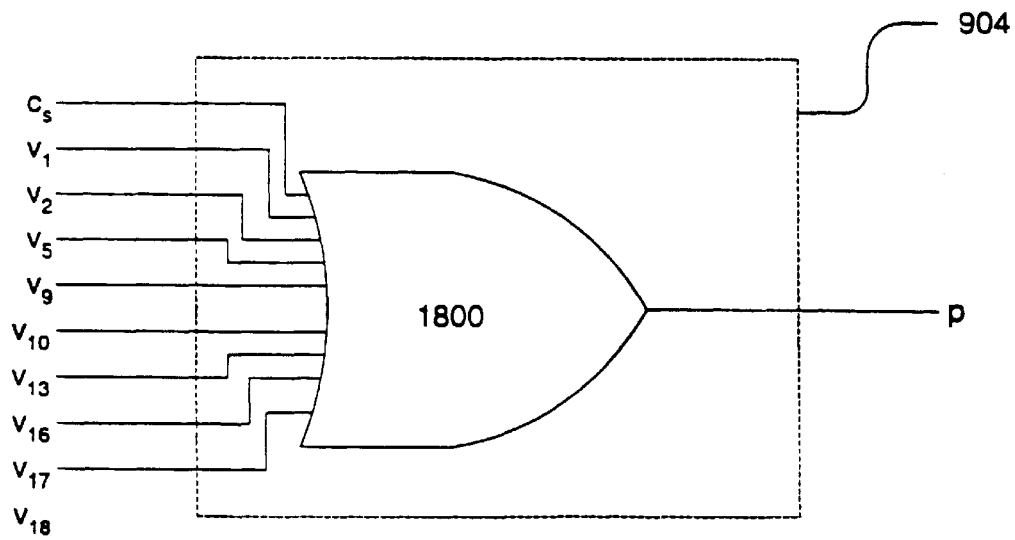
FIG. 18 is a block diagram of a preferred embodiment for the mod adder according to the present invention for use in conjunction with the fourth embodiment of the code generator shown in FIG. 9.

Referring now to FIG. 18, the details of modulo adder 31 in FIG. 9B constructed according to the present invention is shown. The modulo adder 31 is implemented as an OR operation, or a single OR gate 1800 on the current state cs and the bits $[v_1 v_2 v_5 v_9 v_{10} v_{13} v_{14} v_{17} v_{18}]$ according to equation 13. The result of the OR function, p, is used by map1 through map5 in the code generator 154d to produce the codeword $\underline{v}$.

In sum, the code generator 154d, as coupled to the precoder 14 and followed by the PR channel 16, produces the following parameters: $\tilde{N}=7$, $Z=16$, $Z_i=13$, and $\hat{E}=3$. Additionally, Code 3 generates a Hamming distance of 2 at the output of the precoder 14. Finally, no codeword $\underline{v}$ belonging to Code 3 satisfies the following three properties:

1) $v_{18}=v_{16}=v_{14}=v_{12}=v_{10}$,
2) $v_1=v_3=v_5=v_7=v_9=v_{11}$, and
3) $v_{11}=v_{12}=v_{13}=v_{14}=v_{15}=v_{16}=v_{17}=v_{18}$.

Figure 19:
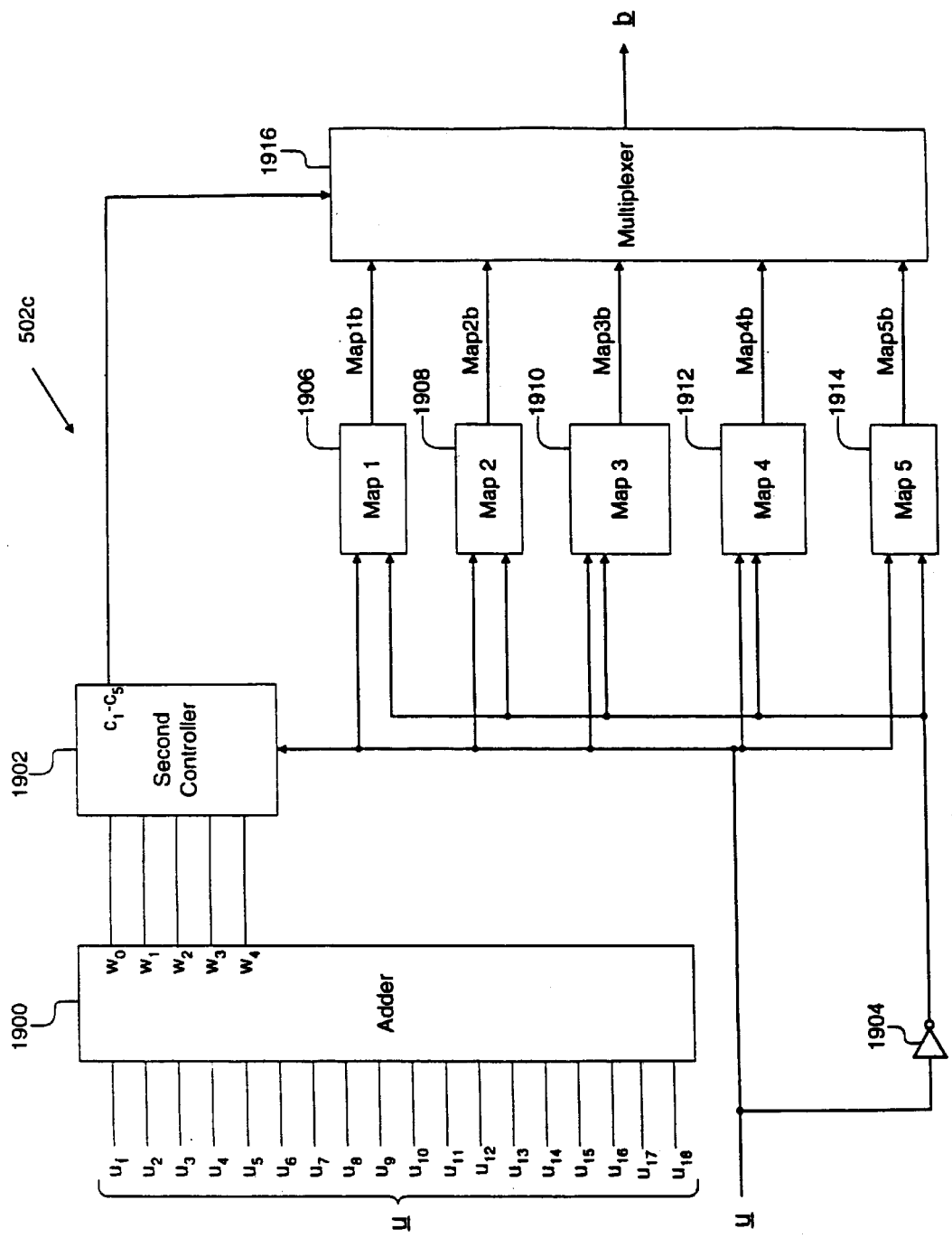
FIG. 19 is a block diagram of a third embodiment of the code de-converter constructed according to the present invention for use in conjunction with the fourth embodiment of the code generator, and for decoding "Code 3"

Referring now to FIG. 19, a third embodiment of the code de-converter 502c for use in conjunction with the fourth embodiment of the code generator 154d is shown. The third embodiment of the code de-converter 502c decodes code words that have been encoded with "Code 3." The third embodiment of the code de-converter 502c preferably comprises an adder 1900, a second controller 1902, a plurality of inverters 1904, a first mapping circuit 1906, a second mapping circuit 1908, a third mapping circuit 1910, a fourth mapping circuit 1912, a fifth mapping circuit 1914, and a multiplexer 1916. The third embodiment of the code de-converter 502c uses 5 maps. MAP1 through MAP5, which operate on distinct sets of received vectors, $C_1$ through $C_5$, respectively. The coded word $\underline{u}$ is input to the adder 1900 to produce weight bits which are in turn provided to the second controller 1902 along with the coded word $\underline{u}$. The second controller 1902 uses these inputs to determine which of the five maps to use to generate the decoded word $\underline{b}'$.

The code de-converter 502c can be characterized using the following notation: Let $\underline{u}=[u_1 \ldots u_{18}]$ denote a received vector by the decoder 20 taken form the detector sequence $\{u_1 u_2 u_3 \ldots\}$; let W=weight of $\underline{u}$=number of ones in $\underline{u}$, and let sets $B_1$ through $B_6$, and B be defined a follows:

$B_1=\{\underline{u}: u_1=1, u_{10}=0, u_{16}=1, u_{18}=1 \text{ and } W(\underline{u})<10\}$, (EQ14)

$B_2=\{\underline{u}: u_1=1, u_{10}=0, u_{16}=1, u_{17}=1, u_{18}=0 \text{ and } W(\underline{u})<10\}$, $B_3=\{\underline{u}: u_1=1, u_{10}=0, u_{16}=1, u_{17}=0, u_{18}=0 \text{ and } W(\underline{u})<8\}$, $B_4=\{\underline{u}: u_1=0, u_{10}=0, u_{16}=1, u_{18}=1 \text{ and } W(\underline{u})<9\}$, $B_5=\{\underline{u}: u_1=1, u_2=1, u_{16}=1, u_{18}=1 \text{ and } W(\underline{u})<11\}$, $B_6=\{\underline{u}: u_1=1, u_2=0, u_{10}=0, u_{16}=1, u_{18}=1 \text{ and } W(\underline{u})<9\}$, and $B=B_1 \cup B_2 \cup B_3 \cup B_4 \cup B_5 \cup B_6$.

The above sets are not all pairwise disjoint, nonetheless, the set B is the important set and sets $B_1$ through $B_6$ are utilized to characterize B.

Now sets $C_1$ through $C_5$ are given below using sets B and $B^c$. (Set $X^c$ is the complement of set X.)

$C_1=\{\underline{u} \epsilon B^c: u_{10}=1\}$, $C_2=\{\underline{u} \epsilon B^c: u_{10}=0\}$, (EQ15)

$C_3=\{\underline{u} \epsilon B: u_7=u_8\}$, $C_4=\{\underline{u} \epsilon B: u_7=0, \text{ and } u_8=1\}$, $C_5=\{\underline{u} \epsilon B: u_7=1, \text{ and } u_8=0\}$.

Maps MAP1 through MAP5 are defined in TABLE III below.

TABLE III

| Output | MAP1 | MAP2 | MAP3 | MAP4 | MAP5 |
|---|---|---|---|---|---|
| $b_1$ | $u_1$ | $\overline{u_1}$ | 0 | $\overline{u_3}$ | $u_2 \wedge u_{14}$ |
| $b_2$ | $u_2$ | $\overline{u_2}$ | $u_2 \oplus (\overline{u_5} \vee u_7 \vee u_8)$ | $\overline{u_4}$ | $u_2 \wedge u_{15}$ |
| $b_3$ | $u_3$ | $\overline{u_3}$ | 0 | $\overline{u_5}$ | $u_4 \wedge u_{14}$ |
| $b_4$ | $u_4$ | $\overline{u_4}$ | $u_3 \oplus (\overline{u_5} \vee u_7 \vee u_8)$ | $\overline{u_9}$ | $u_4 \wedge u_{15}$ |
| $b_5$ | $u_5$ | $\overline{u_5}$ | 0 | $\overline{u_{11}}$ | $u_5 \wedge u_{14}$ |
| $b_6$ | $u_7$ | $\overline{u_7}$ | 0 | $\overline{u_{12}}$ | $u_5 \wedge u_{15}$ |
| $b_7$ | $u_8$ | $\overline{u_8}$ | $u_4 \oplus (\overline{u_5} \vee u_7 \vee u_8)$ | $\overline{u_{13}}$ | $u_9 \wedge u_{14}$ |
| $b_8$ | $u_9$ | $\overline{u_9}$ | 0 | $\overline{u_{14}}$ | $u_9 \wedge u_{15}$ |

TABLE III-continued

| Output | MAP1 | MAP2 | MAP3 | MAP4 | MAP5 |
|---|---|---|---|---|---|
| $b_9$ | $u_{11}$ | $\overline{u_{11}}$ | 0 | 0 | $u_{11} \wedge u_{14}$ |
| $b_{10}$ | $u_{12}$ | $\overline{u_{12}}$ | $u_9 \oplus (\overline{u_5} \vee u_7 \vee u_8)$ | 0 | 1 |
| $b_{11}$ | $u_{13}$ | $\overline{u_{13}}$ | $\overline{u_{11}}$ | 0 | $u_{11} \wedge u_{15}$ |
| $b_{12}$ | $u_{14}$ | $\overline{u_{14}}$ | $\overline{u_{12}}$ | 0 | 1 |
| $b_{13}$ | $u_{15}$ | $\overline{u_{15}}$ | $\overline{u_{13}}$ | 0 | $u_{12} \wedge u_{14}$ |
| $b_{14}$ | $u_{16}$ | $\overline{u_{16}}$ | $\overline{u_{14}}$ | 0 | 1 |
| $b_{15}$ | $u_{17}$ | $\overline{u_{17}}$ | $\overline{u_{15}}$ | 0 | $u_{12} \wedge u_{15}$ |
| $b_{16}$ | $u_{18}$ | $\overline{u_{18}}$ | $\overline{u_{17}}$ | 0 | 1 |

As shown in FIG. 19, the adder 1900 computes the weight W of $\underline{u}$, and it generates the weight bits $[W_0 W_1 W_2 W_3 W_4]$. The weight bits $[W_0 W_1 W_2 W_3 W_4]$ are input to the second controller 1902. The second controller 1902 generates five control variables, $c_1$ through $c_5$, which are based on the received vector $\underline{u}$ and the weight bits $[W_0 W_1 W_2 W_3 W_4]$. Only one of the five control variables is a logical one at a time, and the rest are logical zeros. In other words, if the received vector $\underline{u}$ is in set $C_i, 1 \leq i \leq 5$, then $c_i=1$, and the rest of the variables are zero. The output of the second controller 1902, providing the signals $c_1$ through $c_5$, is coupled to the control inputs of the multiplexer 1916. The multiplexer 1916 selects one of its inputs $\underline{Map1b}$ through $\underline{Map5b}$ to produces $\underline{b}$. The selection is based on the control variables $c_1$ through $c_5$. If $c_i=1, 1 \leq i \leq 5$, then the multiplexer 1916 generates $\underline{b}=\underline{Mapib}$.

The first mapping circuit 1906, the second mapping circuit 1908, the third mapping circuit 1910, the fourth mapping circuit 1912, and the fifth mapping circuit 1914, respectively implement the functions described in maps Map1 through Map5 based on the received vector $\underline{u}$ and its complement $\overline{u}$. Each of the mapping circuits 1906, 1908, 1910, 1912, 1914 has an input coupled to receive coded word $\underline{u}$, and the inverse of coded word $\underline{u}$ from the inverter 1904. Each of the mapping circuits 1906, 1908, 1910, 1912, 1914 is described below with reference to FIGS. 20–24.

Figure 20:
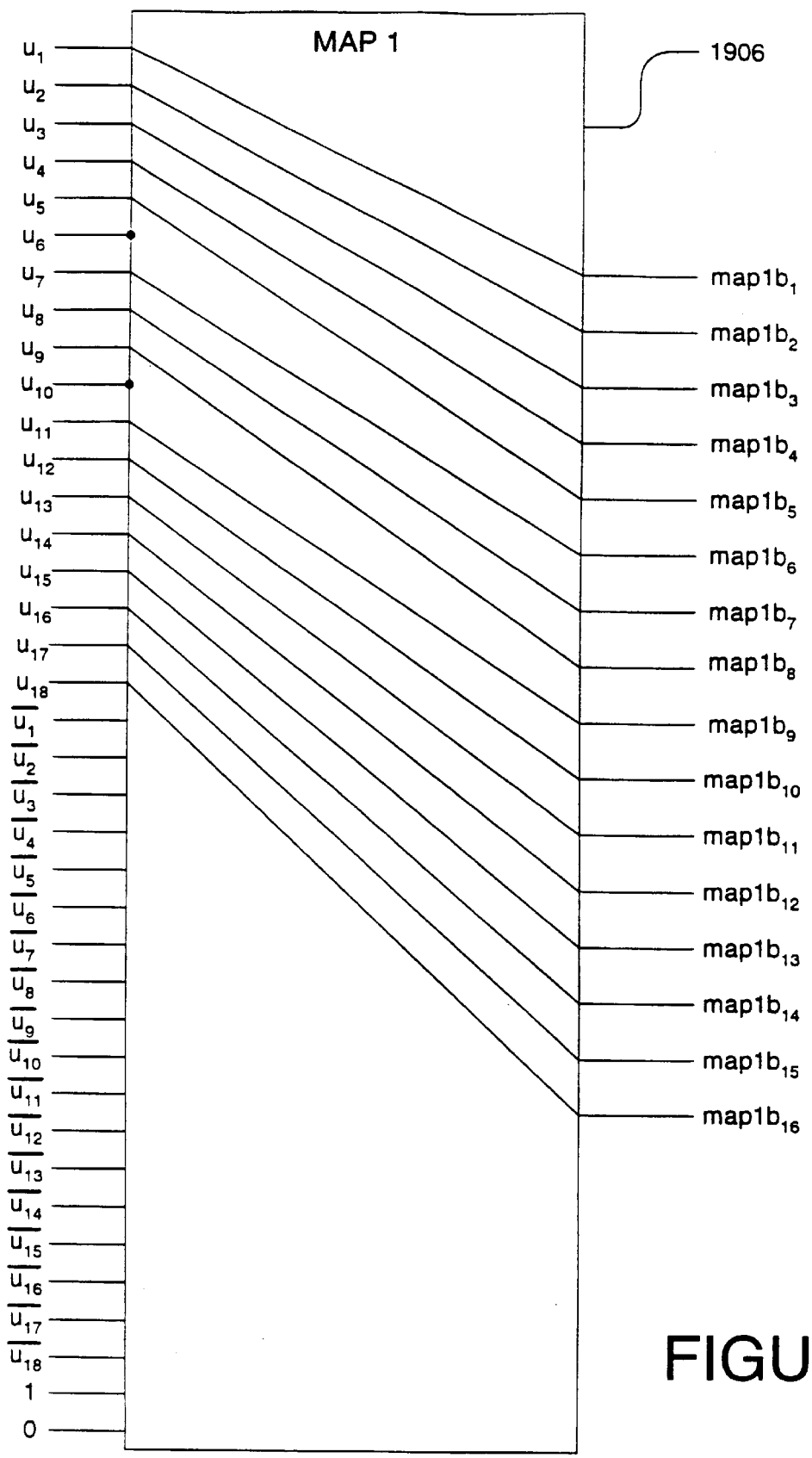
FIGS. 20–24 are block diagrams illustrating the first, second, third, fourth, and fifth mapping circuits of third embodiment of the code de-converter for mapping functions of MAP1 through MAP5 and forming part of the third embodiment of the code de-converter shown in FIG. 19.

Referring now to FIG. 20, a preferred embodiment for the first mapping circuit 1906 is shown. The first mapping circuit 1906 maps column 2 of TABLE III to column 1 of TABLE III. The received vector $\underline{u}$ is mapped directly to $\underline{Map1b}$, except for bits $u_6$ and $u_{10}$ which are discarded as shown in FIG. 20. Accordingly, MAP1 (i.e., column 2 in TABLE III) maps the eighteen bit received vector $\underline{u}$ into the sixteen bit vector $\underline{Map1b}$. More specifically bits $u_1, u_2, u_3, u_4, u_5, u_7, u_8, u_9, u_{10}, u_{11}, u_{12}, u_{13}, u_{14}, u_{15}, u_{16}, u_{17}$, and $u_{18}$, are mapped to bits $map1b_1, map1b_2, map1b_3, map1b_4, map1b_5, map1b_6, map1b_7, map1b_8, map1b_9, map1b_{10}, map1b_{11}, map1b_{12}, map1b_{13}, map1b_{14}, map1b_{15}$, and $map1b_{16}$, respectively. This can be done through simple hard wiring of the inputs to the outputs as shown in FIG. 20.

Figure 21:
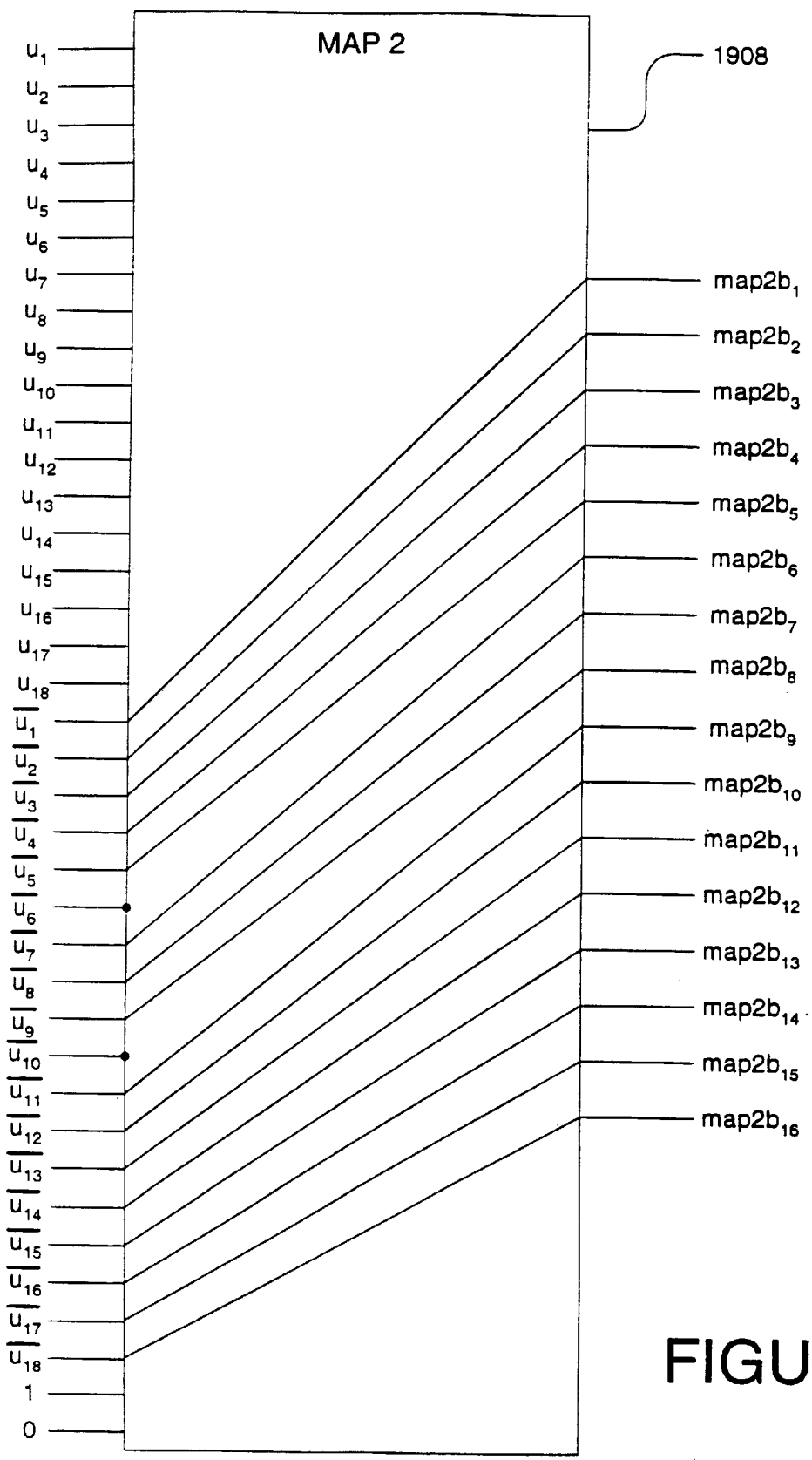

Referring now to FIG. 21, a preferred embodiment for the second mapping circuit 1908 is shown. The second mapping circuit 1908 maps column 3 of TABLE III to column 1 of TABLE III. The selected bits of the complement of the received vector $\overline{u}$ are mapped directly to $\underline{Map2b}$, except for bits $\overline{u_6}$ and $\overline{u_{10}}$ which are discarded as shown in FIG. 21. More specifically bits $\overline{u_1}, \overline{u_2}, \overline{u_3}, \overline{u_4}, \overline{u_5}, \overline{u_7}, \overline{u_8}, \overline{u_9}, \overline{u_{11}}, \overline{u_{12}}, \overline{u_{13}}, \overline{u_{14}}, \overline{u_{15}}, \overline{u_{16}}, \overline{u_{17}}, \overline{u_{18}}$, are mapped to bits $map1b_1, map1b_2, map1b_3, map1b_4, map1b_5, map1b_6, map1b_7, map1b_8, map1b_9, map1b_{10}, map1b_{11}, map1b_{12}, map1b_{13}, map1b_{14}, map1b_{15}, map1b_{16}$, respectively. Accordingly, MAP2 (column 3 in TABLE III) maps the eighteen bit complement of the received vector $\overline{u}$ into the sixteen bit output Map2b. The second mapping circuit 1908 can also be implemented through simple hard wiring of the inputs to the outputs as shown in FIG. 21.

Figure 22:
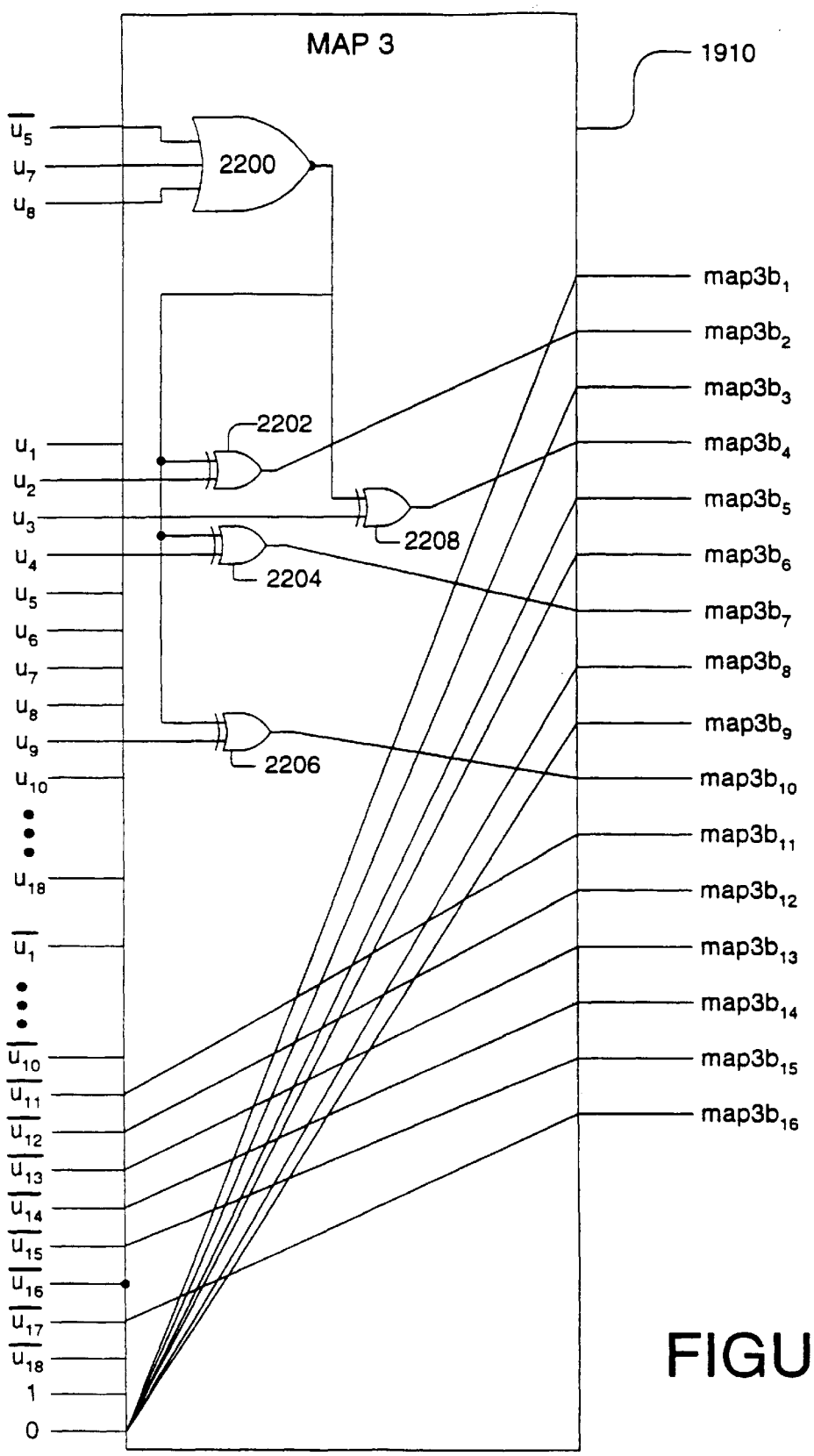

Referring now to FIG. 22, a preferred embodiment for the third mapping circuit 1910 is shown. The third mapping circuit 1910 maps 4 of TABLE III to column 1 of TABLE III. The third mapping circuit 1910 preferably comprises an OR gate 2200, and a plurality of Exclusive-OR gates 2202, 2204, 2206 and 2208. The OR gate 2200 has three inputs coupled to receive bits $[\overline{u_5}u_7u_8]$ to produce an intermediate variable s. The intermediate variable s from the output of the OR gate 2200 is input to one input of each Exclusive-OR gate 2202, 2204, 2206 and 2208. The other of each Exclusive-OR gate 2202, 2204, 2206 and 2208 is respectively coupled to receive bits $[u_2u_3u_4u_9]$. The outputs of the Exclusive-OR gates 2202, 2204, 2206 and 2208 are then mapped to bits $[map3b_2 map3b_4 map3b_7 map3b_{10}]$, respectively. A binary 0 is mapped to bits $[map3b_1 map3b_3 map3b_5 map3b_6 map3b_8 map3b_9]$, and is implemented through hard wiring. The bits $[\overline{u_{11}u_{12}u_{13}u_{14}u_{15}u_{17}}]$ are mapped to the bits $[map3b_{11} \ldots map3b_{16}]$, respectively, similarly by hardwiring.

Figure 23:
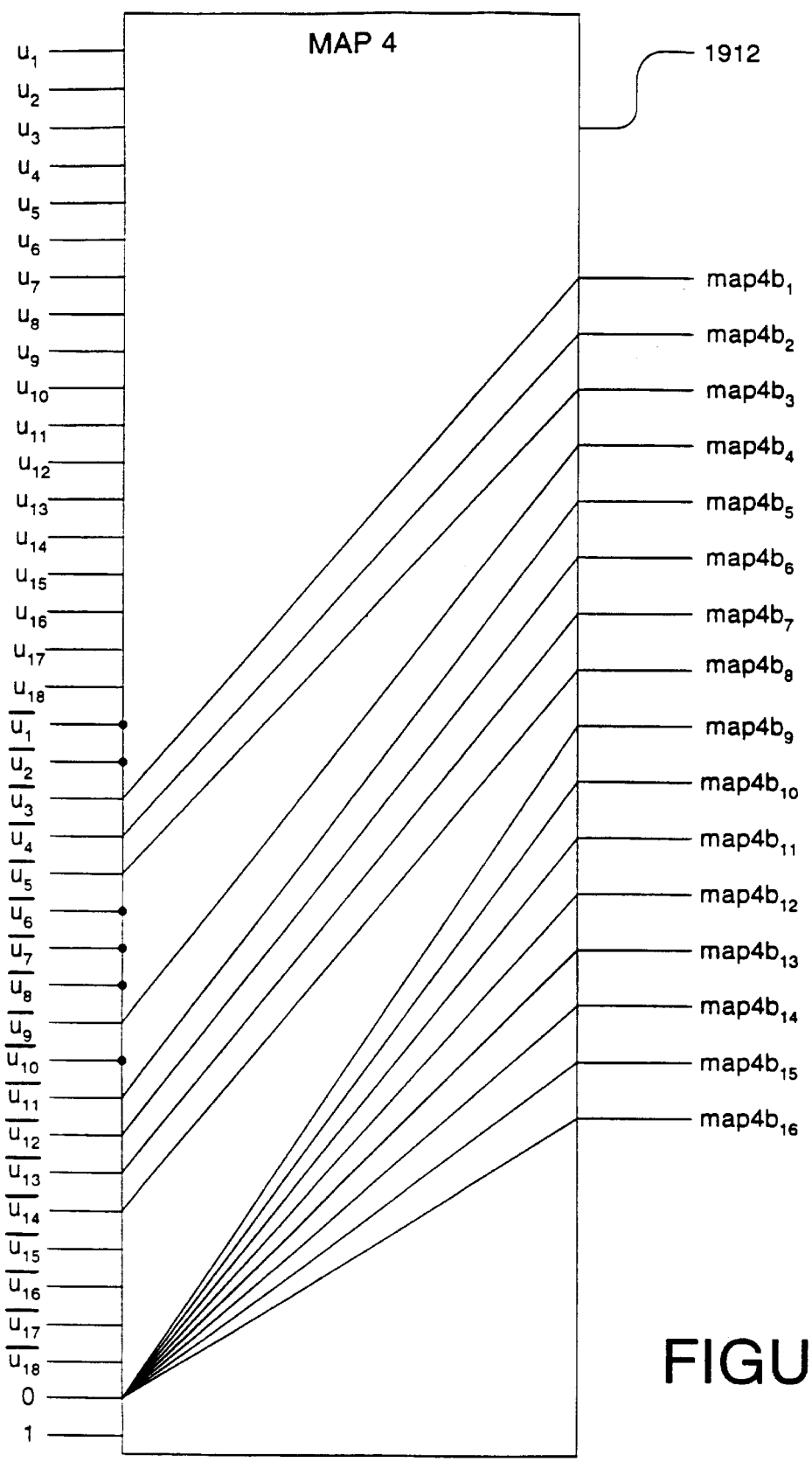

Referring now to FIG. 23, a preferred embodiment for the fourth mapping circuit 1912 is shown. The fourth mapping circuit 1912 maps column 5 of TABLE III to column 1 of TABLE III. A binary 0 is mapped to bits $[map4b_9 \ldots map4b_{16}]$. The bits $[\overline{u_3u_4u_5u_9u_{11}u_{12}u_{13}u_{14}}]$ are mapped to bits $[map4b_1 \ldots map4b_8]$, respectively. The bits $[\overline{u_1u_2u_6u_7u_8u_{10}}]$ are discarded as shown in FIG. 23.

Figure 24:
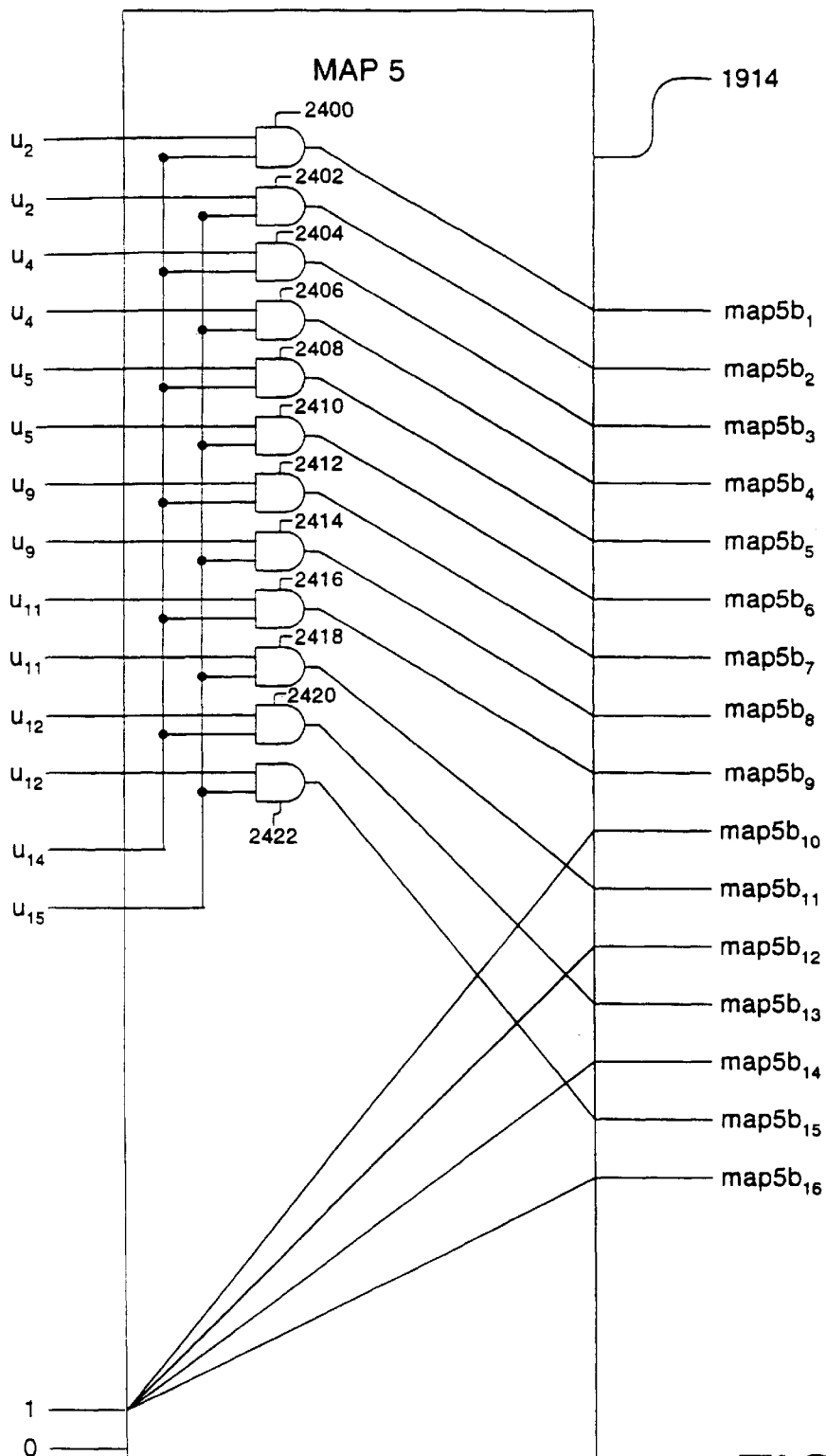

Referring now to FIG. 24, a preferred embodiment for the fifth mapping circuit 1912 is shown. The fifth mapping circuit 1912 maps 6 of TABLE III to column 1 of TABLE III. The fifth mapping circuit 1912 preferably comprises a plurality of two input AND gates 2400, 2402, 2404, 2406, 2408, 2410, 2412, 2414, 2416, 2418, 2420 and 2422. A binary 1 is mapped to the bits $[map5b_{10} map5b_{12} map5b_{14} map5b_{16}]$. The bit $u_2$ is ANDed with $u_{14}$ by AND gate 2400 and the output of the AND gate 2400 is coupled to output $map5b_1$ for the desired mapping. Similarly, the bit $u_2$ is ANDed with $u_{15}$ by the AND gate 2402 and the output of the AND gate 2402 is coupled to output $map5b_2$. The bits $[u_4u_5u_9u_{11}u_{12}]$ are likewise ANDed individually by AND gates 2404, 2406, 2408, 2410, 2412, 2414, 2416, 2418, 2420 and 2422 with both $u_{14}$ and $u_{15}$, then mapped to the bits $[map5b_3 \ldots map5b_9 map5b_{11} map5b_{13} map5b_{18}]$ as shown in FIG. 24.

Figure 25A:
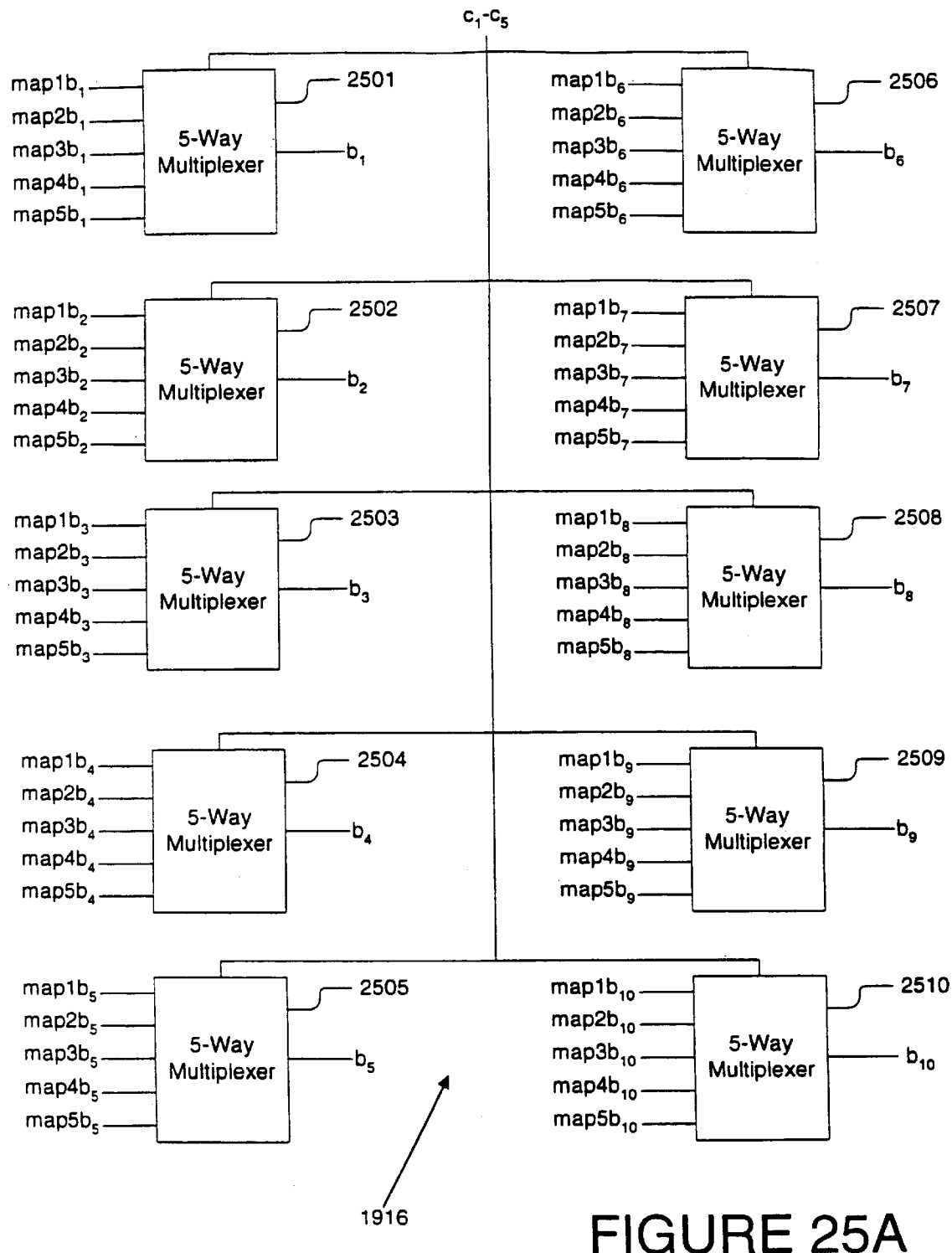
FIGS. 25A and 25B are a block diagram of a multiplexer constructed in accordance with the present invention for use in conjunction with the third embodiment of the code de-converter.
Figure 25B:
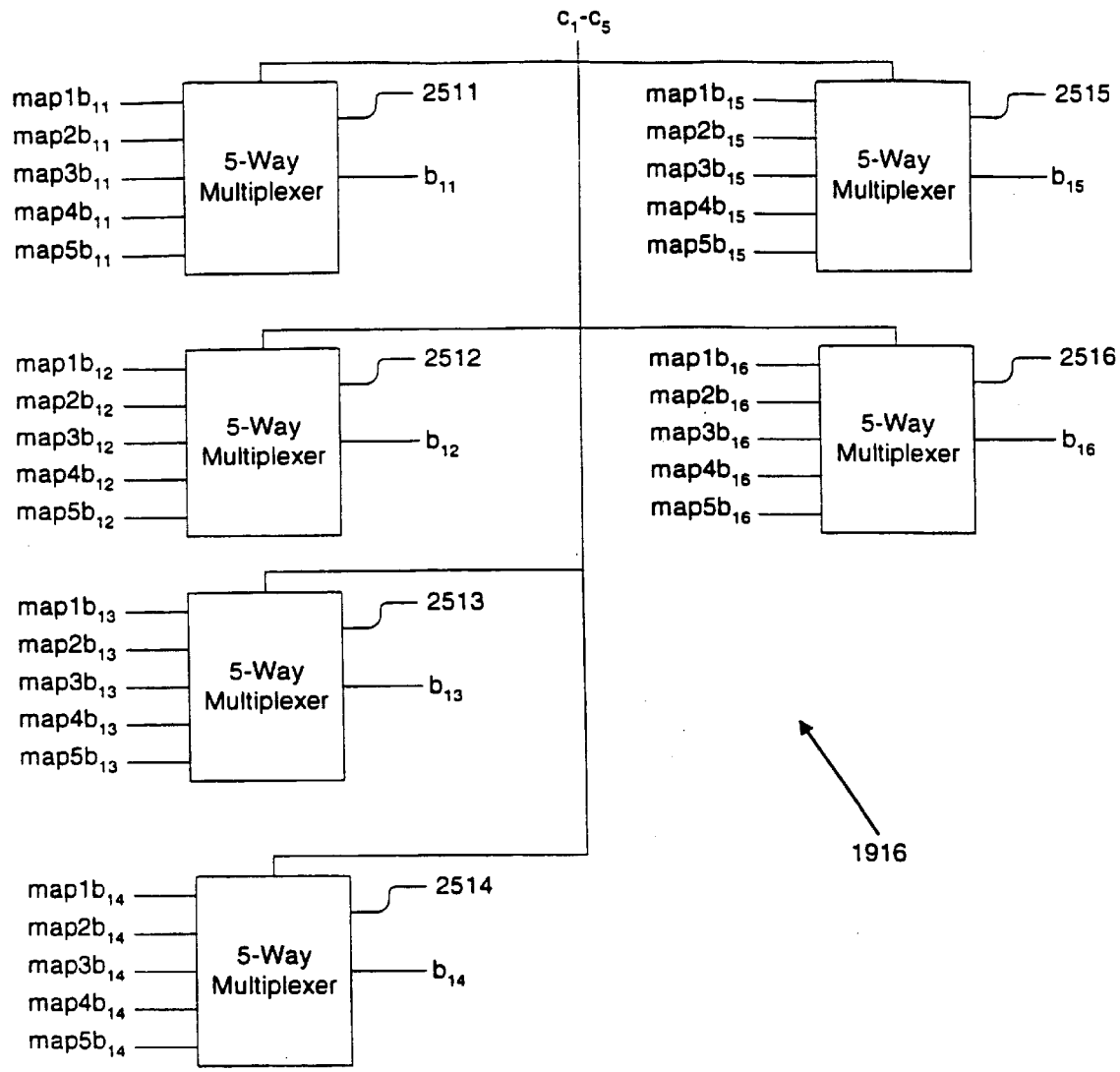

Referring now to FIGS. 25A and 25B, the multiplexer 1916 of FIG. 19 constructed according to the present invention is shown. The multiplexer 1916 preferably comprises sixteen 5-way multiplexers 2501–2516 each producing a single output bit $b_j$, which collectively form the reconstructed input data $\underline{b}$. Each of the 5-way multiplexers 2501–2516 has five data inputs, and each input is coupled to a respective bit from each of the five mapping circuits 1906, 1908, 1910, 1912 and 1914. Each of the 5-way multiplexers 2501–2516 are responsive to the control variables, $c_1$ through $c_5$, generated by the second controller 1902. For example, when $c_1=1$, then the output of MAP1 is steered to the output $b_1$ of the 5-way multiplexers 2501–2516. Thus, when the $c_n$ control variable is asserted, the nth map is output by the multiplexer 1916.

Figure 26:
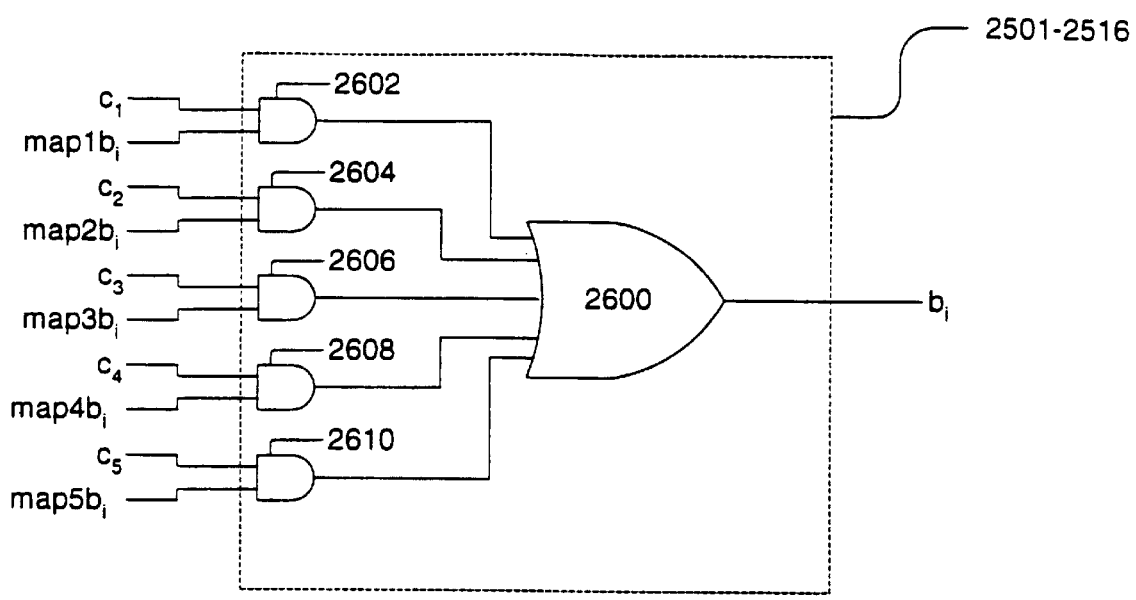
FIG. 26 is a block diagram of one of the sixteen 5-way multiplexers forming part of the multiplexer of FIG. 25 constructed in accordance with the present invention for use in conjunction with the third embodiment of the code de-converter.

Referring now to FIG. 26, the details of an exemplary one of the sixteen 5-way multiplexers 2501–2516 in FIGS. 25A and 25B are shown. The output $b_i$ of the 5-way multiplexer 2501–2516 is MAPj$b_i$ for $1 \leq i \leq 16$, and $c_j=1$ for $1 \leq j \leq 5$. The exemplary 5-way multiplexer 2501–2516 comprises and OR gate 2600 and an plurality of AND gates 2602, 2604, 2606, 2608 and 2610. The AND gates 2602, 2604, 2606, 2608 and 2610 have one input coupled to control variables $c_1$ through $c_5$, respectively. The other input of the AND gates 2602, 2604, 2606, 2608 and 2610 is coupled to receive the output bit of maps 1 through 5, respectively. The outputs of each AND gate 2602, 2604, 2606, 2608 and 2610 are coupled to an input of the OR gate 2600 and the output of the OR gate 2600 provide the output of the multiplexer 2501–2516. Thus, the control variables $c_1$ through $c_5$ are ANDed with the inputs MAPj$b_i$, and the results of the AND operations are then ORed together to produce the output $b_i$.

Figure 27:
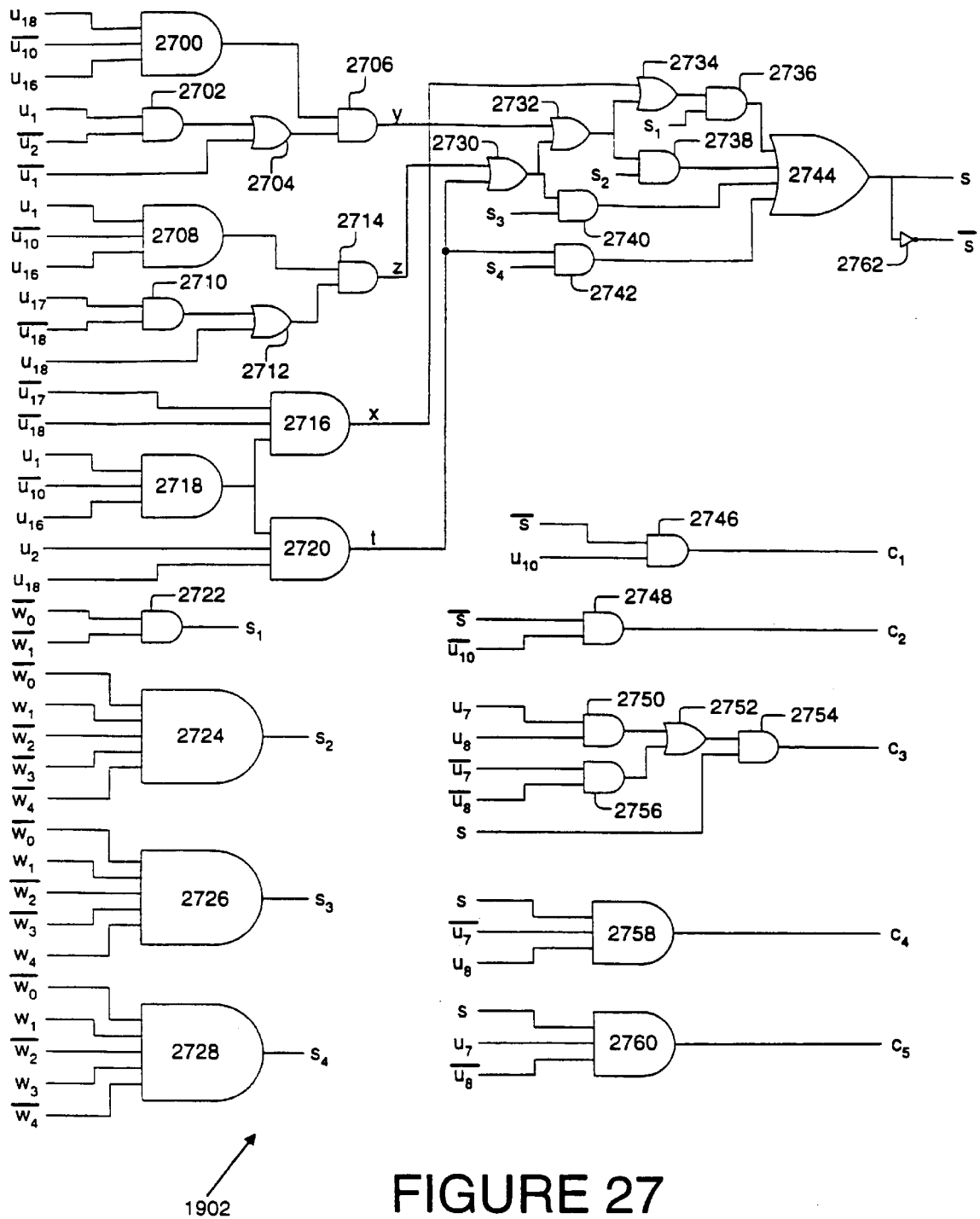
FIG. 27 is a block diagram of a second controller constructed according to the present invention for use in conjunction with the third embodiment of the code de-converter shown in FIG. 19.

Referring now to FIG. 27, the second controller 1902 of FIG. 19 is shown. The second controller 1902 preferably comprises a plurality of OR gates 2704, 2712, 2732, 2734, 2744 and 2752. AND gates 2702, 2706, 2708, 2710, 2714, 2716, 2718, 2720, 2722, 2724, 2726, 2728, 2730, 2736, 2738, 2740, 2742, 2746, 2748, 2750, 2754, 2756, 2758 and 2760, and an inverter 2762 for generating nine intermediate variables and five control variables or signals ($c_1$ through $c_5$). The intermediate variables x,y,z,t,s,$s_1$, $s_2$,$s_3$,$s_4$, and the control variables are $c_1$ through $c_5$.

As shown in FIG. 27, the intermediate variables x,y,z,t, s,$s_1$,$s_2$,$s_3$,$s_4$ are formed using combinational logic devices. The intermediate variable y is formed by performing the logical operation $(u_{18} \wedge \overline{u_{10}} \wedge u_{16}) \wedge ((u_1 \wedge \overline{u_2}) \vee \overline{u_1}))$ using AND gates 2700, 2702, 2706 and OR gate 2704. The variable Z is formed by performing the Boolean operation $(u_1 \wedge \overline{u_{10}} \wedge u_{16}) \wedge ((u_{17} \wedge \overline{u_{18}}) \wedge u_{18}))$ using AND gates 2708, 2710, 2714 and OR gate 2712. The variable x is formed by performing the logical operation $\overline{u_{17}} \wedge \overline{u_{18}} \wedge u_1 \wedge \overline{u_{10}} \wedge u_{16}$ using AND gates 2716 and 2718. The variable t is formed by performing the logical operation $u_2 \wedge u_{18} \wedge u_1 \wedge \overline{u_{10}} \wedge u_{16}$ using AND gates 27120 and 2718.

The intermediate variable s through $s_4$ are formed from the weight bits $[W_0 W_1 W_2 W_3 W_4]$ and their complement $[\overline{W_0} \overline{W_1} \overline{W_2} \overline{W_3} \overline{W_4}]$. The variable $s_1$ is formed by ANDing the weight bits $\overline{W_0}$ and $\overline{W_1}$ using AND gate 2722. The variable $S_2$ is formed by ANDing the weights bits $[\overline{W_0} W_1 \overline{W_2} \overline{W_3} \overline{W_4}]$ using AND gate 2724. The variable $s_3$ is formed by ANDing the weight bits $[\overline{W_0} W_1 \overline{W_2} W_3 W_4]$ using AND gate 2726, and finally, The variable $s_4$ is formed by ANDing $[\overline{W_0} W_1 \overline{W_2} W_3 \overline{W_4}]$ using AND gate 2728. Finally, the variable s is formed using the variables x, y, z, t, $s_1$, $s_2$, $s_3$, and $s_4$. The OR gates 2730, 2732, 2744 and AND gates 2732, 2734, 2736, 2738, 2740 and 2742 perform the logical operation $((([t] \vee Z) \wedge S_3) \vee (t \wedge S_4)) \vee ((([t] \vee Z) \vee y) \wedge S_2) \vee ((([t] \vee Z) \vee Y) \vee X) \wedge S_1)$ using the applied variables x,y,z,t,$s_1$,$s_2$, $s_3$, and $s_4$. The output of OR gate 2744 provides the s signal, it is complemented by inverter 2762. Both these signals are used to generate the control signals $c_1$ through $c_5$ output by the second controller 1902.

Furthermore, as shown in FIG. 27, the control variables $c_1$ through $c_5$ are also formed using combination logic devices. The control variable $c_1$ is formed by ANDing $\overline{s}$ and $u_{10}$ using AND gate 2746. Control variable $c_2$ is similarly formed by ANDing $\overline{s}$ and $\overline{u_{10}}$ using AND gate 2748. Control variable $c_3$ is formed by ANDing $u_7$ and $u_8$ and ANDing $\overline{u_7}$ and $\overline{u_8}$ using AND gate 2750 and 2756, respectively. The results of these AND operations are then ORed by OR gate 2752, and the output of OR gate 2752 is ANDed with s by AND gate 2754 to produce $c_3$. Control variable $c_4$ is formed by ANDing s, $\overline{u_7}$, and $u_8$ using AND gate 2758. Finally, control variable $c_5$ is formed by ANDing $s_0$, $u_7$, and $\overline{u_8}$ AND gate 2760. All of the operations defined above are implemented using combinational logic techinques well-known in the art.

The sets $C_1$ through $C_5$ form a partition of $\{0,1\}^{18}$ and the third embodiment of the code de-converter 502c uses a distinct MAP1 through MAP5 to decode the received vectors $\underline{u}$ of each of the sets $C_1$ through $C_5$. The bits $[u_7 u_8 u_{10}]$ are employed to characterize $C_1$ through $C_5$. Therefore, if errors occur in the bits $[u_7 u_8 u_{10}]$, it is possible that the code de-converter 502c could select the incorrect map to decode the received vector $\underline{u}$. In fact, usually more data bits are corrupted this way than due to errors occurring elsewhere. Accordingly, the bits $[u_7 u_8 u_{10}]$ are situated by design to locations inside the received vector $\underline{u}$ where they would be less susceptible to typical noise (e.g., the 8th and 10th bit positions of each received vector $\underline{u}$)

CODE 4

Figure 28:
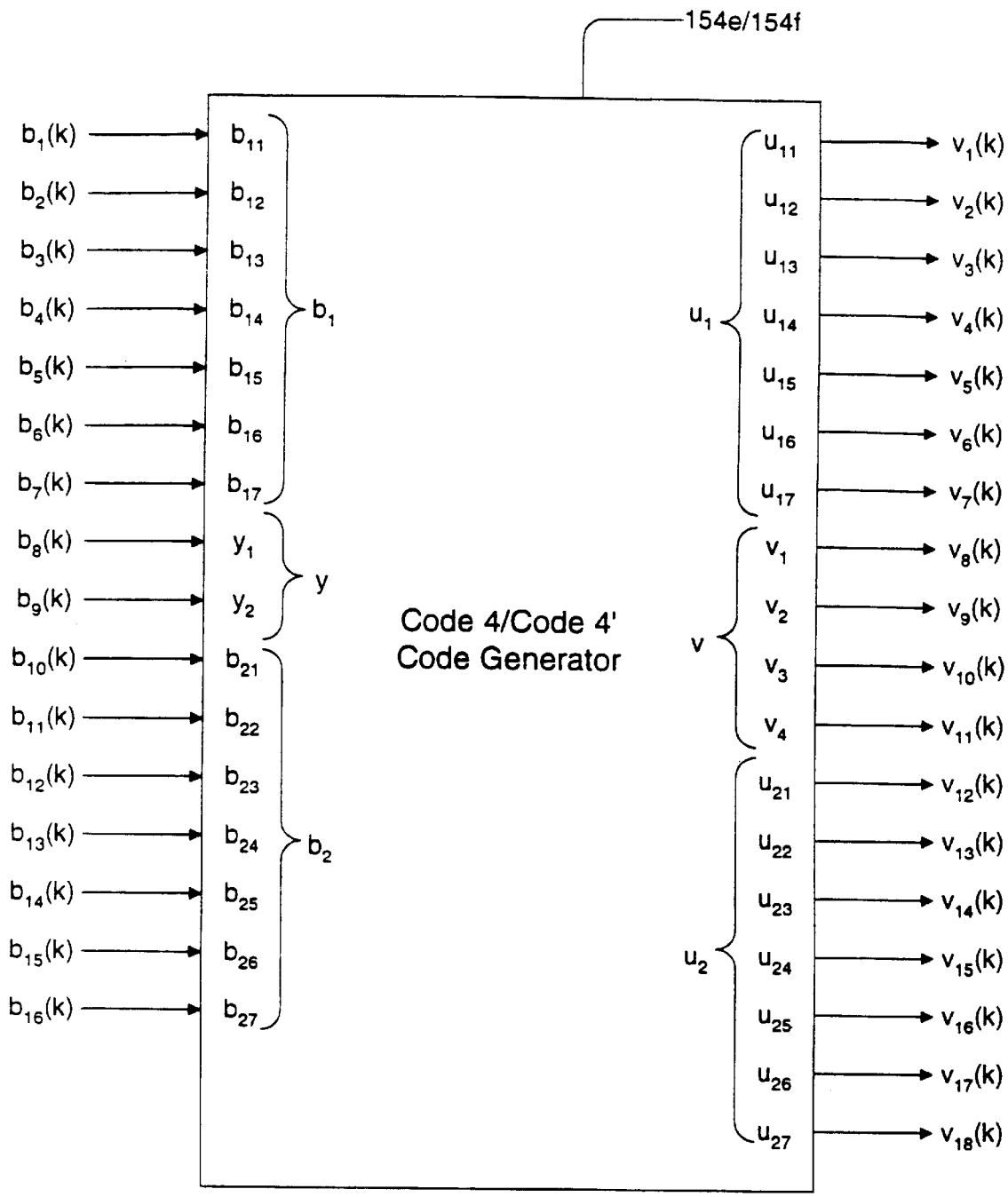
FIGS. 28 and 29 show a fifth embodiment of the code generator constructed according to the present invention to generate a fourth code, "Code 4"
Figure 29:
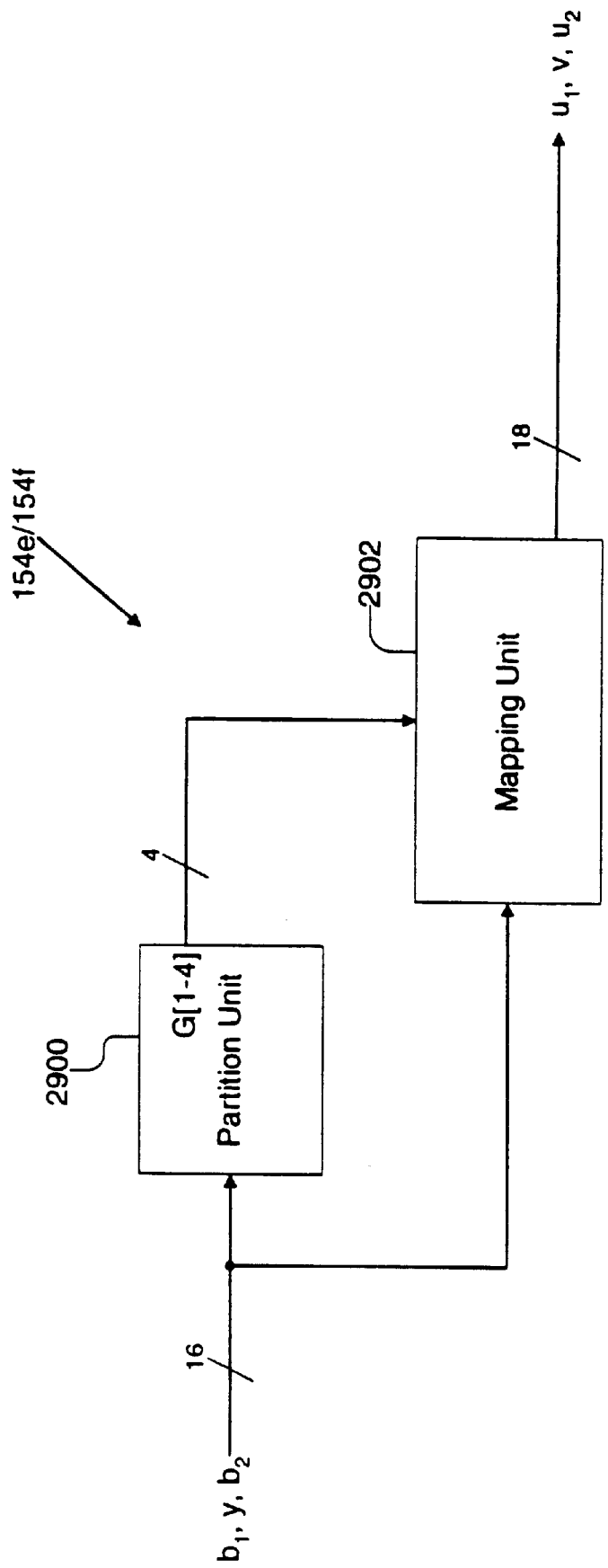

Referring now to FIG. 28, a fifth embodiment of the code generator 154e constructed according to the present invention for encoding signals with a fourth code, "Code 4," is shown. The fifth embodiment of a code generator 154e provides a fourth code, "Code 4," that is a rate 16/18 run length limited code with the additional property that after precoding for the $(1-D^2)$ channel the code words have 0 mod 2 number of ones. As best illustrated by FIG. 28, the fifth embodiment of the code generator 154e receives a 16-bit word, $b_1(k) \ldots b_{16}(k)$ which is defined to be variable $B=(b_1, y, b_2)$ where $b_1=b_{11}, \ldots, b_{17}$; $b_2=b_{21}, \ldots, b_{27}$ and $y=y_1, y_2$; and outputs a 18-bit word, $v_1(k) \ldots v_{18}(k)$, defined to be variable $U=(u_1, v, u_2)$ where $u_1=u_{11}, \ldots, u_{17}$; $u_2=u_{21}, \ldots, u_{27}$ and $v=v_1, v_2, v_3, v_4$. Referring now to FIG. 29, the fifth embodiment of the code generator 154e is shown in more detail. The fifth embodiment of the code generator 154e preferably comprises a partitioning unit 2900 and a mapping unit 2902. The partitioning unit 2900 is preferably coupled to receive the 16 bits of the input word, $(b_1, y, b_2)$, and generate a signal, preferably a four bit signal, that indicates which map the mapping unit 2902 is to use in generating the output word. The partitioning unit 2900 receives the input data bits, $(b_1, y, b_2)$ of the encoder 12. The number of ones in the input data bits are used to partition the data word and select a encoding map using the following equations:

Auxiliary Sets: partitioning $(b_1, b_2)$

R1={$(b_1, b_2)$; $n_1>1$ AND $n_2 22$ 1 AND $n_1+n_2>5$)}

R2={$(b_1, b_2)$; $n_1=3$ AND $n_2=3$}

R3={$(b_1, b_2)$; $n_1=2$ AND $n_2=3$}

R4={$(b_1, b_2)$; $n_1>2$ AND $n_2 21$ 2}

R5={$(b_1, b_2)$; $n_1<2$ AND $n_2>2$}

R6={$(b_1, b_2)$; $n_1<3$ AND $n_2<3$}

Partition of data words: $(b_1, y, b_2)$

G1=R1

G2=R2

G3=R3

G4=R4∩$y_1$=0

G5=R4∩$y_1$=1

G6=R5∩$y_2$=0

G7=R5∩$y_2$=1

G8=R6

G9=G1∩($b_{11},b_{13},b_{15},b_{17}=\underline{0}$ and $y_1=y_2=1$)

G10=G1∩($b_{12},b_{14},b_{16}=\underline{0}$ and $y_1=y_2=0$)

G11=G1∩($b_{21},b_{23},b_{25},b_{27}=\underline{0}$ and $y_1=y_2=0$)

G12=G1∩($b_{22},b_{24},b_{26},b_{17}=\underline{0}$ and $y_1=y_2=1$)

G1'=G1−G9∪G10∪G11∪G12

$G_1 \cup G_2 \cup G_3 \cup G_4 \cup G_5 \cup G_6 \cup G_7 \cup G_8 = \{0,1\}^{16}$ where $n_1$ is defined to be the number of ones in $b_1$; $n_2$ is defined to be the number of ones in $b_2$; and G1 through G12 correspond to a row of the encoding map for Code 4, as will be described below with reference to TABLE IV. Since exemplary partitioning units have been described above for Codes 1–3, the specific implementation in combinational logic, registers and multiplexers will not be described here. However, those skilled in the art would be able to construct the pertaining unit 2900 from the above equations and the above disclosure for Codes 1–3.

As shown in FIG. 29, the mapping unit 2902 receives the inputs bits $(b_1, y, b_2)$, and the output of the partitioning unit 2900, variable G. The mapping unit 2902 uses the map shown in TABLE IV to determine its output. The mapping unit 2902 generates eighteen output bits, $(u_1, v, u_2)$. The value of the variable G from the partitioning unit 2900 identifies which row of TABLE IV that will be used to generate the output bits $(u_1, v, u_2)$. For example, if the input word B is in the set G1, then the first row of TABLE IV will be used to generate the output word U.

TABLE IV

Encoder Map for Code 4

| | $u_{11}$ | $u_{12}$ | $u_{13}$ | $u_{14}$ | $u_{15}$ | $u_{16}$ | $u_{17}$ | $v_1$ | $v_2$ | $v_3$ | $v_4$ | $u_{21}$ | $u_{22}$ | $u_{23}$ | $u_{24}$ | $u_{25}$ | $u_{26}$ | $u_{27}$ | #1's |
|---|---|---|---|---|---|---|---|---|---|---|---|---|---|---|---|---|---|---|---|
| B∈G1' | $b_{11}$ | $b_{12}$ | $b_{13}$ | $b_{14}$ | $b_{15}$ | $b_{16}$ | $b_{17}$ | $d_1$ | $d_2$ | $d_3$ | $d_4$ | $b_{21}$ | $b_{22}$ | $b_{23}$ | $b_{24}$ | $b_{25}$ | $b_{26}$ | $b_{27}$ | ≧8 |
| B∈G2 | $l_{11}$ | $l_{12}$ | $l_{13}$ | $P_{11}$ | $P_{12}$ | $z_1$ | $z_2$ | 1 | 0 | 1 | 1 | $z_3$ | P | $P_{13}$ | $P_{14}$ | $r_{11}$ | $r_{12}$ | $r_{13}$ | ≧8 |
| B∈G3 | $l_{21}$ | $l_{22}$ | $l_{23}$ | $P_{21}$ | $P_{22}$ | $z_1$ | $z_2$ | 1 | 1 | 0 | 1 | $z_3$ | P | $P_{23}$ | $P_{24}$ | $r_{21}$ | $r_{22}$ | $r_{23}$ | ≧8 |
| B∈G4 | $b_{11}$ | $b_{12}$ | $b_{13}$ | $b_{14}$ | $b_{15}$ | $b_{16}$ | $b_{17}$ | 0 | 0 | 0 | 1 | 1 | $q_1$ | $q_2$ | $q_3$ | $q_4$ | $q_5$ | P | ≧8 |
| B∈G5 | $b_{11}$ | $b_{12}$ | $b_{13}$ | $b_{14}$ | $b_{15}$ | $b_{16}$ | $b_{17}$ | 0 | 1 | 0 | 0 | 1 | $q_1$ | $q_2$ | $q_3$ | $q_4$ | $q_5$ | P | ≧8 |
| B∈G6 | P | $m_1$ | $m_2$ | $m_3$ | $m_4$ | $m_5$ | 1 | 1 | 0 | 0 | 0 | $b_{21}$ | $b_{22}$ | $b_{23}$ | $b_{24}$ | $b_{25}$ | $b_{26}$ | $b_{27}$ | ≧8 |
| B∈G7 | P | $m_1$ | $m_2$ | $m_3$ | $m_4$ | $m_5$ | 1 | 0 | 0 | 1 | 0 | $b_{21}$ | $b_{22}$ | $b_{23}$ | $b_{24}$ | $b_{25}$ | $b_{26}$ | $b_{27}$ | ≧8 |
| B∈G8 | $t_1$ | $t_2$ | $t_3$ | $t_4$ | $t_5$ | $k_1$ | $k_2$ | 1 | 1 | 1 | 1 | $k_3$ | $k_4$ | $c_1$ | $c_2$ | $c_3$ | $c_4$ | $c_5$ | ≧8 |
| B∈G9 | $b_{12}$ | $b_{14}$ | $b_{16}$ | 1 | P | 0 | 0 | 1 | 0 | 1 | 1 | $b_{21}$ | $b_{22}$ | $b_{23}$ | $b_{24}$ | $b_{25}$ | $b_{26}$ | $b_{27}$ | ≧10 |
| B∈G10 | $b_{11}$ | $b_{13}$ | $b_{15}$ | $b_{17}$ | P | 0 | 0 | 1 | 1 | 0 | 1 | $b_{21}$ | $b_{22}$ | $b_{23}$ | $b_{24}$ | $b_{25}$ | $b_{26}$ | $b_{27}$ | ≧9 |
| B∈G11 | $b_{11}$ | $b_{12}$ | $b_{13}$ | $b_{14}$ | $b_{15}$ | $b_{16}$ | $b_{17}$ | 1 | 1 | 1 | 1 | $b_{17}$ | X | P | 1 | $b_{22}$ | $b_{24}$ | $b_{26}$ | ≧11 |
| B∈G12 | $b_{11}$ | $b_{12}$ | $b_{13}$ | $b_{14}$ | $b_{15}$ | 0 | $b_{16}$ | 1 | 1 | 1 | 1 | 0 | 0 | P | $b_{21}$ | $b_{23}$ | $b_{25}$ | $b_{27}$ | ≧10 |

The values in TABLE IV are generated from the input word B, and the following equations:

P is chosen such that the following equation is satisfied:

$$u_{11} \oplus u_{12} \oplus u_{15} \oplus u_{16} \oplus v_2 \oplus v_3 \oplus u_{22} \oplus u_{23} \oplus u_{26} \oplus u_{27} \oplus cs = 0$$

$$d_1, d_2, d_3, d_4 \in \begin{cases} s1 = \{1001, 0111, 1110, 0110\}, P_1 = 0 \\ s2 = \{1010, 0011, 1100, 0101\}, P_1 = 1 \end{cases}$$

where $$P_1 = u_{11} \oplus u_{12} \oplus u_{15} \oplus u_{16} \oplus u_{22} \oplus u_{23} \oplus u_{26} \oplus u_{27} \oplus cs.$$

$$k_1, k_2, k_3, k_4 \in \begin{cases} s1 = \{0110, 1011, 1101, 1001\}, P_2 = 0 \\ s2 = \{0101, 0011, 1100, 1010\}, P_2 = 1 \end{cases}$$

where $$P_2 = u_{11} \oplus u_{12} \oplus u_{15} \oplus v_2 \oplus v_3 \oplus u_{23} \oplus u_{26} \oplus u_{27} \oplus cs.$$

$k_1 = d_2, k_2 = d_1, k_3 = d_4, k_4 = d_3 z_1 = y_1 \vee \overline{y}_2, z_2 = \overline{y}_1 \vee y_2, z_3 = \overline{y}_1 \vee \overline{y}_2$ $$q_1, q_2, q_3, q_4, q_5 = \begin{cases} f_1(b_2) \text{ if } y_2 = 0 \\ f_2(b_2) \text{ if } y_2 = 1 \end{cases}$$

$$m_1, m_2, m_3, m_4, m_5 = \begin{cases} f_1(b_1) \text{ if } y_1 = 0 \\ f_2(b_1) \text{ if } y_1 = 1 \end{cases}$$

$t_1, t_2, t_3, t_4, t_5 = b(b_1)$ and $c_1, c_2, c_3, c_4, c_5 = g(b_2)$ $l_{11}, l_{12}, l_{13} = 3$-bit binary representation of $h_1(b_1)$ $r_{11}, r_{12}, r_{13} = 3$-bit binary representation of $h_2'(b_2)$ $p_{11}, p_{12}, p_{13}, p_{14} = 4$-bit binary representation of $j(h_2(b_1), h_1'(b_2))$ $l_{21}, l_{22}, l_{22} = 3$-bit binary representation of $h_2'(b_1)$ $r_{21}, r_{22}, r_{23} = 3$-bit representation of $h_1(b_2)$ $p_{21}, p_{22}, p_{23}, p_{24} = 4$-bit binary representation of $j(h_2(b_2), h_1'(b_1))$ $X = \overline{b}_{16} \vee b_{17}$ Those skilled in the art will recognize that the mapping unit 2902 may be constructed using combinational logic in conjunction with the following maps that are used to generate certain values of TABLE IV as specified in the above equations. The preferred embodiment of the mapping unit 2902 includes: f maps (TABLE V); g(D) map, a 1-to-1 map from D to non-zero 5-bit binary words (TABLE VI); map h(D3)=(h1,h2), a 1-to-1 map from D3 to Z75 (TABLE VII); map h'(D2)=($h_1'$,$h_2'$), a 1-to-1 map from D2 to Z37 (TABLE VIII); and map j($h_2$, $h_1'$), a 1-to-1 map from Z53 to I (TABLE IX), as shown below.

TABLE V fmaps

Let $f_1(b)$ and $f_2(b)$ be the following maps:

$f_1(0000000) = 11111, f_2(0000000) = 11100$
$f_1(0000001) = 11110, f_2(0000001) = 11010$

TABLE V-continued fmaps

Let $f_1(b)$ and $f_2(b)$ be the following maps:

$f_1(0000010) = 11101, f_2(0000010) = 11001$
$f_1(0000100) = 11011, f_2(0000100) = 10110$
$f_1(0001000) = 10111, f_2(0001000) = 10101$
$f_1(0010000) = 01111, f_2(0010000) = 10011$
$f_1(0100000) = 00111, f_2(0100000) = 01110$
$f_1(1000000) = 01011, f_2(1000000) = 01101$

Let D=({d;d has 7 bits at weight of d<3}, |D|=29

D3={d;d has 7 bits at weight of d=3}, |D|=35

D2={d;d has 7 bits at weight of d=2}, |D|=21

Z75={1,2,3,4,5,6,7}×{0,1,2,3,4}, |Z75|=35

Z37={0,1,2}×{1,2,3,4,5,7}, |Z37|21

Z53={0,1,2,3,4}×{0,1,2}, |Z53|=15

I={1,2,3, . . . , 14,15}, |I|=15

TABLE VI g(D) map

| D | g(D) | D | g(D) | D | g(D) |
|---|------|---|------|---|------|
| 0000000 | 11111 | 0001100 | 00101 | 0101000 | 10100 |
| 0000001 | 00011 | 0010000 | 11000 | 0110000 | 01111 |
| 0000010 | 00010 | 0010001 | 11011 | 1000000 | 01000 |
| 0000011 | 10111 | 0010010 | 11010 | 1000001 | 01011 |
| 0000100 | 00001 | 0010100 | 11001 | 1000010 | 01010 |
| 0000101 | 10101 | 0011000 | 11100 | 1000100 | 01001 |
| 0000110 | 10110 | 0100000 | 10000 | 1001000 | 01100 |
| 0001000 | 00100 | 0100001 | 10011 | 1010000 | 01101 |
| 0001001 | 00111 | 0100010 | 10010 | 1100000 | 01110 |
| 0001010 | 00110 | 0100100 | 10001 | | |

TABLE VII h map

| $h_1,h_2$ | 0 | 1 | 2 | 3 | 4 |
|---|---|---|---|---|---|
| 1 | 001 1010 | 001 0011 | 001 0101 | 001 0110 | 001 1001 |
| 2 | 010 1010 | 010 0011 | 010 0101 | 010 0110 | 010 1001 |
| 3 | 011 0001 | 011 0010 | 011 0100 | 100 1100 | 011 1000 |
| 4 | 100 1010 | 100 0011 | 100 0101 | 100 0110 | 100 1001 |
| 5 | 101 0001 | 101 0010 | 101 0100 | 010 1100 | 101 1000 |
| 6 | 110 0001 | 110 0010 | 110 0100 | 001 1100 | 110 1000 |
| 7 | 000 1110 | 000 1101 | 000 1011 | 111 0000 | 000 0111 |

TABLE VIII h' map

| $h_1'$, $h_2'$ | 1 | 2 | 3 | 4 | 5 | 6 | 7 |
|---|---|---|---|---|---|---|---|
| 0 | 0110 000 | 0000 011 | 1000 100 | 1001 000 | 0100 100 | 0010 100 | 0001 100 |
| 1 | 1100 000 | 0000 110 | 1000 001 | 0011 000 | 0100 001 | 0010 001 | 0001 001 |
| 2 | 1010 000 | 0000 101 | 1000 010 | 0101 000 | 0100 010 | 0010 010 | 0001 010 |

TABLE IX j map

| $h_2, h_1'$ | 0 | 1 | 2 |
|---|---|---|---|
| 0 | 15 | 14 | 7 |
| 1 | 13 | 12 | 5 |
| 2 | 11 | 10 | 3 |
| 3 | 9 | 8 | 1 |
| 4 | 6 | 2 | 4 |

Those skilled in the art will further recognize that the mapping unit 2902 need only provide mapping for values G1 through G8 if the maximum number of run length zeros on the odd and even subsequences can be infinite. However, the encoding provided by TABLE IV limits the maximum number of run length zeros on the odd and even subsequences to ten.

Figure 30:
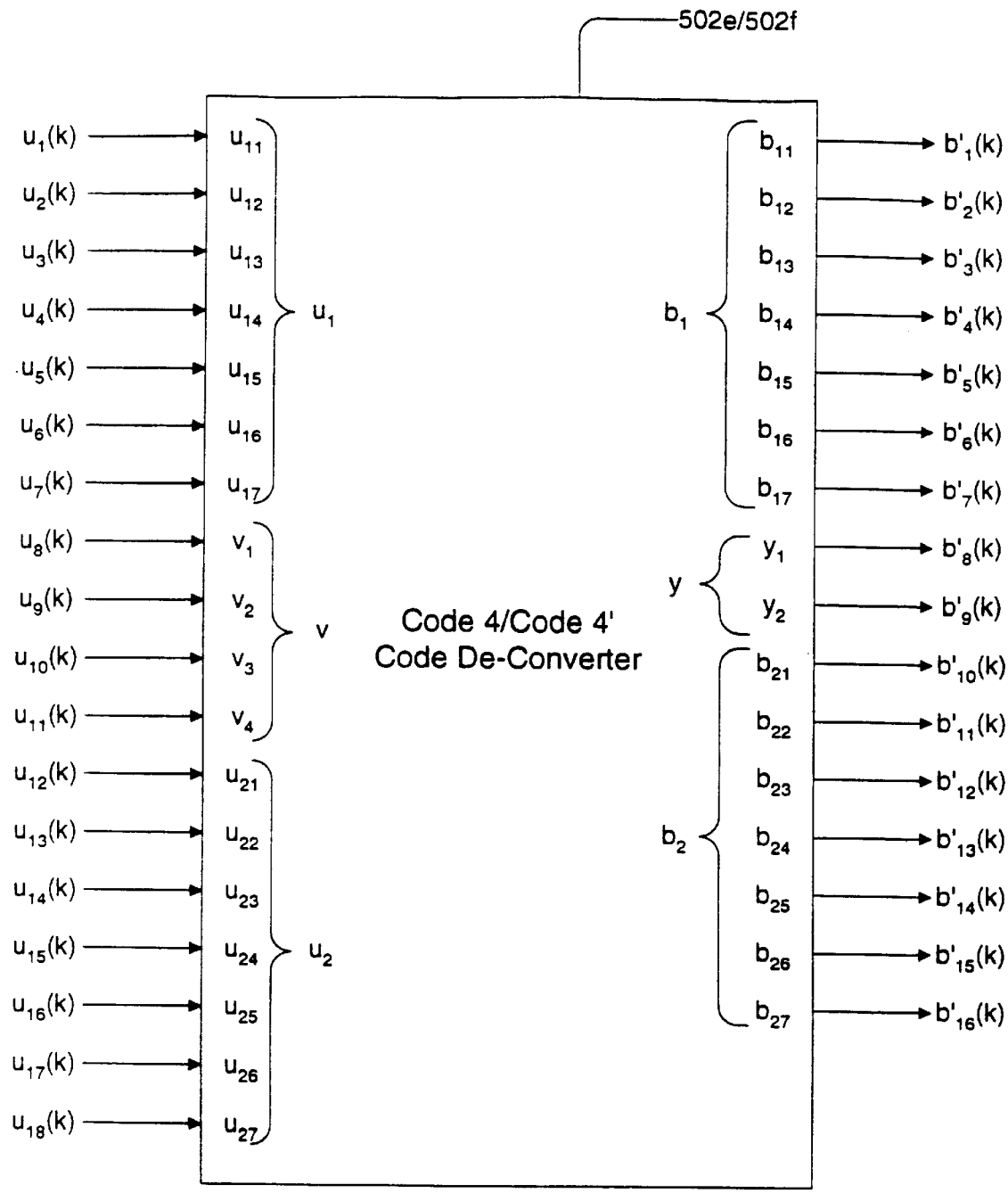
FIGS. 30 and 31 show a fourth embodiment of the code de-converter constructed according to the present invention to decode words encoded using Code 4, and for use with the code generator of FIGS. 28 and 29.
Figure 31:
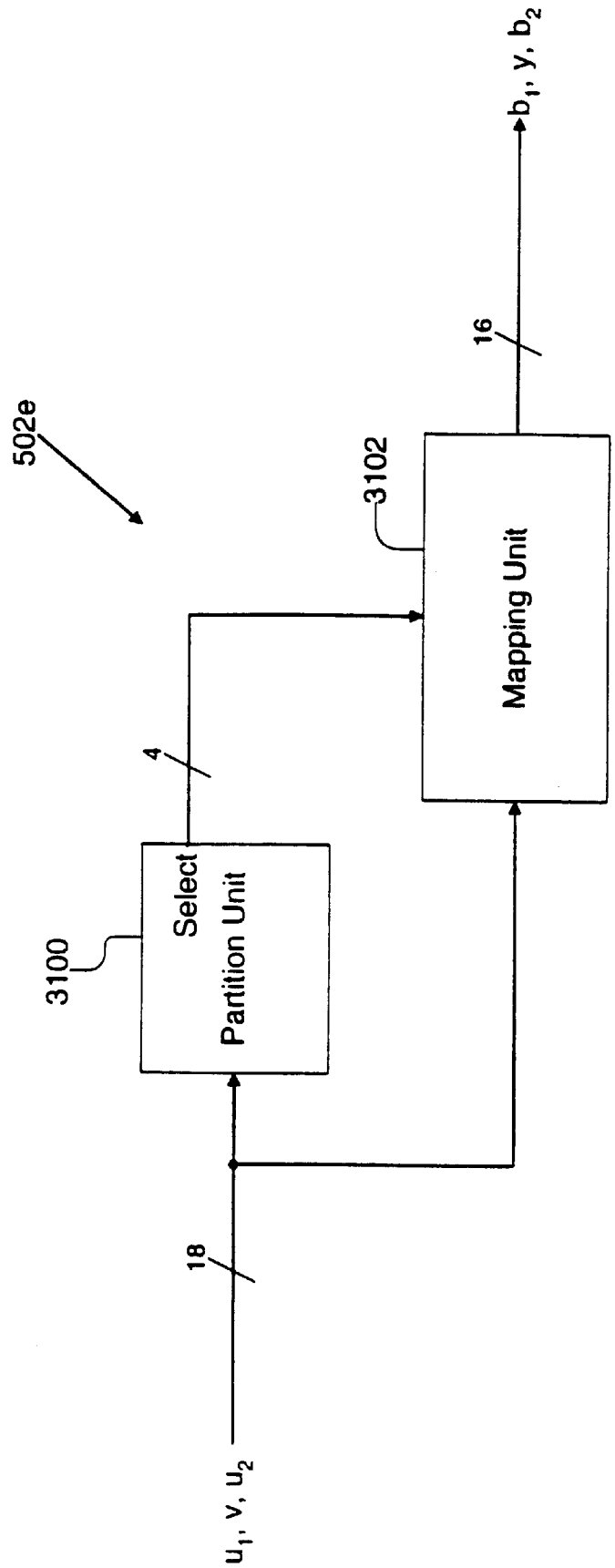

Referring now to FIGS. 30 and 31, a fourth embodiment of the code de-converter 502e constructed according to the present invention to decode words encoded using Code 4, and for use with the code generator 154e of FIGS. 28 and 29, is shown. The Code 4 de-converter 502e is defined here in terms of the same variables used for encoding namely that an encoded 18-bit word, $u_1(k) \ldots u_{18}(k)$, defined to be variable $U=(u_1, v, u_2)$ where $u_1=u_{11}, \ldots u_{17}$; $u_2=u_{21}, \ldots u_{27}$ and $v=v_1, v_2, v_3, v_4$ is received by the Code 4 de-converter 502e, and in response the Code 4 de-converter 502e generates a 16-bit word, $b'_1(k) \ldots b'_{16}(k)$ which is defined to ve variable $B=(b_1, y, b_2)$ where $b_1=b_{11}, \ldots b_{17}$; $b_2=b_{21}, \ldots b_{27}$ and $y=y_1, y_2$. This is best illustrated in FIG. 30, where the Code 4 de-converter 502e is shown as receiving the encoded 18-bit word, $u_1(k) \ldots u_{18}(k)$, and as outputting the 16-bit word, $b'_1(k) \ldots b'_{16}(k)$. The Code 4 de-converter 502e preferably is constructed similar the code generator 154e in that the Code 4 de-converter 502e comprises a partitioning unit 3100 and a mapping unit 3102. The partitioning unit 3100 has inputs coupled to receive input bits $U=(u_1, v, u_2)$, and an output coupled to the mapping unit 3102 to provide the select signal. The partitioning unit 3100 is preferably combinational logic as defined by the first column of TABLE X to generate a select signal that identifies which of eight (or twelve) maps is to be used to generate the 16-bit word, $b'_1(k) \ldots b'_{16}(k)$. The mapping unit 3102 is circuitry defined according to TABLE X to map the input bits to the output bits using a row of TABLE X according to the value of the select signal. The mapping unit 3102 is coupled to receive the input bits $U=(u_1, v, u_2)$, and the select signal from the partitioning unit 3100. The mapping unit 3102 preferably implements eight maps (the first eight rows) for mapping U to B. If the eight maps are used then the maximum number of run length zeros on the odd and even subsequences can be infinite. However, if the mapping circuit 3102 uses all twelve rows of TABLE X for the mapping function, then the maximum number of run length zeros on the odd and even subsequences will be equal to ten. The mapping unit 3102 preferably uses the following equations to decode the input signal and re-produce the original signal.

TABLE X

Code 4 Decoder Map

| | $b_{11}$ | $b_{12}$ | $b_{13}$ | $b_{14}$ | $b_{15}$ | $b_{16}$ | $b_{17}$ | $y_1$ | $y_2$ | $b_{21}$ | $b_{22}$ | $b_{23}$ | $b_{24}$ | $b_{25}$ | $b_{26}$ | $b_{27}$ |
|---|---|---|---|---|---|---|---|---|---|---|---|---|---|---|---|---|
| $v_2 \wedge v_3 \wedge \overline{v_1 \wedge v_4}$ $v(v_1 \oplus v_2) \wedge (v_3 \oplus v_4)$ $v(v_2 \oplus v_3) \wedge (v_1 \oplus v_4) = 1$ | $u_{11}$ | $u_{12}$ | $u_{13}$ | $u_{14}$ | $u_{15}$ | $u_{16}$ | $u_{17}$ | $v_1$ | $Q_1$ | $u_{21}$ | $u_{22}$ | $u_{23}$ | $u_{24}$ | $u_{25}$ | $u_{26}$ | $u_{27}$ |
| v = 1011 and $u_{16} \vee u_{17} = 1$ | $HL_1$ | $HL_2$ | $HL_3$ | $HL_4$ | $HL_5$ | $HL_6$ | $HL_7$ | $Q_1'$ | $Q_2'$ | $HR_1'$ | $HR_2'$ | $HR_3'$ | $HR_4'$ | $HR_5'$ | $HR_6'$ | $HR_7'$ |
| v = 1101 and $u_{16} \vee u_{17} = 1$ | $HL_1'$ | $HL_2'$ | $HL_3'$ | $HL_4'$ | $HL_5'$ | $HL_6'$ | $HL_7'$ | $Q_1'$ | $Q_2'$ | $HR_1$ | $HR_2$ | $HR_3$ | $HR_4$ | $HR_5$ | $HR_6$ | $HR_7$ |
| v = 0001 | $u_{11}$ | $u_{12}$ | $u_{13}$ | $u_{14}$ | $u_{15}$ | $u_{16}$ | $u_{17}$ | 0 | $Q_1''$ | $FR_1$ | $FR_2$ | $FR_3$ | $FR_4$ | $FR_5$ | $FR_6$ | $FR_7$ |
| v = 0100 | $u_{11}$ | $u_{12}$ | $u_{13}$ | $u_{14}$ | $u_{15}$ | $u_{16}$ | $u_{17}$ | 1 | $Q_1''$ | $FR_1$ | $FR_2$ | $FR_3$ | $FR_4$ | $FR_5$ | $FR_6$ | $FR_7$ |
| v = 1000 | $FL_1$ | $FL_2$ | $FL_3$ | $FL_4$ | $FL_5$ | $FL_6$ | $FL_7$ | $Q_2''$ | 0 | $u_{21}$ | $u_{22}$ | $u_{23}$ | $u_{24}$ | $u_{25}$ | $u_{26}$ | $u_{27}$ |
| v = 0010 | $FL_1$ | $FL_2$ | $FL_3$ | $FL_4$ | $FL_5$ | $FL_6$ | $FL_7$ | $Q_2''$ | 1 | $u_{21}$ | $u_{22}$ | $u_{23}$ | $u_{24}$ | $u_{25}$ | $u_{26}$ | $u_{27}$ |
| v = 1111 and flag = 1 | $GL_1$ | $GL_2$ | $GL_3$ | $GL_4$ | $GL_5$ | $GL_6$ | $GL_7$ | $u_{17}$ | $Q_2$ | $GR_1$ | $GR_2$ | $GR_3$ | $GR_4$ | $GR_5$ | $GR_6$ | $GR_7$ |
| v = 1011, $u_{16} \vee u_{17} = 0$ | 0 | $u_{11}$ | 0 | $u_{12}$ | 0 | $u_{13}$ | 0 | 1 | 1 | $u_{21}$ | $u_{22}$ | $u_{23}$ | $u_{24}$ | $u_{25}$ | $u_{26}$ | $u_{27}$ |
| v = 1011, $u_{16} \vee u_{17} = 0$ | $u_{11}$ | 0 | $u_{12}$ | 0 | $u_{13}$ | 0 | $u_{14}$ | 0 | 0 | $u_{21}$ | $u_{22}$ | $u_{23}$ | $u_{24}$ | $u_{25}$ | $u_{26}$ | $u_{27}$ |
| v = 1111 and flag = 0 and $u_{16} \vee u_{21} \vee u_{22} = 1$ | $u_{11}$ | $u_{12}$ | $u_{13}$ | $u_{14}$ | $u_{15}$ | $u_{16}$ | $u_{17}$ | 0 | 0 | 0 | $u_{25}$ | 0 | $u_{26}$ | 0 | $u_{27}$ | 0 |
| v = 1111 and flag = 0 and $u_{16} \vee u_{21} \vee u_{22} = 0$ | $u_{11}$ | $u_{12}$ | $u_{13}$ | $u_{14}$ | $u_{15}$ | $u_{16}$ | 0 | 1 | 1 | $u_{24}$ | 0 | $u_{25}$ | 0 | $u_{26}$ | 0 | $u_{27}$ | where $$flag = \overline{u_{16} \wedge u_{22} \wedge u_{17} \wedge u_{21}} \vee (u_{16} \oplus u_{17}) \wedge (u_{21} \oplus u_{22}) \vee (u_{17} \oplus u_{21}) \wedge (u_{16} \oplus u_{22})$$

$$Q_1 = \overline{v_2} \wedge v_3 \vee \overline{(v_2 \oplus v_3)} \wedge v_4$$

$$Q_2 = \overline{u_{16}} \wedge u_{22} \vee \overline{(u_{16} \oplus u_{22})} \wedge u_{21}$$

$$Q_1' = \overline{u_{16} \wedge u_{17} \wedge u_{21}} \wedge u_{16} \text{ de}$$

$$Q_2' = \overline{u_{16} \wedge u_{17} \wedge u_{21}} \wedge u_{17}$$

$$Q_1'' = \overline{u_{25} \wedge u_{26}} \wedge (u_{23} \vee u_{24}) \vee \overline{u_{22} \wedge u_{23} \wedge u_{24}} \wedge (u_{25} \vee u_{26})$$

$$Q_2'' = \overline{u_{15} \wedge u_{16}} \wedge (u_{13} \vee u_{14}) \vee \overline{u_{12} \wedge u_{13} \wedge u_{14}} \wedge (u_{15} \vee u_{16})$$

$HL_1, \ldots, HL_7 = h^{-1}(Z_1, Z_2), HR_1, \ldots, HR_7 = h^{-1}(Z_2', Z_2);$ $HL_1', \ldots, HL_7' = h'^{-1}(Z_1', Z_1), HR_1', \ldots, HR_7' = h'^{-1}(Z_1', Z_2');$ $Z_1 = (u_{11} u_{12} u_{13})_{10}, Z_2' = (u_{25} u_{26} u_{27})_{10}, Z_2, Z_1' = j^{-1}((u_{14} u_{15} u_{23} u_{24})_{10})$ $$FL_1, \ldots, FL_7 = \begin{cases} f_1^{-1}(u_{12} u_{13} u_{14} u_{15} u_{16}) & \text{if } Q_2'' = 0 \\ f_2^{-1}(u_{12} u_{13} u_{14} u_{15} u_{16}) & \text{if } Q_2'' = 1 \end{cases}$$

$$FR_1, \ldots, FR_7 = \begin{cases} f_1^{-1}(u_{22} u_{23} u_{24} u_{25} u_{26}) & \text{if } Q_1'' = 0 \\ f_2^{-1}(u_{22} u_{23} u_{24} u_{25} u_{26}) & \text{if } Q_1'' = 1 \end{cases}$$

$GL_1, \ldots, GL_7 = g^{-1}(u_{11} u_{12} u_{13} u_{14} u_{15}), GR_1, \ldots, GR_7 = g^{-1}(u_{23} u_{24} u_{25} u_{26} u_{27})$

CODE 4'

Referring again to FIGS. 28-31, a modified embodiment of the code generator 154f is shown for encoding according to Code 4'. The modified version encodes using Code 4', and has the same general structure as the code generator 154e for Code 4. The Code 4' code generator 154f differs in that it uses a different partition and a different encoder mapping. The variable definitions for the input bits and output bits are the same as defined above for Code 4. The Code 4' also uses the same $f_1(b)$ and $f_2(b)$ maps as defined above in TABLE V, and the same $g(D)$ map defined above in TABLE VI. The partitioning unit 2900 for the Code 4' preferably generates the partition using the same auxiliary partitioning sets as Code 4, but selects a partition using the following equations:

Partition of data words: $(b_1, y, b_2)$ $G1 = \{R1 \cup R2 \cup R3\} \cap \{\{b_{21} b_{23} b_{25} b_{27} \neq 0000\} \text{ and } \{b_{22} b_{24} b_{26} \neq 000\}\}$ $G2 = R4 \cap y_1 = 0$ $G3 = R4 \cap y_1 = 1$ $G4 = R5 \cap y_2 = 0$ $G5 = R5 \cap y_2 = 1$ $G6 = R6$ $G7 = \{R1 \cup R2 \cup R3\} \cap \{\{b_{21} b_{23} b_{25} b_{27} = 0000\} \text{ or } \{b_{22} b_{24} b_{26} = 000\}\}$ $G_1 \cup G_2 \cup G_3 \cup G_4 \cup G_5 \cup G_6 \cup G_7 = \{0,1\}^{16}$ $k_1, k_2, k_3, k_4 = h(b_2)$ It should be noted that the Code 4' is generally easier to implement because it has fewer maps than Code 4.

The mapping unit 2902 for the Code 4' code generator 154f also receives the input bits and the output of the partitioning unit 2900, variable G1–G7. The Code 4' code generator 154f uses the map shown in TABLE XI to generate the output bits. Again, the value of the G variable determines which row of TABLE XI will be used to map the input bits to the output bits.

TABLE XI

Code 4' Encoder Map

| | $u_{11}$ | $u_{12}$ | $u_{13}$ | $u_{14}$ | $u_{15}$ | $u_{16}$ | $u_{17}$ | $v_1$ | $v_2$ | $v_3$ | $v_4$ | $u_{21}$ | $u_{22}$ | $u_{23}$ | $u_{24}$ | $u_{25}$ | $u_{26}$ | $u_{27}$ | #1's |
|---|---|---|---|---|---|---|---|---|---|---|---|---|---|---|---|---|---|---|---|
| B ∈ G1 | $b_{11}$ | $b_{12}$ | $b_{13}$ | $b_{14}$ | $b_{15}$ | $b_{16}$ | $b_{17}$ | $d_1$ | $d_2$ | $d_3$ | $d_4$ | $b_{21}$ | $b_{22}$ | $b_{23}$ | $b_{24}$ | $b_{25}$ | $b_{26}$ | $b_{27}$ | ≧7 |
| B ∈ G2 | $b_{11}$ | $b_{12}$ | $b_{13}$ | $b_{14}$ | $b_{15}$ | $b_{16}$ | $b_{17}$ | 0 | 0 | 0 | 0 | $q_1$ | P | P' | $q_2$ | $q_3$ | $q_4$ | $q_5$ | ≧7 |
| B ∈ G3 | $b_{11}$ | $b_{12}$ | $b_{13}$ | $b_{14}$ | $b_{15}$ | $b_{16}$ | $b_{17}$ | 0 | 1 | 0 | 0 | $q1$ | P | P' | $q_2$ | $q_3$ | $q_4$ | $q_5$ | ≧8 |
| B ∈ G4 | $m_1$ | $m_2$ | $m_3$ | $m_4$ | $m_5$ | $b_{22}$ | $b_{23}$ | 1 | 0 | 0 | 0 | $b_{21}$ | R | R' | $b_{24}$ | $b_{25}$ | $b_{26}$ | $b_{27}$ | ≧8 |
| B ∈ G5 | $m_1$ | $m_2$ | $m_3$ | $m_4$ | $m_5$ | $b_{22}$ | $b_{23}$ | 0 | 0 | 0 | 1 | $b_{21}$ | R | R' | $b_{24}$ | $b_{25}$ | $b_{26}$ | $b_{27}$ | ≧8 |
| B ∈ G6 | $t_1$ | $t_2$ | $t_3$ | $t_4$ | $t_5$ | $y_1$ | $y_2$ | 1 | 1 | $\underline{1}$ | 1 | $c_1$ | S | S' | $c_2$ | $c_3$ | $c_4$ | $c_5$ | ≧7 |
| B ∈ G7 | $b_{11}$ | $b_{12}$ | $b_{13}$ | $b_{14}$ | $b_{15}$ | $b_{16}$ | $b_{17}$ | 1 | $y_1$ | $\overline{y_1}$ | 1 | $y_2$ | W | W' | $k_1$ | $k_2$ | $k_3$ | $k_4$ | ≧7 |

$$d_1, d_2, d_3, d_4 = \begin{cases} y_1, \overline{y_1 \wedge y_2}, \overline{y_1 \wedge y_2}, y_2 & \text{if } P_1 = 0 \\ y_1, y_2, \overline{y_2}, \overline{y_1} & \text{if } P_1 = 1 \end{cases}$$

where $P_1 = u_{11} \oplus u_{12} \oplus u_{15} \oplus u_{16} \oplus u_{22} \oplus u_{23} \oplus u_{26} \oplus u_{27} \oplus cs.$ $P = (q_2 \vee q_4) \wedge X \vee \overline{(q_2 \vee q_4)} \wedge \overline{X} \vee (q_2 \vee q_4); P' = \overline{(q_2 \vee q_4)} \wedge X \vee (q_2 \vee q_4)$ $R = (b_{22} \vee b_{24}) \wedge X \vee \overline{(b_{22} \vee b_{24})} \wedge \overline{X}; R' = \overline{(b_{22} \vee b_{24})} \wedge X \vee (b_{22} \vee b_{24})$ $S = (c_2 \vee c_4) \wedge X \vee \overline{(c_2 \vee c_4)} \wedge \overline{X}; S' = \overline{(c_2 \vee c_4)} \wedge X \vee (c_2 \vee c_4)$ $W = (k_1 \vee k_3) \wedge X \vee \overline{(k_1 \vee k_3)} \wedge \overline{X}; W' = \overline{(k_1 \vee k_3)} \wedge X \vee (k_1 \vee k_3)$ where, $X = u_{11} \oplus u_{12} \oplus u_{15} \oplus u_{16} \oplus v_3 \oplus u_{26} \oplus u_{27} \oplus cs \oplus 1$ $$q_1, q_2, q_3, q_4, q_5 = \begin{cases} f_1(b_2) & \text{if } y_2 = 0 \\ f_2(b_2) & \text{if } y_2 = 1 \end{cases}$$

$$m_1, m_2, m_3, m_4, m_5 = \begin{cases} f_1(b_1) & \text{if } y_1 = 0 \\ f_2(b_1) & \text{if } y_1 = 1 \end{cases}$$

$t_1, t_2, t_3, t_4, t_5 = g(b_1)$ and $c_1, c_2, c_3, c_4, c_5 = g(b_2)$

The Code 4' described by TABLE XI has $\hat{N}=7$, $Z=10$ and $Z_i=11$. The Code 4' is particularly advantageous because it has the property that minimum distance error events corrupt at most 3 user bytes, since minimum distance error events occurring across coeword boundaries are prevented from corrupting the first 8 bits of the first codeword, by ensuring there is at least one 1 on both the odd and even subsequences in bits $u_{21}, \ldots, u_{27}$ which will protect $u_{11}, \ldots, u_{17}$ and $v_1$, $v_2$, $v_3$, $v_4$ and thus enable data bits $b_{11}, \ldots, b_{17}$, $y_1$ to be correctly decoded.

The mapping used for encoding in Code 4' is derived using the maps as defined above for code 4 and a h (D3) map, which is 1-to-1 map from D3 to 4-bit non-zero words, shown in TABLE XII below.

Let D={d; d has 7 bits and weight of d<3}, |D|=29

D3={d; d has 7 bits and wieght of d≥2; $d_1d_3d_5d_7$=0000 OR $d_2d_4d_6$=000}, |D3|=15

TABLE XII h (D3) map

| D3 | h (D3) | D3 | h (D3) | D3 | h (D3) |
| --- | --- | --- | --- | --- | --- |
| 0101010 | 1110 | 1010100 | 0001 | 0010001 | 0101 |
| 0101000 | 1101 | 1010001 | 0010 | 1010000 | 1100 |
| 0100010 | 1011 | 1000101 | 0100 | 0000101 | 0011 |
| 0001010 | 0111 | 0010101 | 1000 | 1000001 | 1001 |
| 1010101 | 1111 | 1000100 | 1010 | 0010100 | 0110 |

Referring again to FIGS. 30 and 31, a code de-converter 502f for Code 4' is shown. The Code 4' de-converter 502f receives an encoded 18-bit word, $u_1(k)\ldots u_{18}(k)$, defined to be variable $U=(u_1, v, u_2)$ where $u_1=u_{11}, \ldots, u_{17}$; $u_2=u_{21}, \ldots, u_{27}$ and $v=v_1, v_2, v_3, v_4$, and in response the Code 4' de-converter 502f generates a 16-bit word, $b'_1(k)\ldots b'_{16}(k)$ which is defined to be variable $B=(b_1, y, b_2)$ where $b_1=b_{11}, \ldots, b_{17}$; $b_2=b_{21}, \ldots, b_{27}$ and $y=y_1, y_2$. The Code 4' de-converter 502f preferably comprises a partitioning unit 3100 and a mapping unit 3102. The partitioning unit 3100 has inputs coupled to receive input bits $U=(u_1, v, u_2)$, and an output coupled to the maping unit 3102 to provide the select signal. The partitioning unit 3100 is preferably combinational logic as defined by the first column of TABLE XIII to generate a select signal that identifies which row of the map is to be used to generate the 16-bit word, $b'_1(k)\ldots b'_{16}(k)$. The mapping unit 3102 is circuitry defined according to TABLE XIII to map the input bits to the output bits using a row of TABLE XIII according to the value of the select signal. The mapping unit 3102 is coupled to receive the input bits $U=(u_1, v, u_2)$, and the select signal from the partitioning unit 3100. The mapping unit 3102 preferably uses the following equations to decode the input signal and re-produce the original signal.

TABLE XIII

Code 4' Decoder Map

| | $b_{11}$ | $b_{12}$ | $b_{13}$ | $b_{14}$ | $b_{15}$ | $b_{16}$ | $b_{17}$ | $y_1$ | $y_2$ | $b_{21}$ | $b_{22}$ | $b_{23}$ | $b_{24}$ | $b_{25}$ | $b_{26}$ | $b_{27}$ |
| --- | --- | --- | --- | --- | --- | --- | --- | --- | --- | --- | --- | --- | --- | --- | --- | --- |
| $\overline{v_1}\wedge \overline{v_2}\wedge v_3 \wedge v_4 \vee$ $v_1 \wedge \overline{v_2}\wedge (v_3 \oplus v_4)v$ $\overline{v_1}\wedge v_2 \wedge (\overline{v_3} \vee v_4)v$ $v_1 \wedge v_2 \wedge \overline{v_4} = 1$ | $u_{11}$ | $u_{12}$ | $u_{13}$ | $u_{14}$ | $u_{15}$ | $u_{16}$ | $u_{17}$ | $v_1$ | $Q_1$ | $u_{21}$ | $u_{22}$ | $u_{23}$ | $u_{24}$ | $u_{25}$ | $u_{26}$ | $u_{27}$ |
| v = 0000 | $u_{11}$ | $u_{12}$ | $u_{13}$ | $u_{14}$ | $u_{15}$ | $u_{16}$ | $u_{17}$ | 0 | $Q_1'$ | $FR_1$ | $FR_2$ | $FR_3$ | $FR_4$ | $FR_5$ | $FR_6$ | $FR_7$ |
| v = 0100 | $u_{11}$ | $u_{12}$ | $u_{13}$ | $u_{14}$ | $u_{15}$ | $u_{16}$ | $u_{17}$ | 1 | $Q_1'$ | $FR_1$ | $FR_2$ | $FR_3$ | $FR_4$ | $FR_5$ | $FR_6$ | $FR_7$ |
| v = 1000 | $FL_1$ | $FL_2$ | $FL_3$ | $FL_4$ | $FL_5$ | $FL_6$ | $FL_7$ | $Q_2'$ | 0 | $u_{21}$ | $u_{22}$ | $u_{23}$ | $u_{24}$ | $u_{25}$ | $u_{26}$ | $u_{27}$ |
| v = 0001 | $FL_1$ | $FL_2$ | $FL_3$ | $FL_4$ | $FL_5$ | $FL_6$ | $FL_7$ | $Q_2'$ | 1 | $u_{21}$ | $u_{22}$ | $u_{23}$ | $u_{24}$ | $u_{25}$ | $u_{26}$ | $u_{27}$ |
| v = 1111 | $GL_1$ | $GL_2$ | $GL_3$ | $GL_4$ | $GL_5$ | $GL_6$ | $GL_7$ | $u_{16}$ | $u_{17}$ | $GR_1$ | $GR_2$ | $GR_3$ | $GR_4$ | $GR_5$ | $GR_6$ | $GR_7$ |
| v = 1011 OR v = 1101 | $u_{11}$ | $u_{12}$ | $u_{13}$ | $u_{14}$ | $u_{15}$ | $u_{16}$ | $u_{17}$ | $v_3$ | $u_{22}$ | $H_1$ | $H_2$ | $H_3$ | $H_4$ | $H_5$ | $H_6$ | $H_7$ | where $Q_1 = (\overline{v_2 \oplus v_3}) \wedge v_4 \vee (v_2 \oplus v_3) \wedge v_3$ $Q_1' = \overline{u_{26}} \wedge u_{27} \wedge (u_{24} \vee u_{25}) \vee u_{21} \wedge u_{24} \wedge u_{25} \wedge (u_{26} \vee u_{27})$ $Q_2' = \overline{u_{14}} \wedge u_{15} \wedge (u_{12} \vee u_{13}) \vee u_{11} \wedge u_{12} \wedge u_{13} \wedge (u_{14} \vee u_{15})$ $H_1, \ldots, H_7 = h^{-1}(u_{24}u_{25}u_{26}u_{27})$, $$FL_1, \ldots, FL_7 = \begin{cases} f_1^{-1}(u_{12}u_{13}u_{14}u_{15}u_{16}) \text{ if } Q_2' = 0 \\ f_2^{-1}(u_{12}u_{13}u_{14}u_{15}u_{16}) \text{ if } Q_2' = 1 \end{cases}$$

$$FR_1, \ldots, FR_7 = \begin{cases} f_1^{-1}(u_{22}u_{23}u_{24}u_{25}u_{26}) \text{ if } Q_1' = 0 \\ f_2^{-1}(u_{22}u_{23}u_{24}u_{24}u_{26}) \text{ if } Q_1' = 1 \end{cases}$$

$GL_1, \ldots, GL_7 = g^{-1}(u_{11}u_{12}u_{13}u_{14}u_{15})$, $GR_1, \ldots, GR_7 = g^{-1}(u_{23}u_{24}u_{25}u_{26}u_{27})$

CODE 5

Figure 32:
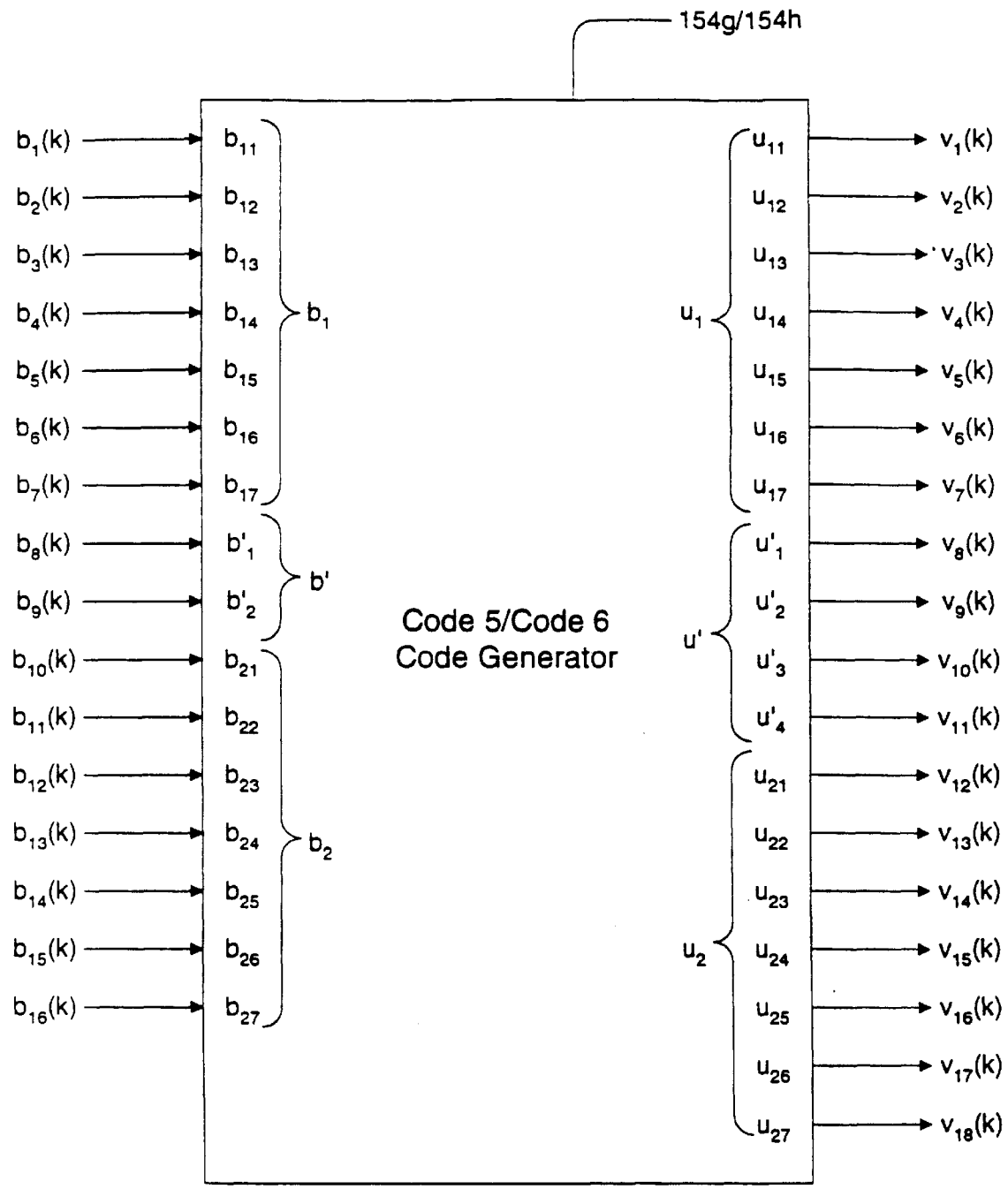
FIGS. 32–35 shows a seventh embodiment of the code generator constructed according to the present invention generate a fifth code, "Code 5;"
Figure 33:
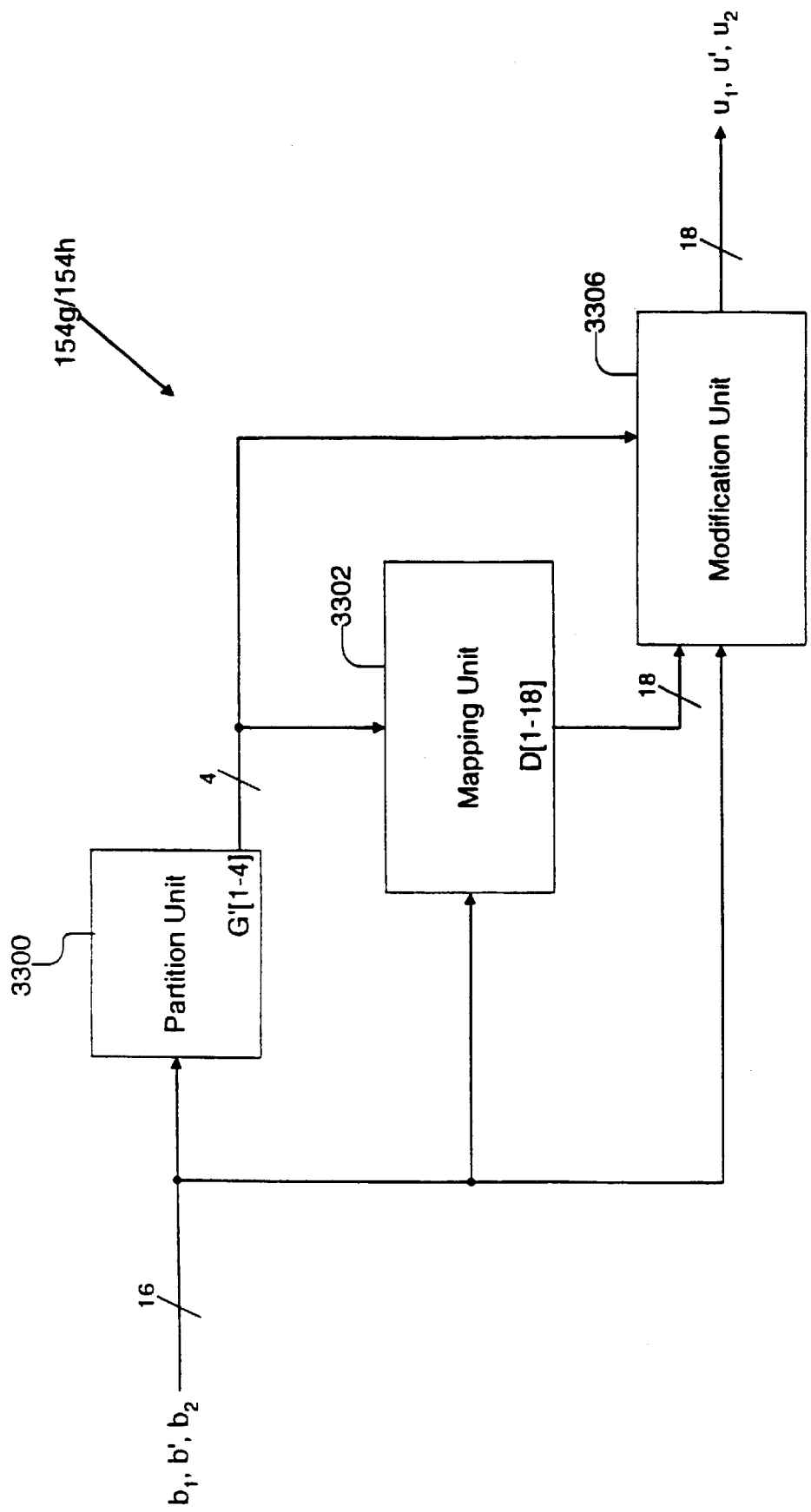

Referring now to FIGS. 32 and 33, a seventh embodiment of the code generator 154g constructed according to the present invention for encoding signals with a fifth code. "Code 5," is shown. The seventh embodiment of the code generator 154g provides a fifth code, "Code5," that is a rate $^{16}/_{18}$ run length limited code with the additional property that after precoding for the 1-D channel the code words have 0 mod 3 number of ones. As best illustrated by FIG. 32, the seventh embodiment of the code generator 154g receives a 16-bit word $b_1(k)\ldots b_{16}(k)$ which is defined to be variable $B=(b_1, b'_2)$ where $b_1=b_{11}, \ldots, b_{17}$; $b_2=b_{21}, \ldots, b_{27}$ and $b'=b'_1$, $b'_2$; and outputs a 18-bit word, $v_1(k)\ldots v_{18}(k)$, defined to be variable $U=(u_1, u', u_2)$ where $u_1=u_{11}, \ldots, u_{17}$; $u_2=u_{21}, \ldots, u_{27}$ and $u'=u'_1$, $u'_2$, $u'_3$, $u'_4$. For convenience and ease of notation and understanding the variable U will also be referred to as variable a where $(u_{11}, \ldots, u_{17}, u'_1, u'_2, u'_3, u'_4, u_{21}, \ldots, u_{27}) = (a_1, \ldots, a_{18})$.

Referring now to FIG. 33, the seventh embodiment of the code generator 154g is shown in more detail. The seventh embodiment of the code generator 154g preferably comprises a partitioning unit 3300, a mapping unit 3302, and a modification unit 3306. The partitioning unit 3300 is preferably coupled to receive the 16 bits of the input word, ($b_1$,b',$b_2$), and generate a signal, preferably a four bit signal, that indicates which map the mapping unit 3302 is to use in generating the output word. The partitioning unit 3300 receives the input data bits, ($b_1$,b',$b_2$) of the encoder 12. The number of ones in the input data bits are used to partition the data word and select a encoding map using the following equations:

shown in TABLE XIV to determine its output. The mapping unit 3302 generates eighteen output bits, ($u_1$,u',$u_2$). The value of the variable G from the partitioning unit 3300 identifies which row of TABLE XIV that will be used to generate the output bits ($u_1$,u',$u_2$). For example, if the input word B is in the set G3, then the third row of TABLE XIV will be used to generate the output word U.

TABLE XIV

Encoder Map for Code 5

| if in | $u_{11}$ | $u_{12}$ | $u_{13}$ | $u_{14}$ | $u_{15}$ | $u_{16}$ | $u_{17}$ | $u_1'$ | $u_2'$ | $u_3'$ | $u_4$ | $u_{21}$ | $u_{22}$ | $u_{23}$ | $u_{24}$ | $u_2$ | $u_{25}$ | $u_{27}$ | #1's |
|---|---|---|---|---|---|---|---|---|---|---|---|---|---|---|---|---|---|---|---|
| G1 | $b_{11}$ | $b_{12}$ | $b_{13}$ | $b_{14}$ | $b_{15}$ | $b_{16}$ | $b_{17}$ | $b_1$ | $d_1$ | $d_2$ | $d_3$ | $b_{21}$ | $b_{22}$ | $b_{23}$ | $b_{24}$ | $b_{25}$ | $b_{26}$ | $b_{27}$ | $\geq 6$ |
| G2 | $l_{11}$ | $l_{12}$ | $l_{13}$ | $P_{11}$ | $P_{12}$ | $z_1$ | $z_2$ | 1 | 1 | 1 | 0 | $z_3$ | 1 | $P_{13}$ | $P_{14}$ | $r_{11}$ | $r_{12}$ | $r_{13}$ | $\geq 9$ |
| G3 | $l_{21}$ | $l_{22}$ | $l_{23}$ | $P_{21}$ | $P_{22}$ | $z_1$ | $z_2$ | 1 | 1 | 1 | 0 | $z_3$ | 0 | $P_{23}$ | $P_{24}$ | $r_{21}$ | $r_{22}$ | $r_{23}$ | $\geq 8$ |
| G4 | $b_{11}$ | $b_{12}$ | $b_{13}$ | $b_{14}$ | $b_{15}$ | $b_{16}$ | $b_{17}$ | 0 | 1 | 1 | 0 | $b_1'$ | $d_1$ | $d_2$ | $d_3$ | $q_1$ | $q_2$ | $q_3$ | $\geq 6$ |
| G5 | $b_{11}$ | $b_{12}$ | $b_{13}$ | $b_{14}$ | $b_{15}$ | $b_{16}$ | $b_{17}$ | 0 | 1 | 1 | 0 | $b_1'$ | 1 | 1 | 1 | $d_1$ | $d_2$ | $d_3$ | $\geq 8$ |
| G6 | $m_1$ | $m_2$ | $m_3$ | $k_1$ | $k_2$ | $k_3$ | $b_2'$ | 0 | 1 | 1 | 1 | $b_{21}$ | $b_{22}$ | $b_{23}$ | $b_{24}$ | $b_{25}$ | $b_{26}$ | $b_{27}$ | $\geq 7$ |
| G7 | $k_1$ | $k_2$ | $k_3$ | 1 | 1 | 1 | $b_2'$ | 0 | 1 | 1 | 1 | $b_{21}$ | $b_{22}$ | $b_{23}$ | $b_{24}$ | $b_{25}$ | $b_{26}$ | $b_{27}$ | $\geq 9$ |
| G8 | $t_1$ | $t_2$ | $t_3$ | $t_4$ | $t_5$ | $k_1$ | $k_2$ | 1 | 1 | 1 | 1 | $k_3$ | $b_2'$ | $c_1$ | $c_2$ | $c_3$ | $c_4$ | $c_5$ | $\geq 6$ |

Auxiliary Sets: partitioning ($b_1$,$b_2$)

R1={($b_1$,$b_2$):|$b_1$|$\geq$2 AND |$b_2$|$\geq$2 AND |$b_1$|+|$b_2$|$\geq$6}

R2={($b_1$,$b_2$):|$b_1$|=3 AND |$b_2$|=2}

R3={($b_1$,$b_2$):|$b_1$|=2 AND |$b_2$|=3}

R4={($b_1$,$b_2$):|$b_1$|$\geq$3 AND |$b_2$|$\leq$1}

R5={($b_1$,$b_2$):|$b_1$|$\leq$1 AND |$b_2$|$\geq$3}

R6={($b_1$,$b_2$):|$b_1$|$\leq$2 AND |$b_2$|$\leq$2}

Partition of data words: ($b_1$,b',$b_2$)

Let b'=($b_1'$,$b_2'$).

G1={($b_1$,$b_1'$,$b_2'$,$b_2$):($b_1$,$b_2$) in R1 OR (($b_1$,$b_2$) in R2 and b' not 00) OR (($b_1$,$b_2$) in R3 and b' not 00)}

G2={($b_1$,b',$b_2$):($b_1$,$b_2$) in R2 AND b'=00}

G3={($b_1$,b',$b_2$):($b_1$,$b_2$) in R3 AND b'=00}

G4={($b_1$,b',$b_2$):($b_1$,$b_2$) in R4 AND $b_2$ not 0000000)}

G5={($b_1$,b',$b_2$):($b_1$,$b_2$) in R4 AND $b_2$=0000000)}

G6={($b_1$,b',$b_2$):($b_1$,$b_2$) in R5 AND $b_1$ not 0000000)}

G7={($b_1$,b',$b_2$):($b_1$,$b_2$) in R5 AND $b_1$=0000000)}

G8={($b_1$,b',$b_2$):($b_1$,$b_2$) in R6} where G1 through G8 correspond to a row of the encoding map for Code 5, as will be described below with reference to TABLE XIV. Since exemplary partitioning units 2900, 3100 have been described above for Codes 1–4', the specific implementation in combinational logic, registers and multiplexers will not be described here. However, a more detailed description that is also applicable to this Code 5 implementation is described in detail below with reference to Code 6 and FIGS. 34 and 35. Those skilled in the art will be able to construct the Code 5 code generator 154g from the equations and the disclosure below.

As shown in FIG. 33, the mapping unit 3302 receives the input bits ($b_1$,b',$b_2$), and the output of the partitioning unit 3300, variable G. The mapping unit 3302 uses the map The values in TABLE XIV are generated from the input word B, and the following equations:

where:

$d_1 d_2 d_3$ is in {000,011,101} if $b_2'$=0, and it is in {001,010, 100} if $b_2'$=1, and is chosen such that $(({a_1})+(a_1 \oplus a_2)+ \ldots +(a_1 \oplus \ldots \oplus a_{18})) \mod 3=0.$ $z_1 z_2 z_3$ is in {011,101,110} and it is chosen such that $(({a_1})+(a_1 \oplus a_2)+ \ldots +(a_1 \oplus \ldots \oplus a_{18})) \mod 3=0.$ $k_1 k_2 k_3$ is in {000,011,101} if $b_1'$=0, and it is in {001,010, 100} if $b_1'$=1, and is chosen such that $(({a_1})+(a_1 \oplus a_2)+ \ldots +(a_1 \oplus \ldots \oplus a_{18})) \mod 3=0.$ $(q_1,q_2,q_3)=f(b_2)$ $(m_1,m_2,m_3)=f(b_1)$ $(l_{11},l_{12},l_{13})$=first 3 bits in $h(b_1)$ $(r_{11},r_{12},r_{13})$=last 3 bits in $h'(b_2)$ $(p_{11},p_{12},p_{13},p_{14})=j$(last 3 bits in $h(b_1)$, first 2 bits in $h'(b_2)$)

$(l_{21},l_{22},l_{23})$=last 3 bits in $h'(b_1)$ $(r_{21},r_{22},r_{23})$=first 3 bits in $h(b_2)$ $(p_{21},p_{22},p_{23},p_{24})=j$(last 3 bits in $h(b_2)$, first 2 bits in $h'(b_1)$)

$(t_1,t_2,t_3,t_4,t_5)=g(b_1)$ and $(c_1,c_2,c_3,c_4,c_5)=g(b_2)$

Those skilled in the art will recognize that the mapping unit 3302 may be constructed using combinational logic in conjunction with the following maps that are used to generate certain values of TABLE XIV as specified in the above equations. The preferred embodiment of the mapping unit 3302 includes: a f map; a $f^{-1}$ map; a h map, a $h^{-1}$ map, a h' map, a $h'^{-1}$ map, a j map, a $j^{-1}$ map, a g map, and a $g^{-1}$ map as characterized by the equations shown below.

Map f:

Let x=($x_1$,$x_2$,$x_3$,$x_4$,$x_5$,$x_6$,$x_7$) be in {(0000000),(0000001), (0000010),(0000100),(0001000),(0010000), (0100000),(1000000)} then $f(x_1,x_2,x_3,x_4,x_5,x_6,x_7)=(y_1,y_2,y_3),$ where $f(0000000)=000.$ $f(0000001)=001.$ $f(0000010)=010.$ $f(0000100)=011.$ $f(0001000)=100.$ $f(0010000)=101.$ $f(0100000)=110,$ and $f(1000000)=111.$ In words, f points (in base 2) to the location of the one in x. In terms of logic, the map f can be characterized as:

$y_1 = x_1 \vee x_2 \vee x_3 \vee x_4$ $y_2 = x_1 \vee x_2 \vee x_5 \vee x_6$ $y_3 = x_1 \vee x_3 \vee x_5 \vee x_7$ and $f^{-1}$ can be characterized as $x_1 = y_1 \wedge y_2 \wedge y_3$ $x_2 = y_1 \wedge y_2 \wedge \overline{y_3}$ $x_3 = y_1 \wedge \overline{y_2} \wedge y_3$ $x_4 = y_1 \wedge \overline{y_2} \wedge \overline{y_3}$ $x_5 = \overline{y_1} \wedge y_2 \wedge y_3$ $x_6 = \overline{y_1} \wedge y_2 \wedge \overline{y_3}$ $x_7 = \overline{y_1} \wedge \overline{y_2} \wedge y_3$ Map h:
h maps
$B_3$ to $\{(y_1,y_2,y_3):(y_1,y_2,y_3) \neq (0,0,0)\} \times \{(z_1,z_2,z_3):(z_1,z_2,z_3) \neq (1,0,1),(1,1,0)$ and $(1,1,1)\}$, where $B_3=\{x=(x_1,x_2,x_3,x_4,x_5,x_6,x_7):$ x has weight 3$\}$, (note $|B_3|=35$). In terms of logic, the map h can be characterized as:

$y_1 = x_1 \oplus x'$ $y_2 = x_2 \oplus x'$ $y_3 = x_3 \oplus x'$ where $x' = \overline{x_1 \vee x_2 \vee x_3} \vee (x_4 \wedge x_5 \wedge \overline{x_6} \wedge \overline{x_7})$ $z_1 = x_4 \wedge c_1 \vee \overline{x_4} \wedge c_3$ $z_2 = x_5 \wedge c_1 \vee \overline{x_5} \wedge c_3 \vee c_4 \vee c_5$ $z_3 = x_6 \wedge c_1 \vee \overline{x_6} \wedge c_3 \vee c_4 \vee c_5$ where $c_1 = ((x_1 \vee x_2 \vee x_3) \wedge (x_4 \oplus x_5 \oplus x_6)) \vee (\overline{x_4} \wedge x_5 \wedge x_6 \wedge \overline{x_7})$ $c_3 = \overline{x_1} \wedge \overline{x_2} \wedge \overline{x_3}$ $c_4 = x_4 \wedge x_5 \wedge \overline{x_6} \wedge \overline{x_7}$ $c_5 = \overline{x_4} \wedge \overline{x_5} \wedge \overline{x_6} \wedge \overline{x_7}.$ Map $h^{-1}$
$h^{-1}$ maps $\{(y_1,y_2,y_3):(y_1,y_2,y_3) \neq (0,0,0)\} \times \{(z_1,z_2,z_3):(z_1,z_2,z_3) \neq (1,0,1),(1,1,0)$ and $(1,1,1)\}$ to $B_3$, where $B_3=\{x=(x_1,x_2,x_3,x_4,x_5,x_6,x_7):$ x has weight 3$\}$, (note $|B_3|=35$). In terms of logic, the map $h^{-1}$ can be characterized as:

$x_1 = y_1 \wedge c_1 \vee \overline{y_1} \wedge c_2 \vee c_4$ $x_2 = y_2 \wedge c_1 \vee \overline{y_2} \wedge c_2 \vee c_4$ $x_3 = y_3 \wedge c_1 \vee \overline{y_3} \wedge c_2 \vee c_4$ $x_4 = z_1 \wedge c_5 \vee c_6 \vee \overline{z_1} \wedge c_8 \vee c_{10}$ $x_5 = z_2 \wedge c_5 \vee c_6 \vee \overline{z_2} \wedge c_8$ $x_6 = z_3 \wedge c_5 \vee \overline{z_3} \wedge c_8 \vee c_{10}$ $x_7 = \overline{x_1 \oplus x_2 \oplus x_3 \oplus x_4 \oplus x_5 \oplus x_6}$ where $c_1 = (\overline{y_1 \vee y_2 \vee y_3}) \wedge \overline{c_2}$ $c_2 = (\overline{y_1 \oplus y_2 \oplus y_3}) \wedge (y_1 \vee y_2 \vee y_3) \wedge (\overline{z_1} \wedge z_2 \wedge z_3)$ $c_3 = (y_1 \wedge y_2 \wedge y_3) \wedge (\overline{z_1 \wedge z_2 \wedge z_3})$ $c_4 = (y_1 \wedge y_2 \wedge y_3) \wedge (\overline{z_1} \wedge z_2 \wedge z_3)$ $c_5 = c_1 \wedge (z_1 \vee z_2 \vee z_3)$ $c_6 = c_2$ $c_7 = (\overline{y_1 \oplus y_2 \oplus y_3}) \wedge (y_1 \vee y_2 \vee y_3) \wedge (\overline{z_1 \vee z_2 \vee z_3})$ $c_8 = (y_1 \wedge y_2 \wedge y_3) \wedge (\overline{z_1 \wedge z_2 \wedge z_3})$ $c_9 = (y_1 \wedge y_2 \wedge y_3) \wedge (\overline{z_1} \wedge z_2 \wedge z_3)$ $c_{10} = (y_1 \oplus y_2 \oplus y_3) \wedge (\overline{z_1 \vee z_2 \vee z_3}) \wedge (\overline{y_1 \wedge y_2 \wedge y_3}).$ Map h':
h' maps $B_2$ to $\{(y_1,y_2):(y_1,y_2)=(0,0),(0,1),(1,0)\} \times \{(z_1,z_2,z_3):(z_1,z_2,z_3) \neq (0,0,0)\}$, where $B_2=\{x=(x_1,x_2,x_3,x_4,x_5,x_6,x_7):$ x has weight 2$\}$, (note $|B_2|=21$). In terms of logic, the map h' can be characterized as:

$y_1 = x_6 \wedge c_1 \vee \overline{x_6} \wedge c_2 \vee x_2 \wedge c_3 \vee \overline{x_2} \wedge c_4$ $y_2 = x_7 \wedge c_1 \vee \overline{x_7} \wedge c_2 \vee x_3 \wedge c_3 \vee \overline{x_3} \wedge c_4$ $z_1 = \overline{x_1} \wedge c_1 \vee c_3$ $z_2 = \overline{x_2} \wedge c_1 \vee c_2$ $z_3 = \overline{x_3} \wedge c_1 \vee c_4$ where $c_1 = x_1 \oplus x_2 \oplus x_3 \oplus x_4$ $c_2 = \overline{x_1 \vee x_2 \vee x_3 \vee x_4}$ $c_3 = x_4 \wedge \overline{x_5} \wedge \overline{x_6} \vee \overline{x_7}$ $c_4 = \overline{x_4 \vee x_5 \vee x_6 \vee x_7}.$ Map $h'^{-1}$
$h'^{-1}$ maps $\{(y_1,y_2):(y_1,y_2)=(0,0),(0,1),(1,0)\} \times \{(z_1,z_2,z_3):(z_1,z_2,z_3) \neq (0,0,0)\}$ to $B_2$, where $B_2=\{x=(x_1,x_2,x_3,x_4,x_5,x_6,x_7):$ x has weight 2$\}$, (note $|B_2|=21$). In terms of logic, the map $h'^{-1}$ can be characterized as:

$x_1 = \overline{z_1} \wedge c_1 \vee (\overline{y_1 \vee y_2}) \wedge c_3 \vee (y_1 \vee y_2) \wedge c_4$ $x_2 = \overline{z_2} \wedge c_1 \vee y_1 \wedge c_3 \vee \overline{y_1} \wedge c_4$ $x_3 = \overline{z_3} \wedge c_1 \vee y_2 \wedge c_3 \vee \overline{y_2} \wedge c_4$ $x_4 = c_6$ $x_5 = (\overline{y_1 \vee y_2}) \wedge c_7 \vee (y_1 \vee y_2) \wedge c_8$ $x_6 = y_1 \wedge c_7 \vee \overline{y_1} \wedge c_8$ $x_7 = y_2 \wedge c_7 \vee \overline{y_2} \wedge c_8$ where $c_1 = (z_1 \wedge z_2) \vee (z_2 \wedge z_3) \vee (z_1 \wedge z_3)$ $c_2 = \overline{z_1} \wedge z_2 \wedge \overline{z_3}$ $c_3 = z_1 \wedge \overline{z_2} \wedge \overline{z_3}$ $c_4 = \overline{z_1} \wedge \overline{z_2} \wedge z_3$ $c_5 = \overline{c_6}$ $c_6 = z_1 \wedge ((z_2 \wedge z_3) \vee (\overline{z_2} \wedge \overline{z_3}))$ $c_7 = c_1$ $c_8 = c_2$ $c_9 = (z_1 \oplus z_3) \wedge \overline{z_2}$.

Map j:

j maps $\{(y_1,y_2,y_3):(y_1,y_2,y_3) \neq (1,0,1),(1,1,0),(1,1,1)\} \times \{(x_1,x_2):(x_1,x_2)=(0,0),(0,1),(1,0)\}$ to $\{(z_1,z_2,z_3,z_4):(z_1,z_2,z_3,z_4) \neq (0,0,0,0)\}$. In terms of logic, the map j can be characterized as:

$z_1 = \overline{x_1} \wedge c_1$ $z_2 = \overline{y_2} \wedge c_1 \vee \overline{x_1} \wedge c_2$ $z_3 = \overline{y_3} \wedge c_1 \vee \overline{x_2} \wedge c_2$ $z_4 = \overline{x_2} \wedge c_1$ where $c_1 = \overline{y_1}$ $c_2 = y_1$.

Map $j^{-1}$:

$j^{-1}$ maps $\{(z_1,z_2,y_3,z_4):(z_1,z_2,y_3,z_4) \neq (0,0,0,0)\}$ to $\{(y_1,y_2,y_3):(y_1,y_2,y_3) \neq (1,0,1),(1,1,0),(1,1,1)\} \times \{(x_1,x_2):(x_1,x_2)=(0,0),(0,1),(1,0)\}$. In terms of logic, the map $j^{-1}$ can be characterized as:

$x_1 = \overline{z_1} \wedge c_1 \vee \overline{z_2} \wedge c_2$ $x_2 = \overline{z_4} \wedge c_1 \vee \overline{z_3} \wedge c_2$ $y_1 = c_2$ $y_2 = \overline{z_2} \wedge c_1$ $y_3 = \overline{z_3} \wedge c_1$ where $c_1 = z_1 \vee z_4$ $c_2 = \overline{z_1} \wedge \overline{z_4}$.

Map g:

g maps $B_2'$ to $\{(y_1,y_2,y_3,y_4,y_5):(y_1,y_2,y_3,y_4,y_5) \neq (0,0,0,0,0)\}$, where $B_2' = \{x=(x_1,x_2,x_3,x_4,x_5,x_6,x_7): x$ has weight 0, 1, and 2$\}$, (note $|B_2'|=29$). In terms of logic, the map g can be characterized as:

$y_1 = (x_2 \vee x_3) \wedge c_1 \vee c_3 \vee c_4$ $y_2 = (x_1 \vee x_3) \wedge c_1 \vee c_2 \vee c_4$ $y_3 = x_4 \wedge c_1 \vee c_2 \vee c_3 \vee c_4$ $y_4 = (x_6 \vee x_7) \wedge c_1 \vee x_2 \wedge c_2 \vee x_6 \wedge c_3 \vee c_4$ $y_5 = (x_5 \vee x_7) \wedge c_1 \vee x_3 \wedge c_2 \vee x_7 \wedge c_3 \vee c_4$ where $c_1 = (\overline{(x_1 \wedge x_2) \vee (x_2 \wedge x_3) \vee (x_1 \wedge x_3)}) \wedge (\overline{(x_5 \wedge x_6) \vee (x_6 \wedge x_7) \vee (x_5 \wedge x_7)})$ $c_2 = (x_1 \wedge x_2) \vee (x_2 \wedge x_3) \vee (x_1 \wedge x_3)$ $c_3 = (x_5 \wedge x_6) \vee (x_6 \wedge x_7) \vee (x_5 \wedge x_7)$ $c_4 = \overline{x_1 \vee x_2 \vee x_3 \vee x_4 \vee x_5 \vee x_6 \vee x_7}$ Map $g^{-1}$:

$g^{-1}$ maps $\{(y_1,y_2,y_3,y_4,y_5):(y_1,y_2,y_3,y_4,y_5) \neq (0,0,0,0,0)\}$ to $B_2'$, where $B_2' = \{x=(x_1,x_2,x_3,x_4,x_5,x_6,x_7): x$ has weight 0, 1, and 2$\}$, (note $|B_2'|=29$). In terms of logic, the map $g^{-1}$ can be characterized as:

$x_1 = (\overline{y_1} \wedge y_2) \wedge c_1 \vee (y_4 \oplus y_5) \wedge c_2$ $x_2 = (y_1 \wedge \overline{y_2}) \wedge c_1 \vee y_4 \wedge c_2$ $x_3 = (y_1 \wedge y_2) \wedge c_1 \vee y_5 \wedge c_2$ $x_4 = y_3 \wedge c_1$ $x_5 = (\overline{y_4} \wedge y_5) \wedge c_1 \vee (y_4 \oplus y_5) \wedge c_3$ $x_6 = (y_4 \wedge \overline{y_5}) \wedge c_1 \vee y_4 \wedge c_3$ $x_7 = (y_4 \wedge y_5) \wedge c_1 \vee y_5 \wedge c_3$ where $c_1 = \overline{c_2} \vee c_3 \vee c_4$ $c_2 = \overline{y_1} \wedge y_2 \wedge y_3 \wedge (y_4 \vee y_5)$ $c_3 = y_1 \wedge \overline{y_2} \wedge y_3 \wedge (y_4 \vee y_5)$ $c_4 = y_1 \wedge y_2 \wedge y_3 \wedge y_4 \wedge y_5$.

Figure 34:
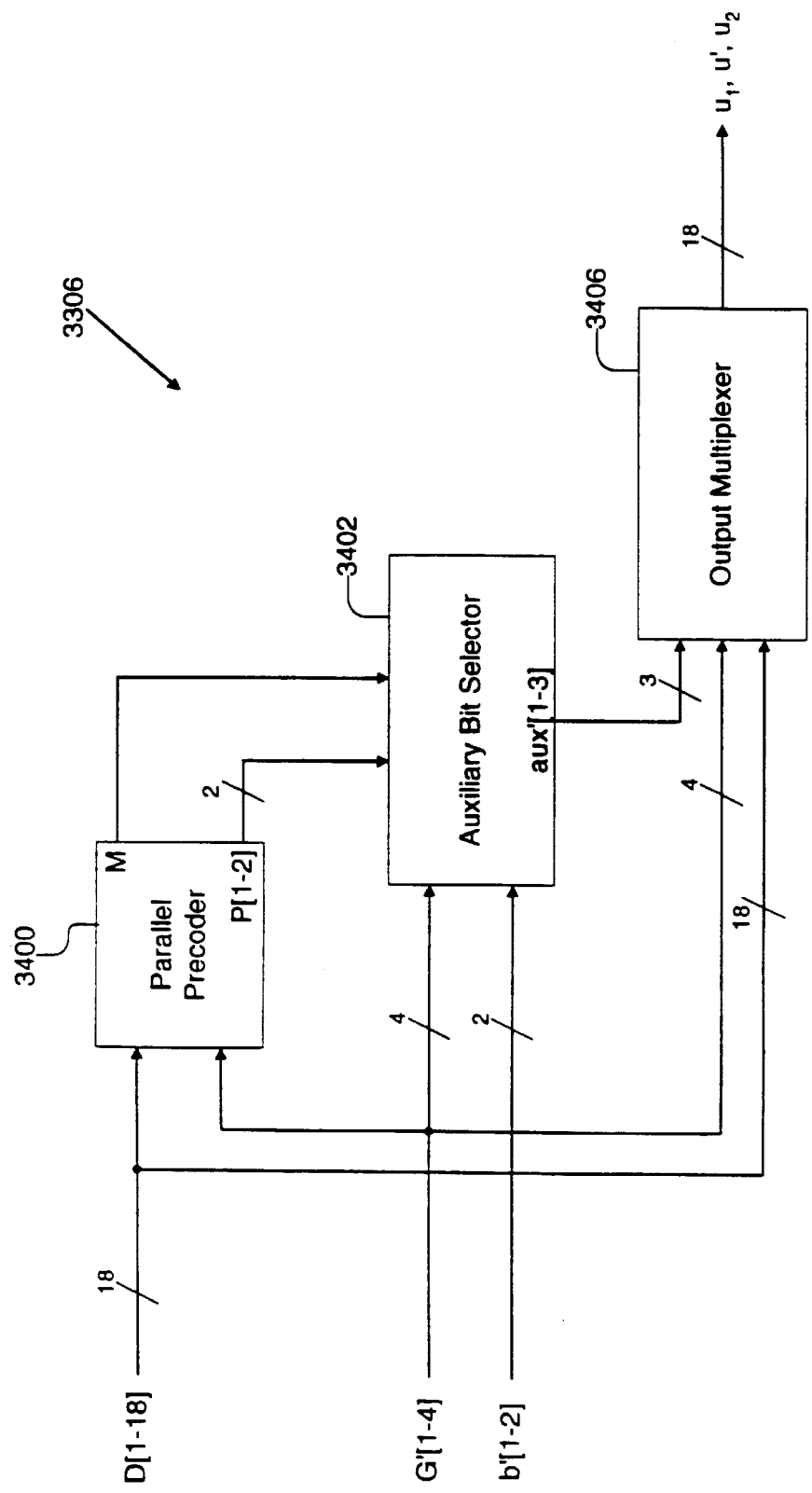
Figure 35:
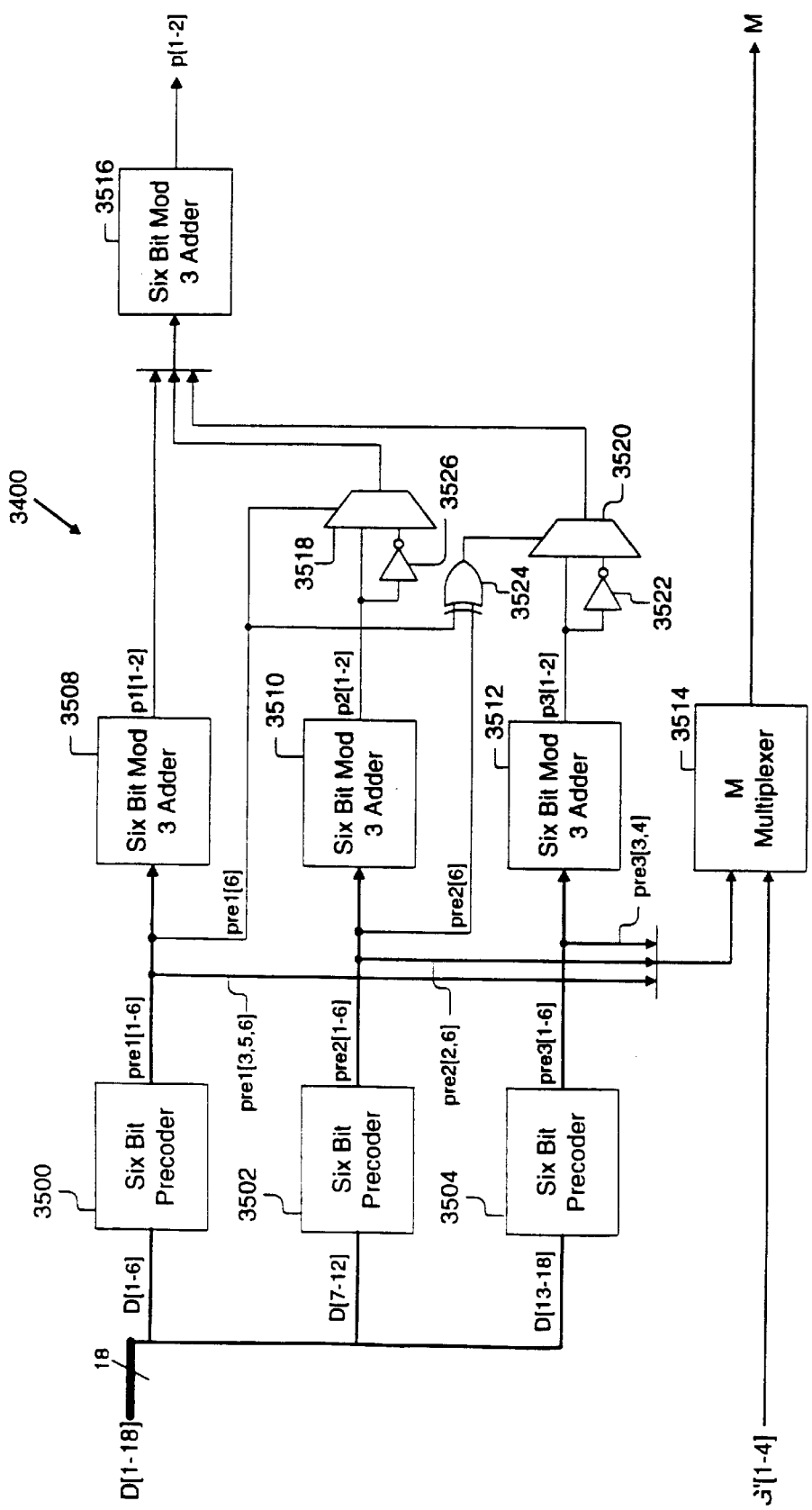
Figure 36:
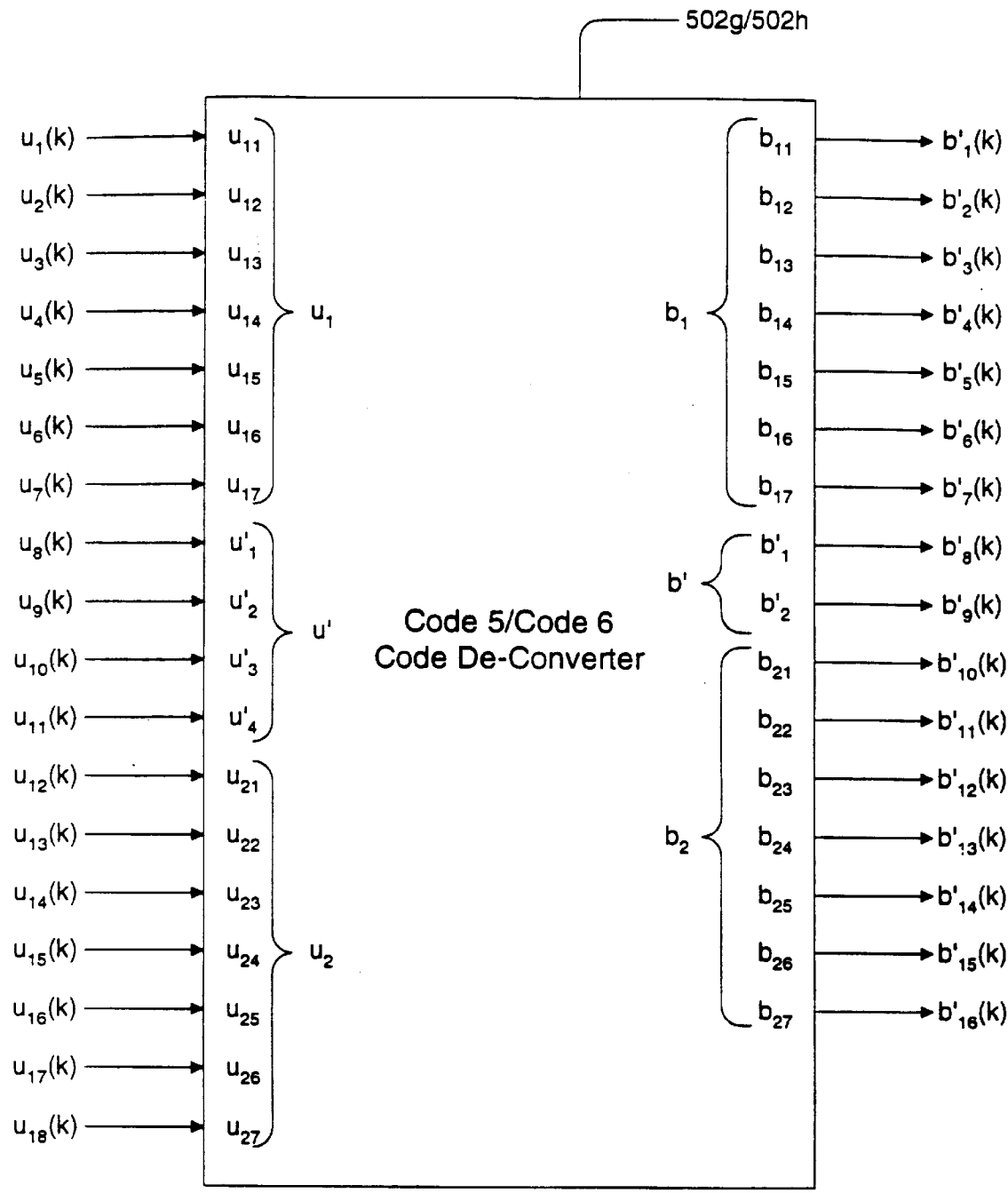
FIG. 36 shows a fifth embodiment of the code de-converter constructed according to the present invention to decode words encoded using Code 5, and for use with the code generator of FIGS. 32–25.

Referring now to FIG. 36, a fourth embodiment of the code de-converter 502g constructed according to the present invention to decode words encoded using Code 5, and for use with the code generator 154g of FIGS. 32–35, is shown. The Code 5 de-converter 502g is defined here in terms of the same variables used for encoding namely that an encoded 18-bit word, $u_1(k) \ldots u_{18}(k)$, defined to be variable $U=(u_1,u',u_2)$ where $u_1=u_{11},\ldots,u_{17}$; $u_2=u_{21},\ldots,u_{27}$ and $u'=u'_1,u'_2,u'_3,u'_4$ is received by the Code 5 de-converter 502g, and in response the Code 5 de-converter 502g generates a 16-bit word, $b'_1(k) \ldots b'_{16}(k)$ which is defined to be variable $B=(b_1,b',b_2)$ where $b_1=b_{11},\ldots,b_{17}$; $b_2=b_{21},\ldots,b_{27}$ and $b'=b'_1,b'_2$, as best illustrated in FIG. 36. The Code 5 de-converter 502g preferably is constructed similar the Code 4 de-converter 502e shown in FIG. 31 in that the Code 5 de-converter 502g comprises a partitioning unit and a mapping unit. The partitioning unit 3100 has inputs coupled to receive input bits $U=(u_1,v,u_2)$, and an output coupled to the mapping unit 3102 to provide the select signal. The partitioning unit is preferably combinational logic as defined by the first column of TABLE XV to generate a select signal that identifies which of eight maps is to be used to generate the 16-bit word, $b'_1(k) \ldots b'_{16}(k)$. The mapping unit is circuitry defined according to TABLE XV to map the input bits to the output bits using a row of TABLE XV according to the value of the select signal. The mapping unit preferably uses the following equations to decode the input signal and re-produce the original signal.

TABLE XV

Code 5 Decoder Map

| | $b_1$ | $b_1'$ | $b_2'$ | $b_2$ |
|---|---|---|---|---|
| If $u_2'u_3'$ not 11 | $u_1$ | $u_1'$ | $Q_1$ | $u_2$ |
| If $u_1'u_2'u_3'u_4' = 1110$ & $u_{22} = 1$ | $h^{-1}(u_{11}u_{12}u_{13}, x_1x_2x_3)$ | 0 | 0 | $h'^{-1}(x_4x_5, u_{25}u_{26}u_{27})$ |
| If $u_1'u_2'u_3'u_4' = 1110$ & $u_{22} = 0$ | $h'^{-1}(x_4x_5, u_{11}u_{12}u_{13})$ | 0 | 0 | $h^{-1}(u_{25}u_{26}u_{27}, x_1x_2x_3)$ |
| If $u_1'u_2'u_3'u_4' = 0110$ & $u_{22}u_{23}$ not 11 | $u_1$ | | $u_{21}$ | $Q_2$ | $f^1(u_{25}u_{26}u_{27})$ |
| If $u_1'u_2'u_3'u_4' = 0110$ & $u_{22}u_{23} = 11$ | $u_1$ | | $u_{21}$ | $Q_3$ | 0 |
| If $u_1'u_2'u_3'u_4' = 0111$ & $u_{14}u_{15}$ not 11 | $f^1(u_{11}u_{12}u_{13})$ | $Q_4$ | $u_{17}$ | $u_2$ |
| If $u_1'u_2'u_3'u_4' = 0111$ & $u_{14}u_{15} = 11$ | 0 | $Q_5$ | $u_{17}$ | $u_2$ |
| If $u_1'u_2'u_3'u_4' = 1111$ | $g^{-1}(u_{11}u_{12}u_{13}u_{14}u_{15})$ | $Q_6$ | $u_{22}$ | $g^{-1}(u_{23}u_{24}u_{25}u_{26}u_{27})$ |

Where:

$$Q1 = \overline{u_2'} \wedge \overline{u_3'} \wedge u_4' \vee \overline{u_2'} \wedge u_3' \wedge \overline{u_4'} \vee u_2' \wedge \overline{u_3'} \wedge \overline{u_4'}$$

$$(x_1x_2x_3x_4x_5) = j^{-1}(u_{14}, u_{15}, u_{23}, u_{24})$$

$$Q2 = \overline{u_{22}} \wedge \overline{u_{23}} \wedge u_{24} \vee \overline{u_{22}} \wedge u_{23} \wedge \overline{u_{24}} \vee u_{22} \wedge \overline{u_{23}} \wedge \overline{u_{24}}$$

$$Q3 = \overline{u_{25}} \wedge \overline{u_{26}} \wedge u_{27} \vee \overline{u_{25}} \wedge u_{26} \wedge \overline{u_{27}} \vee u_{25} \wedge \overline{u_{26}} \wedge \overline{u_{27}}$$

$$Q4 = \overline{u_{14}} \wedge \overline{u_{15}} \wedge u_{16} \vee \overline{u_{14}} \wedge u_{15} \wedge \overline{u_{16}} \vee u_{14} \wedge \overline{u_{15}} \wedge \overline{u_{16}}$$

$$Q5 = \overline{u_{11}} \wedge \overline{u_{12}} \wedge u_{13} \vee \overline{u_{11}} \wedge u_{12} \wedge \overline{u_{13}} \vee u_{11} \wedge \overline{u_{12}} \wedge \overline{u_{13}}$$

$$Q6 = \overline{u_{16}} \wedge \overline{u_{17}} \wedge u_{21} \vee \overline{u_{16}} \wedge u_{17} \wedge \overline{u_{21}} \vee u_{16} \wedge \overline{u_{17}} \wedge \overline{u_{21}}$$

CODE 6

Referring again to FIGS. 32–35, an eighth embodiment of the code generator 154h is shown for encoding according to Code 6. Here, for describing the eighth embodiment of the code generator 154h, the same variables used above for Code 5. As best illustrated by FIG. 32, the eighth embodiment of the code generator 154h also receives a 16-bit word, $b_1(k) \ldots b_{16}(k)$ which is defined to be variable $B = (b_1, b', b_2)$ where $b_1 = b_{11}, \ldots, b_{17}$; $b_2 = b_{21}, \ldots, b_{27}$ and $b' = b'_1, b'_2$; and outputs a 18-bit word, $v_1(k) \ldots v_{18}(k)$, defined to be variable $U = (u_1, u', u_2)$ where $u_1 = u_{11}, \ldots, u_{17}$; $u_2 = u_{21}, \ldots, u_{27}$ and $u' = u'_1, u'_2, u'_3, u'_4$. Again, for convenience and ease of notation and understanding the variable U will also be referred to as variable a where $(u_{11}, \ldots, u_{17}, u'_1, u'_2, u'_3, u'_4, u_{21}, \ldots, u_{27}) = (a_1, \ldots, a_{18})$.

Referring now to FIG. 33, the eighth embodiment of the code generator 154h is shown in more detail. The eighth embodiment of the code generator 154h preferably comprises a partition unit 3300, a mapping unit 3302, and a modification unit 3306. As shown in FIG. 33, the partition unit 3300, the mapping unit 3302 and the modification unit 3306 are coupled to receive the input bits $(b_1, b', b_2)$. The partition unit 3300 determines which row of the encoder map to use for encoding and outputs G, a signal indicating the row of the encoder map to be used for encoding, to the mapping unit 3302 and the modification unit 3306. The mapping unit 3302 generates an output, D[1–18], from the encoder map using the G signal from the partitioning unit 3300 and the input bits $(b_1, b', b_2)$. The modification unit 3306 receives the input bits $(b_1, b', b_2)$, the G signal, and mapping unit 3302 output, D[1–18], and alters the bits from the mapping unit 3302, D[1–18], such that they will contain 0 mod 3 ones after precoding, thereby producing the encoded output word, $(u_1, u', u_2)$.

The partitioning unit 3300 takes as input the encoder input data bits $(b_1, b', b_2)$ of the encoder 12. The number of ones (the weight) in the input is summed and used in the equations shown below. The weight of the encoder input data $(b_1, b', b_2)$ is mapped, using the following equations, to values for G1–G11. G1–G11 are used to determine which row of the encoder map, shown in TABLE XVI, will be used in the mapping unit 3302. The eleven possible G values are mapped into four bits G'[1–4] and are the output of the partitioning unit 3300 in the variable G'. The equations used to generate the G'[1–4] are:

$R1 = \{(b1, b2): |b1| > 1$ AND $|b2| > 1$ AND $|b1| + |b2| > 5\}$ $R2 = \{(b1, b2): |b1| = 3$ AND $|b2| = 2\}$ $R3 = \{(b1, b2): |b1| = 2$ AND $|b2| = 3\}$ $R4 = \{(b1, b2): |b1| > 2$ AND $|b2| \leq 1\}$ $R5 = \{(b1, b2): |b1| > 1$ AND $|b2| > 2\}$ $R6 = \{(b1, b2): |b1| \leq 2$ AND $|b2| \leq 2\}$ Let $b' = (b1, b2)$ $A = \{(b1, b1', b2', b2): (b1, b2) R1$ OR $((b1, b2)$ in R2 and $b'$ not 00) OR $((b1, b2)$ in R3 and $b'$ not 00)\};

$A1 = \{(b1, b1', b2', b2)$ in $A: b17 = b1' = b2' = b21 = b22 = 0\}$ $A2 = \{(b1, b1', b2', b2)$ in $A: b1 = 11000000$ AND $b' = 00$ AND $b2$ is in $\{0110011, 0110110, 0111100\}\}$;

$A3 = \{(b1, b1', b2', b2)$ in $A: b_2 = 11000000\}$ $G1 = A - (A1 \cup A2 \cup A3)$ $G2 = \{(b1, b', b2): (b1, b2)$ in R2 AND $b' = 00\}$ $G3 = \{(b1, b', b2): (b1, b2)$ in R3 AND $b' = 00\}$ $G4 = \{(b1, b', b2): (b1, b2)$ in R4 AND b2 not 0000000)\}

$G5 = \{(b1, b', b2): (b1, b2)$ in R4 AND b2 = 0000000)\}

$G6 = \{(b1, b', b2): (b1, b2)$ in R5 AND b1 not 0000000)\}

$G7 = \{(b1, b', b2): (b1, b2)$ in R5 AND b1 = 0000000)\}

$G8 = \{(b1, b', b2): (b1, b2)$ in R6\}

$G9 = A1$ $G10 = A2$ $G11 = A3$

The mapping unit 3302 receives as input the encoder input $(b_1, b', b_2)$ as well as the 4 bits of the variable G', G'

[1–4], from the partitioning unit 3300. It uses the map shown below in TABLE XVI, to determine its output, D[1–18]. The mapping unit 3302 generates D[1–18], which comprises 15 of the 18 final encoder output bits ($u_1$,u',$u_2$); the three remaining encoder output bits are not finalized at this stage. Instead, three auxiliary bits (aux1, aux2, aux3) are generated. The locations and values of the auxiliary bits, as seen in TABLE XVI, depends on the variable G', as seen in TABLE XVII. For G'=10, the mapping unit 3302 generates all the 18 encoder output bits. The auxiliary bits will be modified to accomplish the 0 mod 3 requirement of the code. The auxiliary bits are chosen using TABLE XVII.

represents the number of ones mod 3 in the encoder output after precoding if the Table XVI values, D[1–18], are used as the encoder output. The second variable, M, represents the output of the precoder 14 for the codeword bit immediately to the left of the first auxiliary bit. Incidentally, the variable M is the state of the precoder 14 when the input to the precoder 14 is the first auxiliary bit. The variable M is used to determine the modification that will be made to the auxiliary bits to ensure 0 mod 3 ones in the output.

The relationships between the variables p[1–2] and M and the parallel precoder 3400 input D[1–18] and G'[1–4] can be described as follows:

TABLE XVI

Code 6 Encoder Output Map

| G' | D1 | D2 | D3 | D4 | D5 | D6 | D7 | D8 | D9 | D10 | D11 | D12 | D13 | D14 | D15 | D16 | D17 | D18 |
|---|---|---|---|---|---|---|---|---|---|---|---|---|---|---|---|---|---|---|
| 1 | b11 | b12 | b13 | b14 | b15 | b16 | b17 | b'1 | aux1 | aux2 | aux3 | b21 | b22 | b23 | b24 | b25 | b26 | b27 |
| 2 | l11 | l12 | l13 | p11 | p12 | aux1 | aux2 | 1 | 1 | 1 | 0 | aux3 | 1 | p13 | p14 | r11 | r12 | r13 |
| 3 | l21 | l22 | l23 | p21 | p22 | aux1 | aux2 | 1 | 1 | 1 | 0 | aux3 | 0 | p23 | p24 | r21 | r22 | r23 |
| 4 | b11 | b12 | b13 | b14 | b15 | b16 | b17 | 0 | 1 | 1 | 0 | b'1 | aux1 | aux2 | aux3 | q1 | q2 | q3 |
| 5 | b11 | b12 | b13 | b14 | b15 | b16 | b17 | 0 | 1 | 1 | 0 | b'1 | 1 | 1 | 1 | aux1 | aux2 | aux3 |
| 6 | m1 | m2 | m3 | aux1 | aux2 | aux3 | b'2 | 0 | 1 | 1 | 1 | b21 | b22 | b23 | b24 | b25 | b26 | b27 |
| 7 | aux1 | aux2 | aux3 | 1 | 1 | 1 | b'2 | 0 | 1 | 1 | 1 | b21 | b22 | b23 | b24 | b25 | b26 | b27 |
| 8 | t1 | t2 | t3 | t4 | t5 | aux1 | aux2 | 1 | 1 | 1 | 1 | aux3 | b'2 | c1 | c2 | c3 | c4 | c5 |
| 9 | b11 | b12 | b13 | b14 | b15 | aux1 | aux2 | 1 | 1 | 1 | 0 | aux3 | b16 | b23 | b24 | b25 | b26 | b27 |
| 10 | 1 | 0 | 0 | b24 | b25 | b26 | b27 | 0 | 1 | 1 | 0 | 1 | 1 | 1 | 0 | 1 | 1 | 1 |
| 11 | b11 | b12 | b13 | b14 | b15 | 1 | 1 | 1 | 1 | 1 | 1 | b'1 | b16 | b17 | 1 | b'2 | aux1 | aux2 |

TABLE XVII

Code 6 Auxiliary Bits

| G' | aux1 | aux2 | aux3 |
|---|---|---|---|
| 1 | 0 | 0 | 0 |
| 2 | 0 | 1 | 1 |
| 3 | 0 | 1 | 1 |
| 4 | 0 | 0 | $b_2'$ |
| 5 | 0 | 0 | $b_2'$ |
| 6 | 0 | 0 | $b_1'$0 |
| 7 | 0 | 0 | $b_1'$ |
| 8 | 0 | 0 | $b_1'$ |
| 9 | 0 | 0 | 1 |
| 10 | x | x | x |
| 11 | 0 | 0 | x |

It should be noted that the values for TABLE XVI, other than the auxiliary bits (aux1, aux2, aux3) are generated using the same equations an maps as specified above for Code 5.

Referring now to FIG. 34, the preferred embodiment for the modification unit 3306 will be described. As noted above, the modification unit 3306 receives the input bits ($b_1$,b',$b_2$) (more particularly the two bits of b'), the G'[1–4] bits from the partition unit 3300, and the output bits D[1–18] from the mapping unit 3302, and generates the encoded output word, ($u_1$,u',$u_2$) such that it will contain 0 mod 3 ones after precoding. The modification unit 3306 essentially changes the auxiliary bits of D[1–18] such that after precoding the bits will have 0 mod 3 ones. The modification unit 3306 preferably comprises a parallel precoder 3400, an auxiliary bit selector 3402 and an output multiplexer 3406.

As shown in FIG. 34, the parallel precoder 3400 has inputs coupled to receive the output bits, D[1–18], of the mapping unit 3302, which includes the 3 auxiliary bits, and the variable G' as input. From these inputs the parallel precoder 3400 generates two variables: a 2-bit variable p[1–2] and 1-bit variable M. The first variable, p[1–2], $$p[1-2] = \begin{cases} 00 & \text{if } S = \sum_{j=1}^{18} b_j = 0 \bmod 3, \\ 01 & \text{if } S = \sum_{j=1}^{18} b_j = 1 \bmod 3, \\ 10 & \text{if } S = \sum_{j=1}^{18} b_j = 2 \bmod 3, \end{cases}$$

where $b_i = a_i \oplus b_{i-1}$ for i>1, and $b_1 = a_1$.

The variable p[1–2] is a binary representation of the ternary variable S. To reduce the time necessary to compute S, the above sum is broken into three sums and then it is simplified as follows:

First, let pre1[1–6], pre2[1–6], and pre3[1–6] be defined as follows.

pre1[1]=D[1]

pre1[2]=D[1]⊕D[2]

pre1[3]=D[1]⊕D[2]⊕D[3]  (EQ16)

pre1[4]=D[1]⊕D[2]⊕D[3]⊕D[4]

pre1[5]=D[1]⊕D[2]⊕D[3]⊕D[4]⊕D[5]

pre1[6]=D[1]⊕D[2]⊕D[3]⊕D[4]⊕D[5]⊕D[6]

pre2[1]=D[7]

pre2[2]=D[7]⊕D[8]

pre2[3]=D[7]⊕D[8]⊕D[9]  (EQ17)

pre2[4]=D[7]⊕D[8]⊕D[9]⊕D[10]

pre2[5]=D[7]⊕D[8]⊕D[9]⊕D[10]⊕D[11]

pre2[6]=D[7]⊕D[8]⊕D[9]⊕D[10]⊕D[11]⊕D[12]

pre3[2]=D[13]⊕D[14]

pre3[3]=D[13]⊕D[14]⊕D[15]  (EQ18)

pre3[4]=D[13]⊕D[14]⊕D[15]⊕D[16]

pre3[5]=D[13]⊕D[14]⊕D[15]⊕D[16]⊕D[17]

pre3[6]=D[13]⊕D[14]⊕D[15]⊕D[16]⊕D[17]⊕D[18]

Further, let $D_i$ denote D[i]. Then, $$S = \sum_{\substack{i=1 \\ \text{mod3}}}^{18} \sum_{\substack{j=1 \\ \text{mod2}}}^{i} D_j = \sum_{\substack{i=1 \\ \text{mod3}}}^{6} \sum_{\substack{j=1 \\ \text{mod2}}}^{i} D_j + \sum_{\substack{i=7 \\ \text{mod3}}}^{12} \sum_{\substack{j=1 \\ \text{mod2}}}^{i} D_j + \sum_{\substack{i=13 \\ \text{mod3}}}^{18} \sum_{\substack{j=1 \\ \text{mod2}}}^{i} D_j \quad \text{mod 3}$$

$$= \sum_{\substack{i=1 \\ \text{mod 3}}}^{6} \sum_{\substack{j=1 \\ \text{mod 2}}}^{i} D_j + $$

$$C1 \left( \sum_{\substack{i=7 \\ \text{mod 3}}}^{12} \sum_{\substack{j=7 \\ \text{mod 2}}}^{i} D_j \right) + C2 \left( \sum_{\substack{i=13 \\ \text{mod 3}}}^{18} \sum_{\substack{j=13 \\ \text{mod 2}}}^{i} D_j \right)$$

$$= \sum_{\substack{i=1 \\ \text{mod 3}}}^{6} pre1[i] + C1 \left( \sum_{\substack{i=7 \\ \text{mod 3}}}^{12} pre2[i] \right) + C2 \left( \sum_{\substack{i=13 \\ \text{mod 3}}}^{18} pre3[i] \right) \quad \text{mod 3}$$

In the above, C1=-2pre1[6]+1, and C2=-2(pre1[6]⊕pre2[6])+1.

Letting S1, S2, and S3 to represent $$S1 = \sum_{\substack{i=1 \\ \text{mod 3}}}^{6} pre1[i], \quad (4)$$

$$S2 = \sum_{\substack{i=7 \\ \text{mod 3}}}^{12} pre2[i], \quad (5)$$

$$S3 = \sum_{\substack{i=13 \\ \text{mod 3}}}^{18} pre3[i], \quad (6)$$

we rewrite S as $$S=S1+C1 \times S2+C2 \times S3. \quad \text{mod 3}$$

We let 2-bits variables p1[1-2], p2[1-2], and p3[1-2] denote binary representations of the ternary variable S1, S2 and S3, respectively, i.e., for i=1, 2, and 3.

$$pi[1-2] = \begin{cases} 00 & \text{if } Si = 0 \text{ mod 3}, \\ 01 & \text{if } Si = 1 \text{ mod 3}, \\ 10 & \text{if } Si = 2 \text{ mod 3}. \end{cases}$$

To further reduce the total calculation time, we note that if mod 3 values of 0, 1, and 2 are mapped onto 2-bits variables as in the above, identifying 11 with 00, -pi[1-2] can be accomplished by a simple inversion of pi[1-2] bits.

Referring now to FIG. 35, a preferred embodiment for the parallel precoder 3400 is shown. The parallel precoder 3400 comprises a plurality of six-bit precoders 3500, 3502, 3504, a plurality of six-bit mod 3 adders 3508, 3510, 3512, 3516, a M multiplexer 3514, an exclusive-OR gate 3524, inverters 3526, 3522 and multiplexers 3518, 3520. The output bits D[1–18] from the mapping unit 3302 are broken into 3 sets: D[1–6], D[7–12], and D[13–18]. These three six-bits sets are input to respective six-bit precoders 3500, 3502, 3504 that generate the output signals pre1[1–6], pre2[1–6], respectively, based on equations EQ16–EQ18 above. The outputs of each of the six-bit precoders 3500, 3502, 3504 are coupled to a respective six-bit mod 3 adders 3508, 3510, 3512 to generate sums, S1, S2, and S3 which are output by the six-bit mod 3 adders 3508, 3510, 3512 as p1[1–2], p2[1–2], and pr[1–2], respectively.

The signals p2[1–2] and p3[1–2], are inverted by inverters 3526 and 3522 respectively. The signals p2[1–2] and p3[1–2], and their inverses are applied to the inputs of the multiplexers 3518 and 3520. Based on the value of C1=-2pre1[6]+1 and C2=-2(pre1[6]⊕pre2[6])+1, the output of the multiplexers 3518 and 3520, respectively, p2'[1–2] and p3'[1–2] are generated. More specifically, p2'[1]p2'[2]=p2[1]p2[2], if C1=1, (or equivalently pre1[6]=0,)

p2'[1]p2'[2]=(p2[1])$^c$(p2[2])$^c$, if C1=-1, (or equivalently pre1[6]=1,)

p3'[1]p3'[2]=p3[1]p3[2], if C2=1, (or equivalently pre1[6]⊕pre2[6]=0,) and p3'[1]p3'[2]=(p3[1])$^c$(p3[2])$^c$, if C2=-1 (or equivalently pre1[6]⊕pre2[6]=1).

Thus, the pre1[6] signal is used as the select control input to multiplexer 3518, and the result of exclusive-ORing the pre1[6] signal with the pre2[6] signal is used as the select control input to multiplexer 3520. The output of the six-bit mod 3 adder 3508, and the multiplexers 3518 and 3520 are then concatenated, and input to the six-bit mod 3 adder 3516. Finally, the variable p[1–2] is computed by the six-bit mod 3 adder 3516 based on TABLE XVIII.

TABLE XVIII

| p1[1-2] | p2'[1-2] | p3'[1-2] | p[1-2] |
|---------|----------|----------|--------|
| 00 | 00 | 00 | 00 |
| 00 | 00 | 01 | 01 |
| 00 | 00 | 10 | 10 |
| 00 | 01 | 00 | 01 |
| 00 | 01 | 01 | 10 |
| 00 | 01 | 10 | 00 |
| 00 | 10 | 00 | 10 |
| 00 | 10 | 01 | 00 |
| 00 | 10 | 10 | 01 |
| 01 | 00 | 00 | 01 |
| 01 | 00 | 01 | 10 |
| 01 | 00 | 10 | 00 |
| 01 | 01 | 00 | 10 |
| 01 | 01 | 01 | 00 |
| 01 | 01 | 10 | 01 |
| 01 | 10 | 00 | 00 |
| 01 | 10 | 01 | 01 |
| 01 | 10 | 10 | 10 |
| 10 | 00 | 00 | 10 |
| 10 | 00 | 01 | 00 |
| 10 | 00 | 10 | 01 |
| 10 | 01 | 00 | 00 |
| 10 | 01 | 01 | 01 |
| 10 | 01 | 10 | 10 |
| 10 | 10 | 00 | 01 |
| 10 | 10 | 01 | 10 |
| 10 | 10 | 10 | 00 |

Referring to FIG. 35, the variable M is computed in the parallel precoder 3400 by the M multiplexer 3514. The M multiplexer 3514 is coupled to receive signals pre1[3,5,6] from six-bit precoder 3500, pre2[2,6] from six-bit precoder 3502, pre3[3,4] from six-bit precoder 3504, and bit G'[1–4], and it generates M based on the below equations:

$$\text{if } G' = 0001, \text{ then } M = \sum_{j=1}^{8} D_j(\text{mod}2) = pre1[6] \oplus pre2[2],$$

auxiliary bits. The significance of the new auxiliary bits (aux'[1–3]) is that if the original auxiliary bits (aux[1–3]) are replaced by the new auxiliary bits (aux'[1–3]), then the number of ones after precoding will be 0 mod 3 over the length of each codeword. Note that if the variable p, the number of ones mod 3, is equal to zero, then no modification need to take place and the auxiliary bit selector 3402 merely passes the current auxiliary bits through to the output (aux').

TABLE XIX

| p = 01 M = 0 | | p = 10 M = 0 | | p = 01 M = 1 | | p = 10 M = 1 | | G' |
|---|---|---|---|---|---|---|---|---|
| 0 | 1 | ~b'2 | 1 | 0 | ~b'2 | 1 | 0 | ~b'2 | 0 | 1 | ~b'2 | 1 |
| 1 | 0 | 1 | 1 | 1 | 0 | 1 | 1 | 0 | 1 | 0 | 1 | 2 |
| 1 | 0 | 1 | 1 | 1 | 0 | 1 | 1 | 0 | 1 | 0 | 1 | 3 |
| 0 | 1 | ~b'2 | 1 | 0 | ~b'2 | 1 | 0 | ~b'2 | 0 | 1 | ~b'2 | 4 |
| 0 | 1 | ~b'2 | 1 | 0 | ~b'2 | 1 | 0 | ~b'2 | 0 | 1 | ~b'2 | 5 |
| 0 | 1 | ~b'1 | 1 | 0 | ~b'1 | 1 | 0 | ~b'1 | 0 | 1 | ~b'1 | 6 |
| 0 | 1 | ~b'1 | 1 | 0 | ~b'1 | 1 | 0 | ~b'1 | 0 | 1 | ~b'1 | 7 |
| 0 | 1 | ~b'1 | 1 | 0 | ~b'1 | 1 | 0 | ~b'1 | 0 | 1 | ~b'1 | 8 |
| 1 | 1 | 1 | 0 | 1 | 0 | 0 | 1 | 0 | 1 | 1 | 1 | 9 |
| x | x | x | x | x | x | x | x | x | x | x | x | 10 |
| 1 | 1 | x | 1 | 0 | x | 1 | 0 | x | 1 | 1 | x | 11 |

-continued $$\text{if } G' = 0010, \text{ then } M = \sum_{j=1}^{5} D_j(\text{mod}2) = pre1[5]$$

$$\text{if } G' = 0011, \text{ then } M = \sum_{j=1}^{5} D_j(\text{mod}2) = pre1[5]$$

$$\text{if } G' = 0100, \text{ then } M = \sum_{j=1}^{12} D_j(\text{mod}2) = pre1[6] \oplus pre2[6]$$

$$\text{if } G' = 0101, \text{ then } M = \sum_{j=1}^{15} D_j(\text{mod}2) = pre1[6] \oplus pre2[6] \oplus pre3[3]$$

$$\text{if } G' = 0110, \text{ then } M = \sum_{j=1}^{3} D_j(\text{mod}2) = pre1[3]$$

$$\text{if } G' = 0111, \text{ then } M = 0$$

$$\text{if } G' = 1000, \text{ then } M = \sum_{j=1}^{5} D_j(\text{mod}2) = pre1[5]$$

$$\text{if } G' = 1001, \text{ then } M = \sum_{j=1}^{5} D_j(\text{mod}2) = pre1[5]$$

$$\text{if } G' = 1010, \text{ then } M = 0$$

$$\text{if } G' = 1011, \text{ then } M = \sum_{j=1}^{16} D_j(\text{mod}2) = pre1[6] \oplus pre2[6] \oplus pre3[4]$$

Referring back to FIG. 34, the coupling of the auxiliary bit selector 3402 is also shown. The auxiliary bit selector 3402 has inputs coupled to receive the G'[1–4] from the partition unit 3300 and b' of the input bits. The auxiliary bit selector 3402 also receives the p[1–2] and M signals from the parallel precoder 3400. In order to ensure 0 mod 3 ones in the final output, the auxiliary bit selector 3402 modifies the auxiliary bits. The auxiliary bit selector 3402 generates 3 new auxiliary bits (aux'[1–3])according to the TABLE XIX below. The output of the auxiliary bit selector 3402 is coupled to the output multiplexer 3406 to provide the new Referring again to FIG. 34, the coupling of the output multiplexer 3406 will be described. The output multiplexer 3406 is preferably coupled to the auxiliary bit selector 3402 to receive the modified auxiliary bits (aux'[1–3]) from the auxiliary bit selector 3402, the G'[1–4] from the partition unit 3300, and the D[1–18] from the mapping unit 3302. The output multiplexer 3406 preferably combines the modified auxiliary bits, aux'[1–3], and the output bits, D[1–18], from the mapping unit 3302. The output multiplexer 3406 uses variable G' from the partition unit 3300 as a control signal to determine where the auxiliary bits, aux'[1–3], are placed in the final encoder output ($u_1$,u',$u_2$). The modified auxiliary bits are placed in the same positions as the original auxiliary bits (aux[1–3]) in TABLE XVI. This output is then used as the final encoder output ($u_1$,u',$u_2$).

Referring now to FIG. 36, a fifth embodiment of the code de-converter 502h constructed according to the present invention to decode words encoded using Code 6 is shown. The Code 6 de-converter 502h is defined here in terms of the same variables used for encoding namely that an encoded 18-bit word, $u_1(k)$ . . . $u_{18}(k)$, defined to be variable U=($u_1$,u',$u_2$) where $u_1=u_{11}$, . . . ,$u_{17}$; $u_2=u_{21}$, . . . ,$u_{27}$ and u'=$u'_1$,$u'_2$,$u'_3$,$u'_4$ is received by the Code 6 de-converter 502h, and in response the Code 6 de-converter 502h generates a 16-bit word, $b'_1(k)$ . . . $b'_{16}(k)$ which is defined to be variable B=($b_1$, b', $b_2$) where $b_1=b_{11}$, . . . ,$b_{17}$; $b_2=b_{21}$, . . . , $b_{27}$ and u'=$u'_1$,$u'_2$, as best illustrated in FIG. 36. The Code 6 de-converter 502h preferably is constructed similar the Code 4 de-converter 502e shown in FIG. 31 in that the Code 6 de-converter 502h comprises a partitioning unit and a mapping unit. Since such a configuration has been described above for codes 4 and 5, the description here of the Code 6 de-converter 502h will be limited to the partitioning identified by column 1 of TABLE XX below, and the mapping shown in columns 2 through 5 of TABLE XX. The mapping unit preferably uses the following equations to decode the input signal and re-produce the original signal.

TABLE XX

Code 6 Decoder Map

| | $b_1$ | $b_1'$ | $b_2'$ | $b_2$ |
|---|---|---|---|---|
| If $u_2'u_3'$ not 11 | $u_1$ | $u_1'$ | $Q_1$ | $u_2$ |
| If $u_1'u_2'u_3'u_4' = 1110$ & $u_{22} = 1$ & flag = 1 | $h^{-1}(u_{11}u_{12}u_{13},x_1x_2x_3)$ | 0 | 0 | $h^{-1}(x_4x_5,u_{25}u_{26}u_{27})$ |
| If $u_1'u_2'u_3'u_4' = 1110$ & $u_{22} = 0$ & flag = 1 | $h^{-1}(x_4x_5,u_{11}u_{12}u_{13})$ | 0 | 0 | $h^{-1}(u_{25}u_{26}u_{27},x_1x_2x_3)$ |
| If $u_1'u_2'u_3'u_4' = 0110$ & $u_{22}u_{23}$ not 11 | $u_1$ | $u_{21}$ | $Q_2$ | $f^{-1}(u_{25}u_{26}u_{27})$ |
| If $u_1'u_2'u_3'u_4' = 0110$ & ($u_{22}u_{23}u_{24} = 111$ or $u_{22}u_{23}u_{24}u_{25} = 1100$) | $u_1$ | $u_{21}$ | $Q_3$ | 0 |
| If $u_1'u_2'u_3'u_4' = 0111$ & $u_{14}u_{15}$ not 11 | $f^{-1}(u_{11}u_{12}u_{13})$ | $Q_4$ | $u_{17}$ | $u_2$ |
| If $u_1'u_2'u_3'u_4' = 0111$ & $u_{14}u_{15} = 11$ | 0 | $Q_5$ | $u_{17}$ | $u_2$ |
| If $u_1'u_2'u_3'u_4' = 1111$ & $u_{16}u_{17}$ not 11 | $g^{-1}(u_{11}u_{12}u_{13}u_{14}u_{15})$ | $Q_6$ | $u_{22}$ | $g^{-1}(u_{23}u_{24}u_{25}u_{26}u_{27})$ |
| If $u_1'u_2'u_3'u_4' = 1110$ & flag = 0 | $u_{11}u_{12}u_{13}u_{14}u_{15}u_{22}0$ | 0 | 0 | $00u_{23}u_{24}u_{25}u_{26}u_{27}$ |
| If $u_1'u_2'u_3'u_4' = 0110$ & $u_{22}u_{23}u_{24}u_{25} = 1101$ | 1100000 | 0 | 0 | $011u_{14}u_{15}u_{16}u_{17}$ |
| If $u_1'u_2'u_3'u_4' = 1111$ & $u_{16}u_{17} = 11$ | $u_{11}u_{12}u_{13}u_{14}u_{15}u_{22}u_{23}$ | $u_{21}$ | $u_{25}$ | 1100000 |

Where:

$Q1 = \overline{u_2'} \wedge \overline{u_3'} \wedge u_4' \vee \overline{u_2'} \wedge u_3' \wedge \overline{u_4'} \vee u_2' \wedge \overline{u_3'} \wedge \overline{u_4'}$ $(x_1x_2x_3x_4x_5) = j^{-1}(u_{14}, u_{15}, u_{23}, u_{24})$, $Q2 = \overline{u_{22}} \wedge \overline{u_{23}} \wedge u_{24} \vee \overline{u_{22}} \wedge u_{23} \wedge \overline{u_{24}} \vee u_{22} \wedge \overline{u_{23}} \wedge \overline{u_{24}}$, $Q3 = \overline{u_{25}} \wedge \overline{u_{26}} \wedge u_{27} \vee \overline{u_{25}} \wedge u_{26} \wedge \overline{u_{27}} \vee u_{25} \wedge \overline{u_{26}} \wedge \overline{u_{27}}$, $Q4 = \overline{u_{14}} \wedge \overline{u_{15}} \wedge u_{16} \vee \overline{u_{14}} \wedge u_{15} \wedge \overline{u_{16}} \vee u_{14} \wedge \overline{u_{15}} \wedge \overline{u_{16}}$, $Q5 = \overline{u_{11}} \wedge \overline{u_{12}} \wedge u_{13} \vee \overline{u_{11}} \wedge u_{12} \wedge \overline{u_{13}} \vee u_{11} \wedge \overline{u_{12}} \wedge \overline{u_{13}}$, $Q6 = \overline{u_{16}} \wedge \overline{u_{17}} \wedge u_{21} \vee \overline{u_{16}} \wedge u_{17} \wedge \overline{u_{21}} \vee u_{16} \wedge \overline{u_{17}} \wedge \overline{u_{21}}$, $\text{flag} = \overline{u_{16}} \wedge u_{17} \wedge u_{21} \vee u_{16} \wedge \overline{u_{17}} \wedge u_{21} \vee u_{16} \wedge u_{17} \wedge \overline{u_{21}}$, and where the mapping and equations for generating the values of TABLE XX are the same as those identified above for Code 5.

CODE 7

Referring again to FIGS. 28–31, an ninth embodiment of the code generator will be described. For simplicity and ease of understanding, the description of the Code 7 code generator will focus on those aspects that are different from the Codes 4'–6. For example, Code 7 uses the same maps and equations as the f map; the $f^{-1}$ map; the g map, and the $g^{-1}$ map described above for Code 5, and has the same general structure as the code generator 154e for Code 4, and uses the same variable definitions as code 4. Therefore, they will not be described again here. For convenience and ease of notation and understanding, the variable U will also be referred to as variable a where $(b_1, y_1\ y_2, b_2) = (a_1, \ldots, a_{18})$.

Code 7 differs from the previous codes in the following respects. First, the partition is defined by the following equations:

Partition of data words: $(b_1, y, b_2)$ $R1 = \{(b_1, b_2) : |b_1| \geq 2 \text{ AND } |b_2| + |b_2| \geq 6\}$ $R2 = \{(b_1, b_2) : |b_1| = 3 \text{ AND } |b_2| = 2\}$ $R3 = \{(b_1, b_2) : |b_1| = 2 \text{ AND } |b_2| = 3\}$ $R4 = \{(b_1, b_2) : |b_1| \geq 3 \text{ AND } |b_2| \leq 1\}$ $R5 = \{(b_1, b_2) : |b_1| \leq 1 \text{ AND } |b_2| \geq 3\}$ $R6 = \{(b_1, b_2) : |b_1| \leq 2 \text{ AND } |b_2| \leq 2\}$ Let $y = (y_1, y_2)$ G1 = {$(b_1, y, b_2):(b_1, b_2)$ in R1 OR $((b_1, b_2)$ in R2 and y not 00) OR $((b_1, b_2)$ in R3 and y not 00)}

G2 = {$(b_1, y, b_2):(b_1, b_2)$ in R2 AND y=00}

G3 = {$(b_1, y, b_2):(b_1, b_2)$ in R3 AND y=00}

G4 = {$(b_1, y, b_2):(b_1, b_2)$ in R4}

G5 = {$(b_1, y, b_2):(b_1, b_2)$ in R5}

G6 = {$(b_1, y, b_2):(b_1, b_2)$ in R6}

Second, the mapping unit performs the mapping from row to row according to the map defined below in TABLE XXI

TABLE XXI

Encoder Map For Code 7

| if in | $u_{11}$ | $u_{12}$ | $u_{13}$ | $u_{14}$ | $u_{15}$ | $u_{16}$ | $u_{17}$ | $v_1$ | $v_2$ | $v_3$ | $v_4$ | $u_{21}$ | $u_{22}$ | $u_{23}$ | $u_{24}$ | $u_{25}$ | $u_{26}$ | $u_{27}$ | # ones |
|---|---|---|---|---|---|---|---|---|---|---|---|---|---|---|---|---|---|---|---|
| G1 | $b_{11}$ | $b_{12}$ | $b_{13}$ | $b_{14}$ | $b_{15}$ | $b_{16}$ | $b_{17}$ | $y_1$ | $\overline{W}$ | w | $y_2$ | $b_{21}$ | $\underline{b_{22}}$ | $b_{23}$ | $b_{24}$ | $b_{25}$ | $b_{26}$ | $b_{27}$ | $\geq 7$ |
| G2 | $l_{11}$ | $l_{12}$ | $l_{13}$ | $l_{14}$ | $l_{15}$ | $l_{16}$ | $r_{11}$ | 0 | 1 | 1 | 0 | 1 | $\overline{W}$ | w | $r_{12}$ | $r_{13}$ | $r_{14}$ | $r_{15}$ | $\geq 9$ |
| G3 | $r_{21}$ | $r_{22}$ | $r_{23}$ | $r_{24}$ | $r_{25}$ | $l_{21}$ | $l_{22}$ | 0 | 1 | 1 | 0 | 0 | $\overline{W}$ | w | $l_{23}$ | $l_{24}$ | $l_{25}$ | $l_{26}$ | $\geq 8$ |
| G4 | $b_{11}$ | $b_{12}$ | $b_{13}$ | $b_{14}$ | $\underline{b_{15}}$ | $b_{16}$ | $b_{17}$ | 1 | 1 | 1 | 0 | $y_1$ | $\overline{W}$ | w | $y_2$ | $q_1$ | $q_2$ | $q_3$ | $\geq 7$ |
| G5 | $\underline{m_1}$ | $m_2$ | $m_3$ | $y_1$ | $\overline{W}$ | w | $y_2$ | 0 | 1 | 1 | 1 | $b_{21}$ | $b_{22}$ | $b_{23}$ | $b_{24}$ | $b_{25}$ | $b_{26}$ | $b_{27}$ | $\geq 7$ |
| G6 | $\overline{W}$ | $t_1$ | $t_2$ | $t_3$ | $t_4$ | $t_5$ | $y_1$ | 1 | 1 | 1 | 1 | $y_2$ | $c_1$ | $c_2$ | $c_3$ | $c_4$ | $c_5$ | w | $\geq 7$ | where:

w is in $\{0, 1\}$ and is chosen such that $a_2 \oplus a_4 \oplus \ldots \oplus a_{18}=0$ (note that $(a_1, a_2, \ldots, a_{18})=(u_1, v, u_2)$)

$(q_1, q_2, q_3) = f(b_2)$ $(m_1, m_2, m_3) = f(b_1)$ $(l_{11}, l_{12}, l_{13}, l_{14}, l_{15}, l_{16})$ = 6-bit binary representation of $h_1(b_1)$ $(l_{21}, l_{22}, l_{23}, l_{24}, l_{25}, l_{26})$ = 6-bit binary representation of $h_1(b_2)$ $(r_{11}, r_{12}, r_{13}, r_{14}, r_{15})$ = 5-bit binary representation of $g(b_2)$ $(r_{21}, r_{22}, r_{23}, r_{24}, r_{25})$ = 5-bit binary representation of $g(b_1)$ $(t_1, t_2, t_3, t_4, t_5) = g(b_1)$ $(c_1, c_2, c_3, c_4, c_5) = g(b_2)$ and the $h_1$ and $h^{-1}_1$ maps are defined as follows:

let $x = x_1 x_2 x_3 x_4 x_5 x_6 x_7$;

$h_1$:

$h_1(x) = x_1 x_2 x_3 x_4 x_5 x_6 x_7$ if $x_4=0$, and $h_1(x) = \overline{x_1 x_2 x_3 x_4 x_5 x_6 x_7}$ if $x_4=1$.

$h^{-1}_1$:

for $\underline{y} = (y_1 \ldots y_6)$ $h^{-1}_1(\underline{y}) = y_1 y_2 y_3 0 y_4 y_5 y_6$ if $W(\underline{y})=3$ $h^{-1}_1(\underline{y}) = \overline{y_1 y_2 y_3} 1 \overline{y_4 y_5 y_6}$ if $W(\underline{y})=4$ Third, the code de-converter for Code 7 performs the mapping from row to row according to the map defined below in TABLE XXII.

TABLE XXII

Decoder Map For Code 7

| | $b_1$ | $y_1$ | $y_2$ | $b_2$ |
|---|---|---|---|---|
| If $v_2 v_3$ not 11 | $u_1$ | $v_1$ | $v_4$ | $u_2$ |
| If $v_1 v_2 v_3 v_4 = 0110$ & $u_{21} = 1$ | $h_1^{-1}(u_{11} u_{12} u_{13} u_{14} u_{15} u_{16})$ | 0 | 0 | $g^{-1}(u_{17} u_{24} u_{25} u_{26} u_{27})$ |
| If $v_1 v_2 v_3 v_4 = 0110$ & $u_{21} = 0$ | $g^{-1}(u_{11} u_{12} u_{13} u_{14} u_{15})$ | 0 | 0 | $h_1^{-1}(u_{16} u_{17} u_{24} u_{25} u_{26} u_{27})$ |
| If $v_1 v_2 v_3 v_4 = 1110$ | $u_1$ | $u_{21}$ | $u_{24}$ | $f^{-1}(u_{25} u_{26} u_{27})$ |
| If $v_1 v_2 v_3 v_4 = 0111$ | $f^{-1}(u_{11} u_{12} u_{13})$ | $u_{14}$ | $u_{17}$ | $u_2$ |
| If $v_1 v_2 v_3 v_4 = 1111$ | $g^{-1}(u_{12} u_{13} u_{14} u_{15} u_{16})$ | $u_{17}$ | $u_{21}$ | $g^{-1}(u_{22} u_{23} u_{24} u_{25} u_{26})$ |

CODE 8

Similar to Code 7, Code 8 will be described below primarily by reference to portions of the Codes 1–7 already described above, and by highlighting the differences between the previous codes and Code 8. Code 8 uses the same a variable notation as Codes 4 and 7 for defining the input and output signals. Code 8 also uses the same partitioning as Code 4, but limited to G1 to G8; and the same auxiliary maps as Code 4 as described above in TABLES V through IX.

However, Code 8 preferably encodes using the map defined by TABLE XXIII.

TABLE XXIII

Encoder Map For Code 8

| | $u_{11}$ | $u_{12}$ | $u_{13}$ | $u_{14}$ | $u_{15}$ | $u_{16}$ | $u_{17}$ | $v_1$ | $v_2$ | $v_3$ | $v_4$ | $u_{21}$ | $u_{22}$ | $u_{23}$ | $u_{24}$ | $u_{25}$ | $u_{26}$ | $u_{27}$ | #1's |
|---|---|---|---|---|---|---|---|---|---|---|---|---|---|---|---|---|---|---|---|
| $B \in G1$ | $b_{11}$ | $b_{12}$ | $b_{13}$ | $b_{14}$ | $b_{15}$ | $b_{16}$ | $b_{17}$ | $d_1$ | $d_2$ | $d_3$ | $d_4$ | $b_{21}$ | $b_{22}$ | $b_{23}$ | $b_{24}$ | $b_{25}$ | $b_{26}$ | $b_{27}$ | $\geq 8$ |
| $B \in G2$ | $l_{11}$ | $l_{12}$ | $l_{13}$ | $p_{11}$ | $p_{12}$ | $z_1$ | $z_2$ | 1 | 0 | 1 | 1 | P | $z_3$ | $p_{13}$ | $p_{14}$ | $r_{11}$ | $r_{12}$ | $r_{13}$ | $\geq 8$ |
| $B \in G3$ | $l_{21}$ | $l_{22}$ | $l_{23}$ | $p_{21}$ | $p_{22}$ | $z_1$ | $z_2$ | 0 | 1 | 1 | 1 | P | $z_3$ | $p_{23}$ | $p_{24}$ | $r_{21}$ | $r_{22}$ | $r_{23}$ | $\geq 8$ |
| $B \in G4$ | $b_{11}$ | $b_{12}$ | $b_{13}$ | $b_{14}$ | $b_{15}$ | $b_{16}$ | $b_{17}$ | 0 | 0 | 0 | 1 | 1 | $q_1$ | $q_2$ | $q_3$ | $q_4$ | $q_5$ | P | $\geq 8$ |
| $B \in G5$ | $b_{11}$ | $b_{12}$ | $b_{13}$ | $b_{14}$ | $b_{15}$ | $b_{16}$ | $b_{17}$ | 0 | 1 | 0 | 0 | 1 | $q_1$ | $q_2$ | $q_3$ | $q_4$ | $q_5$ | P | $\geq 8$ |
| $B \in G6$ | $m_1$ | P | $m_2$ | $m_3$ | $m_4$ | $m_5$ | 1 | 1 | 0 | 0 | 0 | $b_{21}$ | $b_{22}$ | $b_{23}$ | $b_{24}$ | $b_{25}$ | $b_{26}$ | $b_{27}$ | $\geq 8$ |
| $B \in G7$ | $m_1$ | P | $m_2$ | $m_3$ | $m_4$ | $m_5$ | 1 | 0 | 0 | 1 | 0 | $b_{21}$ | $b_{22}$ | $b_{23}$ | $b_{24}$ | $b_{25}$ | $b_{26}$ | $b_{27}$ | $\geq 8$ |
| $B \in G8$ | $t_1$ | $t_2$ | $t_3$ | $t_4$ | $t_5$ | $k_1$ | $k_2$ | 1 | 1 | 1 | 1 | $k_3$ | $k_4$ | $c_1$ | $c_2$ | $c_3$ | $c_4$ | $c_5$ | $\geq 8$ |

Where,

P is chosen such that the following equation is satisfied:

$$u_{12} \oplus u_{14} \oplus u_{16} \oplus v_1 \oplus v_3 \oplus u_{21} \oplus u_{23} \oplus u_{25} \oplus u_{27} = 0$$

$$d_1, d_2, d_3, d_4 \in \begin{cases} s1 = \{1110, 1010, 0101, 1011\}, P_1 = 0 \\ s2 = \{1001, 1100, 0110, 0011\}, P_1 = 1 \end{cases}$$

where $$P_1 = u_{12} \oplus u_{14} \oplus u_{16} \oplus u_{21} \oplus u_{23} \oplus u_{25} \oplus u_{27}$$

$$k_1, k_2, k_3, k_4 \in \begin{cases} s1 = \{1110, 1010, 0101, 1011\}, P_2 = 0 \\ s2 = \{1001, 1100, 0110, 0011\}, P_2 = 1 \end{cases}$$

where $$P_2 = u_{12} \oplus u_{14} \oplus u_{23} \oplus u_{25} \oplus u_{27}$$

and the remaining values of TABLE XXIII are determined using the same equations defined above for Code 4 as part of TABLE IV on page 36–37. Code 8 as described by TABLE XXIII has $\hat{N}=8$, $Z=10$.

Furthermore, the code de-converter for Code 8 consists of eight maps as defined below in TABLE XXIV.

TABLE XXIV

Decoder Map For Code 8

| | $b_{11}$ | $b_{12}$ | $b_{13}$ | $b_{14}$ | $b_{15}$ | $b_{16}$ | $b_{17}$ | $y_1$ | $y_2$ | $b_{21}$ | $b_{22}$ | $b_{23}$ | $b_{24}$ | $b_{25}$ | $b_{26}$ | $b_{27}$ |
|---|---|---|---|---|---|---|---|---|---|---|---|---|---|---|---|---|
| $\underline{v} \in S_1$ or $S_2$ | $u_{11}$ | $u_{12}$ | $u_{13}$ | $u_{14}$ | $u_{15}$ | $u_{16}$ | $u_{17}$ | $v_1$ | $Q_1$ | $u_{21}$ | $u_{22}$ | $u_{23}$ | $u_{24}$ | $u_{25}$ | $u_{26}$ | $u_{27}$ |
| $v = 1011$ | $HL_1$ | $HL_2$ | $HL_3$ | $HL_4$ | $HL_5$ | $HL_6$ | $HL_7$ | $Q_1'$ | $Q_2'$ | $HR_1'$ | $HR_2'$ | $HR_3'$ | $HR_4'$ | $HR_5'$ | $HR_6'$ | $HR_7'$ |
| $v = 0111$ | $HL_1'$ | $HL_2'$ | $HL_3'$ | $HL_4'$ | $HL_5'$ | $HL_6'$ | $HL_7'$ | $Q_1'$ | $Q_2'$ | $HR_1$ | $HR_2$ | $HR_3$ | $HR_4$ | $HR_5$ | $HR_6$ | $HR_7$ |
| $v = 0001$ | $u_{11}$ | $u_{12}$ | $u_{13}$ | $u_{14}$ | $u_{15}$ | $u_{16}$ | $u_{17}$ | 0 | $Q_1''$ | $FR_1$ | $FR_2$ | $FR_3$ | $FR_4$ | $FR_5$ | $FR_6$ | $FR_7$ |
| $v = 0100$ | $u_{11}$ | $u_{12}$ | $u_{13}$ | $u_{14}$ | $u_{15}$ | $u_{16}$ | $u_{17}$ | 1 | $Q_1''$ | $FR_1$ | $FR_2$ | $FR_3$ | $FR_4$ | $FR_5$ | $FR_6$ | $FR_7$ |
| $v = 1000$ | $FL_1$ | $FL_2$ | $FL_3$ | $FL_4$ | $FL_5$ | $FL_6$ | $FL_7$ | $Q_2''$ | 0 | $u_{21}$ | $u_{22}$ | $u_{23}$ | $u_{24}$ | $u_{25}$ | $u_{26}$ | $u_{27}$ |
| $v = 0010$ | $FL_1$ | $FL_2$ | $FL_3$ | $FL_4$ | $FL_5$ | $FL_6$ | $FL_7$ | $Q_2''$ | 1 | $u_{21}$ | $u_{22}$ | $u_{23}$ | $u_{24}$ | $u_{25}$ | $u_{26}$ | $u_{27}$ |
| $v = 1111$ | $GL_1$ | $GL_2$ | $GL_3$ | $GL_4$ | $GL_5$ | $GL_6$ | $GL_7$ | $u_{17}$ | $Q_2$ | $GR_1$ | $GR_2$ | $GR_3$ | $GR_4$ | $GR_5$ | $GR_6$ | $GR_7$ | where $Q_1' = \overline{u_{16} \wedge u_{17} \wedge u_{22}} \wedge u_{16}$ $Q_1' = \overline{u_{16} \wedge u_{17} \wedge u_{22}} \wedge u_{17}$ and the remaining values of TABLE XXIV are determined using the same equations defined above for Code 4 as part of TABLE X on page 41–42.

CODE 9

Code 9 provides yet another embodiment of the encoder and decoder constructed according to the present invention. Code 9 is very similar to Code 7 and uses the same variable or signal definitions and maps as Code 7 including the f map; the $f^{-1}$ map; the g map, the $g^{-1}$ map, the $h_1$ map and the $h^{-1}_1$ map described above on pages 49, 53–54, and 69 and 70.

Code 9, however uses a different partition for the encoding the words as defined by the following equations:

Partition of data words: $(b_1, y, b_2)$ $R1 = \{(b_1,b_2): |b_1| \geq 2 \text{ AND } |b_2| + |b_2| \geq 6\}$ $R2 = \{(b_1,b_2): |b_1| = 3 \text{ AND } |b_2| = 2\}$ $R3 = \{(b_1,b_2): |b_1| = 2 \text{ AND } |b_2| = 3\}$ $R4 = \{(b_1,b_2): |b_1| \geq 3 \text{ AND } |b_2| \leq 1\}$ $R5 = \{(b_1,b_2): |b_1| \leq 1 \text{ AND } |b_2| \geq 3\}$ $R6 = \{(b_1,b_2): |b_1| \leq 2 \text{ AND } |b_2| \leq 2\}$ Let $y = (y_1, y_2)$ $G1 = \{(b_1,y,b_2):(b_1,b_2) \text{ in R1 OR } ((b_1,b_2) \text{ in R2 and y not 00) OR } ((b_1,b_2) \text{ in R3 and y not 00)}\}$ $G2 = \{(b_1,y,b_2):(b_1,b_2) \text{ in R2 AND } y=00\}$ $G3 = \{(b_1,y,b_2):(b_1,b_2) \text{ in R3 AND } y=00\}$ $G4 = \{(b_1,y,b_2):(b_1,b_2) \text{ in R4 AND } b_2 \text{ not } 0000000\}$ $G5 = \{(b_1,y,b_2):(b_1,b_2) \text{ in R4 AND } b_2=0000000\}$ $G6 = \{(b_1,y,b_2):(b_1,b_2) \text{ in R5 AND } b_1 \text{ not } 0000000\}$ $G7 = \{(b_1,y,b_2):(b_1,b_2) \text{ in R5 AND } b_1=0000000\}$ $G8 = \{(b_1,y,b_2):(b_1,b_2) \text{ in R6 AND } y \text{ not } 00\}$ $G9 = \{(b_1,y,b_2):(b_1,b_2) \text{ in R6 AND } y=00\}$ Code 9 also uses a unique mapping defined by TABLE XXV. The mapping for code 9 is as follows:

TABLE XXV

Encoder Map For Code 9

| if in | $u_{11}$ | $u_{12}$ | $u_{13}$ | $u_{14}$ | $u_{15}$ | $u_{16}$ | $u_{17}$ | $v_1$ | $v_2$ | $v_3$ | $u_{21}$ | $u_{22}$ | $u_{23}$ | $u_{24}$ | $u_{25}$ | $u_{26}$ | $u_{27}$ | # ones |
|---|---|---|---|---|---|---|---|---|---|---|---|---|---|---|---|---|---|---|
| G1 | $b_{11}$ | $b_{12}$ | $b_{13}$ | $b_{14}$ | $b_{15}$ | $b_{16}$ | $b_{17}$ | $y_1$ | 1 | $y_2$ | $b_{21}$ | $b_{22}$ | $b_{23}$ | $b_{24}$ | $b_{25}$ | $b_{26}$ | $b_{27}$ | $\geq 7$ |
| G2 | $l_{11}$ | $l_{12}$ | $l_{13}$ | $l_{14}$ | $l_{15}$ | $l_{16}$ | $r_{11}$ | 0 | 0 | 1 | 1 | 1 | $r_{12}$ | $r_{13}$ | $r_{14}$ | $r_{15}$ | | $\geq 8$ |
| G3 | $r_{21}$ | $r_{22}$ | $r_{23}$ | $r_{24}$ | $r_{25}$ | $l_{21}$ | $l_{22}$ | 0 | 0 | 0 | 1 | 1 | $l_{23}$ | $l_{24}$ | $l_{25}$ | $l_{26}$ | | $\geq 7$ |
| G4 | $b_{11}$ | $b_{12}$ | $b_{13}$ | $b_{14}$ | $b_{15}$ | $b_{16}$ | $b_{17}$ | 1 | 0 | 0 | $y_1$ | $y_2$ | 1 | 1 | $q_1$ | $q_2$ | $q_3$ | $\geq 7$ |
| G5 | $b_{11}$ | $b_{12}$ | $b_{13}$ | $b_{14}$ | $b_{15}$ | $b_{16}$ | $b_{17}$ | 1 | 0 | 0 | $y_1$ | $y_2$ | 0 | 1 | 1 | 1 | 1 | $\geq 8$ |
| G6 | $m_1$ | $m_2$ | $m_3$ | 1 | 1 | $y_1$ | $y_2$ | 0 | 0 | 1 | $b_{21}$ | $b_{22}$ | $b_{23}$ | $b_{24}$ | $b_{25}$ | $b_{26}$ | $b_{27}$ | $\geq 7$ |
| G7 | 1 | 1 | 1 | 1 | 0 | $y_1$ | $y_2$ | 0 | 0 | 1 | $b_{21}$ | $b_{22}$ | $b_{23}$ | $b_{24}$ | $b_{25}$ | $b_{26}$ | $b_{27}$ | $\geq 8$ |
| G8 | $t_1$ | $t_2$ | $t_3$ | $t_4$ | $t_5$ | $y_1$ | 1 | 1 | 0 | 1 | 1 | $y_2$ | $c_1$ | $c_2$ | $c_3$ | $c_4$ | $c_5$ | $\geq 7$ |
| G9 | $t_1$ | $t_2$ | $t_3$ | $t_4$ | $t_5$ | 1 | 1 | 1 | 0 | 1 | 0 | 1 | $c_1$ | $c_2$ | $c_3$ | $c_4$ | $c_5$ | $\geq 7$ | and where the value for the mapping are defined as follows:

$(q_1,q_2,q_3) = f(b_2)$ $(m_1,m_2,m_3) = f(b_1)$ $(l_{11},l_{12},l_{13},l_{14},l_{15},l_{16}) = h_1(b_1)$ $(l_{21},l_{22},l_{23},l_{24},l_{25},l_{26}) = h_1(b_2)$ $(r_{11},r_{12},r_{13},r_{14},r_{15}) = g(b_2)$ $(r_{21},r_{22},r_{23},r_{24},r_{25}) = g(b_1)$ $(t_1,t_2,t_3,t_4,t_5) = g(b_1)$ $(c_1,c_2,c_3,c_4,c_5) = g(b_2)$

Code 9 also provides a mapping for decoding as defined by TABLE XXVI. The decoder mapping for code 9 is as follows:

TABLE XXVI

Decoder Map For Code 9

| | $b_1$ | | | $y_1$ | $y_2$ | $b_2$ |
|---|---|---|---|---|---|---|
| If $v_2 = 1$ | $u_1$ | | | $v_1$ | $v_3$ | $u_2$ |
| If $v_1v_2v_3 = 000$ & $u_{21} = 1$ | $h_1^{-1}(u_{11}u_{12}u_{13}u_{14}u_{15}u_{16})$ | | | 0 | 0 | $g^{-1}(u_{17}u_{24}u_{25}u_{26}u_{27})$ |
| If $v_1v_2v_3 = 000$ & $u_{21} = 0$ | $g^{-1}(u_{11}u_{12}u_{13}u_{14}u_{15})$ | | | 0 | 0 | $h_1^{-1}(u_{16}u_{17}u_{24}u_{25}u_{26}u_{27})$ |
| If $v_1v_2v_3 = 100$ & $u_{23} = 1$ | $u_1$ | | | $u_{21}$ | $u_{22}$ | $f^1(u_{25}u_{26}u_{27})$ |
| If $v_1v_2v_3 = 100$ & $u_{23} = 0$ | $u_1$ | | | $u_{21}$ | $u_{22}$ | 0000000 |
| If $v_1v_2v_3 = 001$ & $u_{15} = 1$ | $f^1(u_{11}u_{12}u_{13})$ | | | $u_{16}$ | $u_{17}$ | $u_2$ |
| If $v_1v_2v_3 = 001$ & $u_{15} = 0$ | 0000000 | | | $u_{16}$ | $u_{17}$ | $u_2$ |
| If $v_1v_2v_3 = 101$ & $u_{21} = 1$ | $g^{-1}(u_{11}u_{12}u_{13}u_{14}u_{15})$ | | | $u_{16}$ | $u_{22}$ | $g^{-1}(u_{23}u_{24}u_{25}u_{26}u_{27})$ |
| If $v_1v_2v_3 = 101$ & $u_{21} = 0$ | $g^{-1}(u_{11}u_{12}u_{13}u_{14}u_{15})$ | | | 0 | 0 | $g^{-1}(u_{23}u_{24}u_{25}u_{26}u_{27})$ |

CODE 10

Finally, Code 10 provides still another embodiment of the encoder and decoder constructed according to the present invention. Code 10 is very similar to Code 7 and uses the same variable or signal definitions and maps as Code 7 including the f map; the $f^{-1}$ map; the g map, the $g^{-1}$ map, the $h_1$ map and the $h^{-1}_1$ map described above on pages 49, 53–54, and 69 and 70.

Code 10, however, uses a different partition as defined below in TABLE XXVII, a different encoding map as defined below in TABLE XXVIII, an a different decoding map as defined below in TABLE XXIX.

TABLE XXVII

Partition of data words: $(b_1, y, b_2)$

R1 = $\{(b_1, b_2): |b_1| \geq 2$ AND $|b_2| + |b_2| \geq 6\}$
R2 = $\{(b_1, b_2): |b_1| = 3$ AND $|b_2| = 2\}$
R3 = $\{(b_1, b_2): |b_1| = 2$ AND $|b_2| = 3\}$

TABLE XXVII-continued

Partition of data words: $(b_1, y, b_2)$

R4 = $\{(b_1, b_2): |b_1| \geq 3$ AND $|b_2| \leq 1\}$
R5 = $\{(b_1, b_2): |b_1| \leq 1$ AND $|b_2| \geq 3\}$
R6 = $\{(b_1, b_2): |b_1| \leq 2$ AND $|b_2| \leq 2\}$ Let $y=(y_1, y_2)$ $X'=\{(b_1,y,b_2): y=00$ AND $(b_1,b_2)$ in R1 AND $b_{16}=b_{22}=b_{24}=b_{26}=0\}$ $X''=\{(b_1,y,b_2): y=00$ AND $(b_1,b_2)$ in R1 AND $b_{12}=b_{14}=b_{16}=b_{22}=0\}$ $X=X'$ (union) $X''$ $G1=\{(b_1,y,b_2):(b_1,b_2)$ in R1-X OR $((b_1,b_2)$ in R2 and y not 00) OR $((b_1,b_2)$ in R3 and y not 00)$\}$ $G2=\{(b_1,y,b_2):(b_1,b_2)$ in R2 AND $y=00\}$ $G3=\{(b_1,y,b_2):(b_1,b_2)$ in R3 AND $y=00\}$ $G4=\{(b_1,y,b_2):(b_1,b_2)$ in R4 AND $b_2$ not 0000000$\}$ $G5=\{(b_1,y,b_2):(b_1,b_2)$ in R4 AND $b_2=0000000\}$ $G6=X'$ $G7=\{(b_1,y,b_2):(b_1,b_2)$ in R5 AND $b_1$ not 0000000$\}$ $G8=\{(b_1,y,b_2):(b_1,b_2)$ in R5 AND $b_1=0000000\}$ $G9=X''$ $G10=\{(b_1,y,b_2):(b_1,b_2)$ in R6 AND y not 00$\}$ $G11=\{(b_1,y,b_2):(b_1,b_2)$ in R6 AND $y=00\}$

TABLE XXVIII

Encoder Map For Code 10

| if in | $u_{11}$ | $u_{12}$ | $u_{13}$ | $u_{14}$ | $u_{15}$ | $u_{16}$ | $u_{17}$ | $v_1$ | $v_2$ | $v_3$ | $u_{21}$ | $u_{22}$ | $u_{23}$ | $u_{24}$ | $u_{25}$ | $u_{26}$ | $u_{27}$ | # ones |
|---|---|---|---|---|---|---|---|---|---|---|---|---|---|---|---|---|---|---|
| G1 | $b_{11}$ | $b_{12}$ | $b_{13}$ | $b_{14}$ | $b_{15}$ | $b_{16}$ | $b_{17}$ | $y_1$ | 1 | $y_2$ | $b_{21}$ | $b_{22}$ | $b_{23}$ | $b_{24}$ | $b_{25}$ | $b_{26}$ | $b_{27}$ | $\geq 7$ |
| G2 | $l_{11}$ | $l_{12}$ | $l_{13}$ | $l_{14}$ | $l_{15}$ | $l_{16}$ | $r_{11}$ | 0 | 0 | 1 | 1 | 1 | $r_{12}$ | $r_{13}$ | $r_{14}$ | $r_{15}$ | | $\geq 8$ |
| G3 | $r_{21}$ | $r_{22}$ | $r_{23}$ | $r_{24}$ | $r_{25}$ | $l_{21}$ | $l_{22}$ | 0 | 0 | 0 | 1 | 1 | $l_{23}$ | $l_{24}$ | $l_{25}$ | $l_{26}$ | | $\geq 7$ |
| G4 | $b_{11}$ | $b_{12}$ | $b_{13}$ | $b_{14}$ | $b_{15}$ | $b_{16}$ | $b_{17}$ | 1 | 0 | 0 | $y_1$ | $y_2$ | 1 | 1 | $q_1$ | $q_2$ | $q_3$ | $\geq 7$ |
| G5 | $b_{11}$ | $b_{12}$ | $b_{13}$ | $b_{14}$ | $b_{15}$ | $b_{16}$ | $b_{17}$ | 1 | 0 | 0 | $y_1$ | $y_2$ | 0 | 1 | 1 | 1 | 1 | $\geq 8$ |
| G6 | $b_{11}$ | $b_{12}$ | $b_{13}$ | $b_{14}$ | $b_{15}$ | $b_{17}$ | $b_{21}$ | 1 | 0 | 0 | 1 | 1 | 0 | 0 | $b_{23}$ | $b_{25}$ | $b_{27}$ | $\geq 9$ |
| G7 | $m_1$ | $m_2$ | $m_3$ | 1 | 1 | $y_1$ | $y_2$ | 0 | 0 | 1 | $b_{21}$ | $b_{22}$ | $b_{23}$ | $b_{24}$ | $b_{25}$ | $b_{26}$ | $b_{27}$ | $\geq 7$ |
| G8 | 1 | 1 | 1 | 1 | 0 | $y_1$ | $y_2$ | 0 | 0 | 1 | $b_{21}$ | $b_{22}$ | $b_{23}$ | $b_{24}$ | $b_{25}$ | $b_{26}$ | $b_{27}$ | $\geq 8$ |
| G9 | $b_{11}$ | $b_{13}$ | $b_{15}$ | 0 | 0 | 1 | 1 | 0 | 0 | 1 | $b_{17}$ | $b_{21}$ | $b_{23}$ | $b_{24}$ | $b_{25}$ | $b_{26}$ | $b_{27}$ | $\geq 9$ |
| G10 | $t_1$ | $t_2$ | $t_3$ | $t_4$ | $t_5$ | $y_1$ | 1 | 1 | 0 | 1 | 1 | $y_2$ | $c_1$ | $c_2$ | $c_3$ | $c_4$ | $c_5$ | $\geq 7$ |
| G11 | $t_1$ | $t_2$ | $t_3$ | $t_4$ | $t_5$ | 1 | 1 | 1 | 0 | 1 | 0 | 1 | $c_1$ | $c_2$ | $c_3$ | $c_4$ | $c_5$ | $\geq 7$ | where:

$(q_1,q_2,q_3)=f(b_2)$ $(m_1,m_2,m_3)=f(b_1)$ $(l_{11},l_{12},l_{13},l_{14},l_{15},l_{16})=h_1(b_1)$ $(l_{21},l_{22},l_{23},l_{24},l_{25},l_{26})=h_1(b_2)$ $(r_{11},r_{12},r_{13},r_{14},r_{15})=g(b_2)$ $(r_{21},r_{22},r_{23},r_{24},r_{25})=g(b_1)$ $(t_1,t_2,t_3,t_4,t_5)=g(b_1)$ $(c_1,c_2,c_3,c_4,c_5)=g(b_2)$

TABLE XXIX

Decoder Map For Code 10

| | $b_1$ | $y_1$ | $y_2$ | $b_2$ |
|---|---|---|---|---|
| If $v_2 = 1$ | $u_1$ | $v_1$ | $v_3$ | $u_2$ |
| If $v_1v_2v_3 = 000$ & $u_{21} = 1$ | $h_1^{-1}(u_{11}u_{12}u_{13}u_{14}u_{15}u_{16})$ | 0 | 0 | $g^{-1}(u_{17}u_{24}u_{25}u_{26}u_{27})$ |
| If $v_1v_2v_3 = 000$ & $u_{21} = 0$ | $g^{-1}(u_{11}u_{12}u_{13}u_{14}u_{15})$ | 0 | 0 | $h_1^{-1}(u_{16}u_{17}u_{24}u_{25}u_{26}u_{27})$ |
| If $v_1v_2v_3 = 100$ & $u_{23} = 1$ | $u_1$ | $u_{21}$ | $u_{22}$ | $f^1(u_{25}u_{26}u_{27})$ |
| If $v_1v_2v_3 = 100$ & $u_{23}u_{24} = 01$ | $u_1$ | $u_{21}$ | $u_{22}$ | 0000000 |
| If $v_1v_2v_3 = 100$ & $u_{23}u_{24} = 00$ | $u_{11}u_{12}u_{13}u_{14}u_{15}0u_{16}$ | 0 | 0 | $u_{17}0u_{25}0u_{26}0u_{27}$ |
| If $v_1v_2v_3 = 001$ & $u_{15} = 1$ | $f^1(u_{11}u_{12}u_{13})$ | $u_{16}$ | $u_{17}$ | $u_2$ |
| If $v_1v_2v_3 = 001$ & $u_{14}u_{15} = 10$ | 0000000 | $u_{16}$ | $u_{17}$ | $u_2$ |
| If $v_1v_2v_3 = 001$ & $u_{14}u_{15} = 00$ | $u_{11}0u_{12}0u_{13}0u_{21}$ | 0 | 0 | $u_{22}0u_{23}u_{24}u_{25}u_{26}u_{27}$ |
| If $v_1v_2v_3 = 101$ & $u_{21} = 1$ | $g^{-1}(u_{11}u_{12}u_{13}u_{14}u_{15})$ | $u_{16}$ | $u_{22}$ | $g^{-1}(u_{23}u_{24}u_{25}u_{26}u_{27})$ |
| If $v_1v_2v_3 = 101$ & $u_{21} = 0$ | $g^{-1}(u_{11}u_{12}u_{13}u_{14}u_{15})$ | 0 | 0 | $g^{-1}(u_{23}u_{24}u_{25}u_{26}u_{27})$ |

APPENDIX A

Necessary and Sufficient Conditions to Produce A Maximal Ones Code With Hamming Distance of 2

The code 1 encoder 12a produces the following parameters when used with a $1/(1\oplus D_2)$ precoder and a $1-D^2$ partial response (PR) channel: $\tilde{N}=9$, $Z=17$, $Z_i$=arbitrarily long sequence of zeros in even or odd bit positions, and $\hat{E}=3$ The following Propositions stated in APPENDIX A are based on Corollaries 2.1, 2.4, and LEMMA 2 set forth in U.S. Pat. No. 5,196,849, entitled "Method and Apparatus For Implementing PRML Codes With Maximum Ones", by Richard L. Galbraith.

Proposition 1: Code 1 generates a Hamming distance of 2 at the output of a $1/(1\oplus D^2)$ precoder.

Proof:

Let $\underline{x}=[x_1 \ldots x_{18}]$ be the output of the precoder corresponding to the precoder input $\underline{v}=[v_1 \ldots v_{18}]$. Then, based on Corollaries 2.1 and 2.4, we have $$\sum_{i=1}^{18} x_i = 0$$

Therefore, code 1 generates a Hamming distance of 2 at the output of a $1/(1\oplus D^2)$ precoder.

Proposition 2: Given a Hamming distance 2 after precoding, and given a rate 16/18, the minimal number of 9 ones per codeword at the output of the channel filter is the best possible.

Proof: Let $N_{11}$ denote the number of binary vectors, $\underline{v}=[v_1 \ldots v_{18}]$, of weight $w \geq 11$. Thus, we have $$N_{11} = \frac{2^{18} - \binom{18}{9} - 2*\binom{18}{10}}{2} = 63,004 \text{ Since } 63,004 < 2^{16},$$

it follows that the minimum number of 11 ones per codeword is not feasible given a rate 16/18.

Next, we show that 10 ones is also not feasible either given a rate 16/18 and Hamming distance 2. To this end, there are $N_{10}$ binary vectors, $\underline{v}=[v_1 \ldots v_{18}]$, of weight $w \geq 10$. Thus we have $$N_{10} = \frac{2^{18} - \binom{18}{9}}{2} = 106,762, \text{ and } 2^{16} < 106,762 < 2^{17}.$$

Now, let us define $N_{10}$ (even) and $N_{10}$ (odd) as follows:

$N_{10}$(even)=# of $\underline{v}=[v_1 \ldots v_{18}]$ of weight$\geq 10$ such that $v_1+v_2+v_5+v_6+v_9+v_{10}+v_{13}+v_{14}+v_{17}+v_{18}$ is even.

$N_{10}$(odd)=# of $\underline{v}=[v_1 \ldots v_{18}]$ of weight$\geq 10$ such that $v_1+v_2+v_5+v_6+v_9+v_{10}+v_{13}+v_{14}+v_{17}+v_{18}$ is odd.

Therefore, we have $N_{10}$ (even)=53,416<$2^{16}$, and $N_{10}$ (odd)=53,346<$2^{16}$.

Accordingly, regardless of the value of current state cs, the conditions of LEMMA 2 cannot be satisfied with any rate 16/18 code. Q.E.D.

Proposition 3: Code 2 generates a Hamming distance of 2 at the output of the $1/(1\oplus D^2)$ precoder.

Proof: See proof of Proposition 1.

We note that code 2 has only one codeword generating 8 ones at the output of the $1-D^2$ channel filter, and the rest of its codewords generate at least 9 ones.

Proposition 4: Code 3 generates a Hamming distance of 2 at the output of the $1/(1\oplus D^2)$ precoder.

Proof: See proof of Proposition 1.

APPENDIX B

Construction of Run Length Limited Codes With 0 Mod 2 Ones Per Codeword After Precoding Let E be as a subset of $\{0,1\}^{n1}$ and F be a subset of $\{0,1\}^{n2}$. Elements in E can be represented by $m_1=\lceil \log_2|E| \rceil$ bits and elements in F by $m_2=\lceil \log_2|F| \rceil$ bits. Therefore, the elements of the set E×F can be represented by $m_1+m_2=\lceil \log_2|E|+\log_2|F| \rceil$=bits. This representation has an interesting property, namely, if only the first $m_1$ bits are corrupted, then the element of F can be decoded based on the last $m_2$ bits. On the other hand, if only the last $m_2$ bits are corrupted, then the element of E can be decoded based on the first $m_1$ bits. Sometimes, it is possible to represent E×F with $m_1+m_2$ bits and still satisfy a property similar to the one mentioned above.

LEMMA: Let E be as a subset of $\{0,1\}^{n1}$ and F be a subset of $\{0,1\}^{n2}$. Also, let $|E| \leq p_1 \times q_1$ and $|F| \leq p_2 \times q_2$, then elements in E×F can be represented by $n_1+n_2+n_3$ bits, where $n_1=\lceil \log_2 p_1 \rceil$, $n_2=\lceil \log_2 q_1 \rceil$, $n3_2=\lceil \log_2(q_1 p_2) \rceil$.

Proof: We list the elements of in a $p_1 \times q_1$ table, and list the elements of F in a $p_2 \times q_2$ table. To represent an element (e,f) in E×F, we represent the row of e by $n_1=\lceil \log_2 p_1 \rceil$ bits, the column of f by $n_2=\lceil \log_2 q_1 \rceil$, and the column of e and row of f by $n_3=\lceil \log_2(q_1 p_2) \rceil$ bits.

In the representation of E×F suggested by the above lemma, if only the $n_1$ bits are corrupted, then the element of F can be decoded based on $n_2$ and $n_3$ bits. On the other hand, if only the $n_3$ bits are corrupted, then the element of E can be decoded based on $n_1$ and $n_2$ bits. Furthermore, in some cases, the above lemma produces a representation with $n_1+n_2+n_3$ bits that is one less than $m_1+m_2$. For instance, let's suppose $|E|=35=7\times 5=p_1 \times q_1$, and $|F|=21=3\times 7=p_2 \times q_2$, then $m_1+m_2=6+5=3+4+3+1=n_1+n_2+n_3+1$. This construction is used on most of the codes 4–10.

What is claimed is:

1. An encoder for coding an input signal in a communications system having a precoder, a partial response channel, a detector, and a decoder, the coded input signal having a Hamming distance of at least two at the output of the precoder for enhanced channel performance and a predetermined minimum number of ones at the output of the partial response channel for providing clock information, the encoder comprising:

a serial-to-parallel converter having an input and a plurality of outputs for converting a serial string into parallel bits, the input of the serial-to-parallel converter coupled to receive the input signal;

a code generator having a plurality of inputs and outputs for producing a first code bit using the equation $v_6=cs \oplus v_1 \oplus v_2 \oplus v_5 \oplus v_9 \oplus v_{10} \oplus v_{13} \oplus v_{14} \oplus v_{17} \oplus v_{18}$, and a second code bit having a value based on the number of binary ones present in the input signal, the inputs of the code generator coupled to at least one of the plurality of outputs of the serial-to-parallel converter; and a parallel-to-serial converter having a plurality of inputs and an output for generating a serial string from parallel bits, the plurality of inputs of the parallel-to-serial converter coupled to at least one of the plurality of outputs of the code generator.

2. The encoder of claim 1, wherein the encoder is a finite state machine.

3. The encoder of claim 1, wherein the encoder takes 16 bits and outputs 18 bits thereby having a code rate of 16/18.

4. The encoder of claim 1, wherein the output of the encoder is coupled to the input of a $1/(1 \oplus D^2)$ precoder and followed by a $(1-D^2)$ partial response channel.

5. The encoder of claim 1, wherein the current state cs is used to produce the first code bit, and a next state ns is used as current state cs by the encoder to produce a next code bit.

6. The encoder of claim 5, wherein the next state ns is produced using the equation $ns=v_3 \oplus v_4 \oplus v_7 \oplus v_8 \oplus v_{11} \oplus v_{12} \oplus v_{15} \oplus v_{16}$.

7. The encoder of claim 1, wherein the initial current state cs is produced using the equation $cs=x_{-1} \oplus x_{-2}$, where $x_{-1}$ and $x_{-2}$ are the initial conditions of the precoder.

8. The encoder of claim 1, wherein the minimum number of ones at the output of the precoder is 9, the maximum number of consecutive zeros at the output of the partial response channel is 17, and the maximum number of consecutive zeros in even or odd bit positions at the output of the partial response channel is arbitrarily long.

9. The encoder of claim 1, further comprising a selector having a plurality of inputs and outputs, the inputs coupled to the outputs of the encoder with at least one input responsive to a control signal, the selector capable of selecting to the input of the precoder a predetermined coded signal in response to the control signal.

10. The encoder of claim 9, wherein the selector is a multiplexer.

11. The encoder of claim 9, wherein the predetermined coded signal is 110001100000110011.

12. The encoder of claim 9, wherein the predetermined coded signal is selected for input into the precoder when the input signal to the selector is 101010101010101010.

13. The encoder of claim 1, wherein the minimal number of ones at the output of the precoder is 8, the maximum number of consecutive zeros at the output of the partial response channel is 17, and the maximum number of consecutive zeros in even or odd bit positions at the output of the partial response channel is 16.

14. An encoder for coding an input signal in a communications system having a precoder, a partial response channel, a detector, and a decoder, the coded input signal having a Hamming distance of at least two at the output of the precoder for enhanced channel performance and a predetermined minimum number of ones at the output of the partial response channel for providing clock information, the encoder comprising:

a weight generator having a plurality of inputs and outputs, the inputs of the weight generator coupled to receive the input signal, the weight generator capable of computing a weight from the input signal;

a controller having a plurality of inputs and outputs, the inputs of the controller coupled to the outputs of the weight generator for receiving the weight of the input signal, the controller capable of providing a plurality of control signals;

a plurality of mapping circuits, each one of the mapping circuits having a plurality of inputs and outputs, at least one of the inputs of each mapping circuit responsive to one of the control signals from the controller, at least one of the inputs of each one of the mapping circuits coupled to receive the input signal, and at least one of the inputs of each one of the mapping circuits coupled to receive a control bit computed using the equation $p=cs \oplus v_1 \oplus v_2 \oplus v_5 \oplus v_9 \oplus v_{10} \oplus v_{13} \oplus v_{14} \oplus v_{17} \oplus v_{18}$.

a selector having a plurality of inputs and outputs, the inputs of the selector coupled to receive the outputs of the mapping circuits, the selector capable of constructing from the outputs of the mapping circuits a selected codeword in response to the control signal from the controller; and a code bit generator having a plurality of inputs and an output, the inputs of the code bit generator coupled to the outputs of the selector for receiving bits from the selected codeword, the code bit generator capable of providing to the mapping circuits via its output a code bit computed using the equation $p=cs \oplus v_1 \oplus v_2 \oplus v_5 \oplus v_9 \oplus v_{10} \oplus v_{13} \oplus v_{14} \oplus v_{17} \oplus v_{18}$.

15. The encoder of claim 14, wherein the encoder is a finite state machine.

16. The encoder of claim 14, wherein the encoder takes 16 bits and outputs 18 bits thereby having a code rate of 16/18.

17. The encoder of claim 14, wherein the output of the encoder is coupled to the input of a $1/(1 \oplus D^2)$ precoder and followed by a $(1-D^2)$ partial response channel.

18. The encoder of claim 14, wherein the current state cs is used to produce the code bit p, and a next state ns is used as current state cs by the encoder to produce a next code bit p.

19. The encoder of claim 18, wherein the next sate ns is produced using the equation $ns=v_3\oplus v_4\oplus v_7\oplus v_8\oplus v_{11}\oplus v_{12}\oplus v_{15}\oplus v_{16}$.

20. The encoder of claim 14, wherein the initial current state cs is produced using the equation $cs=x_{-1}\oplus x_{-2}$, where $x_{-1}$ and $x_{-2}$ are the initial conditions of the precoder.

21. The encoder of claim 14, wherein the current state cs is produced using the equation $cs=x_{17}\oplus x_{18}$, where $x_{17}$ and $x_{18}$ are the output of the precoder corresponding to the code bits $v_{17}$ and $v_{18}$ respectively, wherein the code bits $v_{17}$ and $v_{18}$ form part of a last codeword sent through the precoder.

22. The encoder of claim 14, wherein the minimal number of ones at the output of the precoder is 7, the maximum number of consecutive zeros at the output of the partial response channel is 16, and the maximum number of consecutive zeros in even or odd bit positions at the output of the partial response channel is 13.

23. The encoder of claim 14, further comprising 5 mapping circuits, wherein each mapping circuit is capable of providing at least one codeword generated from its respective function as described in TABLE II.

24. The encoder of claim 14, wherein the weight is computed from the number of binary ones in the input signal and the binary representation of the weight is provided at the output of the weight generator for use by the controller.

25. The encoder of claim 14, wherein at least one of the inputs of at least one of the mapping circuits is coupled to receive the outputs of the weight generator.

26. The encoder of claim 14, wherein the weight generator, the controller, the mapping circuits, the selector, and the control bit generator are implemented using combinational logic.

27. The encoder of claim 14, wherein the control bits are positioned in the codeword so that they are less susceptible to corruption by noise.

28. The encoder of claim 14, wherein the selector is a multiplexer further comprising a plurality of 5-way multiplexers.

29. The encoder of claim 14, wherein no codeword $\underline{v}$ satisfies the following three properties: 1) $v_{18}=v_{16}=v_{14}=v_{12}=v_{10}$, 2) $v_1=v_3=v_5=v_7=v_9=v_{11}$, and 3) $v_{11}=v_{12}=v_{13}=v_{14}=v_{15}=v_{16}=v_{17}=v_{18}$.

30. The encoder of claim 14, wherein only one codeword generates 8 ones at the output of the PR channel and the rest of the codewords generate at least 9 ones at the output of the PR channel.

31. An encoder for coding an input signal in a communications system having a precoder, a partial response channel, a detector, and a decoder, the coded input signal having a Hamming distance of at least two at the output of the precoder and having 0 mod 3 number of ones in the codewords after precoding, the encoder comprising:

a partitioning unit having an input and an output, the input coupled to receive an input signal, the partitioning unit for generating a selection signal indicating a map for encoding the input signal; and a mapping unit having a first input, a second input and an output, the first input coupled to receive the input signal, the second input coupled to receive the selection signal from the partitioning unit, the mapping unit for generating an encoded output signal based on the input signal and a selected encoder map as indicated by the selection signal.

32. The encoder of claim 31, wherein the partitioning unit uses the number of ones in the input signal to partition the input signal and select an encoding map.

33. The encoder of claim 31, further comprising a modification unit having a first input, a second input, a third input and an output, the first input of the modification unit coupled to receive the input signal, the second input of the modification unit coupled to receive encoded output signal from the mapping unit, the third input of the modification unit coupled to receive the selection signal from the partitioning unit, the modification unit selectively modifying one or more bits encoded output signal based on the input signal and a selected encoder map as indicated by the selection signal.

34. The encoder of claim 33, wherein the modification unit comprises:

a parallel precoder having a first input, a second input, a first output and a second output, for generating a first signal indicating the number of ones on the first output and a second signal representing a previous output of the parallel precoder on the second output, the first input of the parallel precoder coupled to receive the encoded output signal from the mapping unit, and the second of the parallel precoder input coupled to receive the selection signal from the partitioning unit;

an auxiliary bit selector having a first input, a second input, a third input, a fourth input and an output for generating auxiliary bits that selectively form part of the modified encoded output signal, the first input of the auxiliary bit selector coupled to receive the input signal, the second input of the auxiliary bit selector coupled to the output of the partitioning unit to receive the selection signal, the third input of the auxiliary bit selector coupled to the first output of the parallel precoder, and the fourth input of the auxiliary bit selector coupled to the second output of the parallel precoder; and an output multiplexer having a first input, a second input, a third input, and an output for replacing bits of the encoded signal with the auxiliary bits, the first input of the output multiplexer coupled to receive the encoded output signal from the mapping unit, the second input of the output multiplexer coupled to the output of the partitioning unit to receive the selection signal, the third input of the output multiplexer coupled to the output of the auxiliary bit selector.

* * * * *